(12) United States Patent
Chibvongodze et al.

(10) Patent No.: US 10,734,080 B2
(45) Date of Patent: Aug. 4, 2020

(54) THREE-DIMENSIONAL MEMORY DEVICE CONTAINING BIT LINE SWITCHES

(71) Applicant: SANDISK TECHNOLOGIES LLC, Addison, TX (US)

(72) Inventors: Hardwell Chibvongodze, Nagoya (JP); Masatoshi Nishikawa, Nagoya (JP); Naoki Ookuma, Yokohama (JP); Takuya Ariki, Yokohama (JP); Toru Miwa, Yokohama (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/213,382

(22) Filed: Dec. 7, 2018

(65) Prior Publication Data

US 2020/0185039 A1    Jun. 11, 2020

(51) Int. Cl.
*G11C 16/24* (2006.01)
*H01L 27/11573* (2017.01)
(Continued)

(52) U.S. Cl.
CPC .......... *G11C 16/24* (2013.01); *G11C 16/0483* (2013.01); *G11C 16/26* (2013.01); *H01L 27/1157* (2013.01); *H01L 27/11519* (2013.01); *H01L 27/11524* (2013.01); *H01L 27/11526* (2013.01); *H01L 27/11548* (2013.01); *H01L 27/11556* (2013.01); *H01L 27/11565* (2013.01); *H01L 27/11573* (2013.01);
(Continued)

(58) Field of Classification Search
None
See application file for complete search history.

(56) References Cited

U.S. PATENT DOCUMENTS 5,555,519 A    9/1996  Takashima et al.
5,915,167 A    6/1999  Leedy
(Continued)

FOREIGN PATENT DOCUMENTS

CN    1218960    6/1999

OTHER PUBLICATIONS

Endoh, T. et al., "Novel Ultra High Density Flash Memory with a Stacked-Surrounding Gate Transistor (S-GT) Structured Cell," IEDM Proc., pp. 33-36, (2001).
(Continued)

*Primary Examiner* — James G Norman
(74) *Attorney, Agent, or Firm* — The Marbury Law Group, PLLC

(57) ABSTRACT

A three-dimensional memory device includes memory stack structures in multiple memory arrays. Bit lines are split into multiple portions traversing different memory arrays. Each sense amplifier is connected to a first portion of a respective bit line via a respective first switching transistor device, and is connected to a second portion of the respective bit line via a respective second switching transistor device. The switching transistor devices connect each sense amplifier to one portion of the bit lines without connecting to another portion of the bit lines, thereby reducing the RC delay. The switching transistor devices may be provided as vertical field effect transistors located at a memory array level, or may be provided in another semiconductor chip.

26 Claims, 63 Drawing Sheets

(51) Int. Cl.

| | | |
|---|---|---|
| *H01L 27/11548* | (2017.01) | |
| *H01L 27/11575* | (2017.01) | |
| *H01L 27/11556* | (2017.01) | |
| *H01L 27/11582* | (2017.01) | |
| *H01L 27/11524* | (2017.01) | |
| *H01L 27/1157* | (2017.01) | |
| *H01L 27/11519* | (2017.01) | |
| *H01L 27/11565* | (2017.01) | |
| *H01L 29/423* | (2006.01) | |
| *G11C 16/04* | (2006.01) | |
| *G11C 16/26* | (2006.01) | |
| *H01L 27/11526* | (2017.01) | |
| *G11C 16/14* | (2006.01) | |
| *G11C 16/10* | (2006.01) | |

(52) U.S. Cl.
CPC .. *H01L 27/11575* (2013.01); *H01L 27/11582* (2013.01); *H01L 29/4234* (2013.01); *H01L 29/42324* (2013.01); *G11C 16/10* (2013.01); *G11C 16/14* (2013.01)

(56) References Cited

U.S. PATENT DOCUMENTS

| | | |
|---|---|---|
| 5,917,744 A | 6/1999 | Kirihata et al. |
| 5,966,315 A | 10/1999 | Muller et al. |
| 6,829,154 B1 | 12/2004 | Kang |
| 8,760,957 B2 | 6/2014 | Lee et al. |
| 9,633,742 B2 | 4/2017 | Desai et al. |
| 9,786,681 B1 | 10/2017 | Ariyoshi |
| 9,853,038 B1 | 12/2017 | Cui |
| 9,985,098 B2 | 5/2018 | Matsumoto et al. |
| 10,008,570 B2 | 6/2018 | Yu et al. |
| 10,020,363 B2 | 7/2018 | Ogawa et al. |
| 2013/0070506 A1* | 3/2013 | Kajigaya .................. G11C 7/18 365/51 |
| 2013/0258772 A1 | 10/2013 | Lee et al. |
| 2015/0078080 A1 | 3/2015 | Lee |
| 2015/0193299 A1 | 7/2015 | Hyun et al. |
| 2016/0012903 A1 | 1/2016 | Desai et al. |
| 2017/0287926 A1 | 10/2017 | Ariyoshi |
| 2018/0122904 A1 | 5/2018 | Matsumoto et al. |
| 2018/0122905 A1 | 5/2018 | Ogawa et al. |
| 2018/0122906 A1 | 5/2018 | Yu et al. |
| 2018/0151497 A1 | 5/2018 | Makala et al. |
| 2019/0057974 A1* | 2/2019 | Lu ..................... H01L 27/11565 |

OTHER PUBLICATIONS

U.S. Appl. No. 15/902,169, filed Feb. 22, 2018, SanDisk Technologies LLC.

U.S. Appl. No. 15/950,505, filed Apr. 11, 2018, SanDisk Technologies LLC.

U.S. Appl. No. 15/950,616, filed Apr. 11, 2018, SanDisk Technologies LLC.

U.S. Appl. No. 16/142,644, filed Sep. 26, 2018, SanDisk Technologies LLC.

U.S. Appl. No. 16/213,180, filed Dec. 7, 2018, SanDisk Technologies LLC.

\* cited by examiner

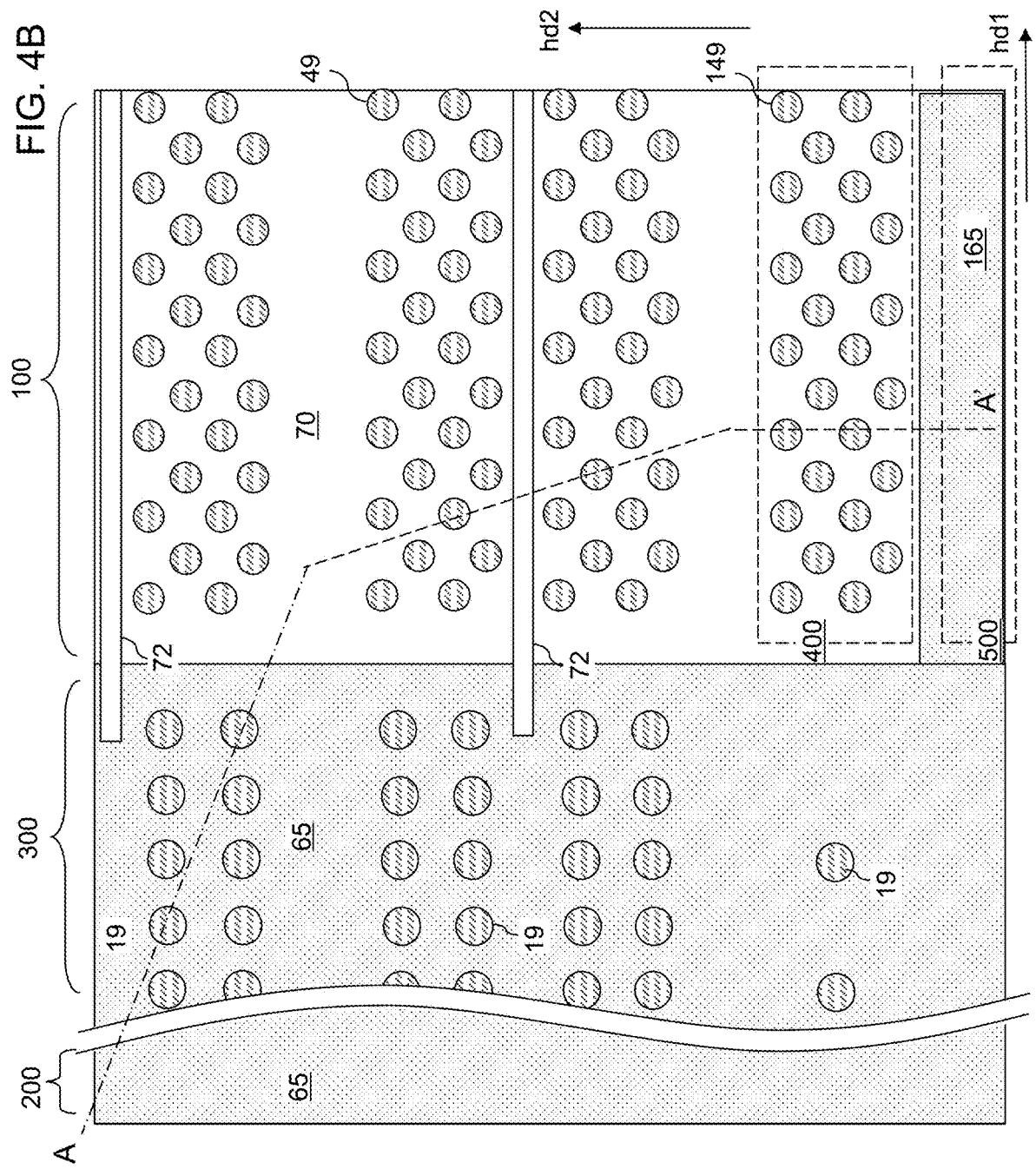

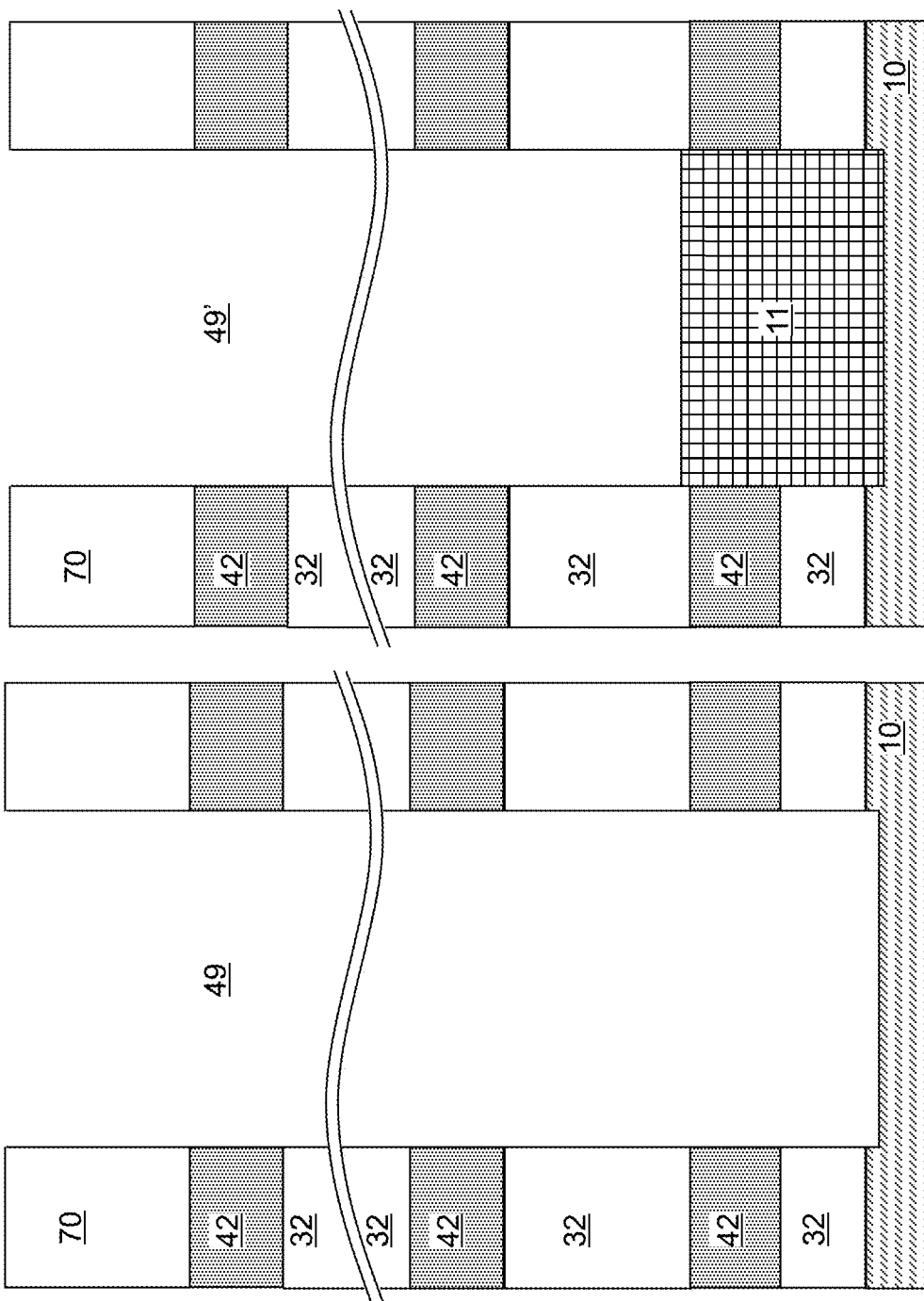

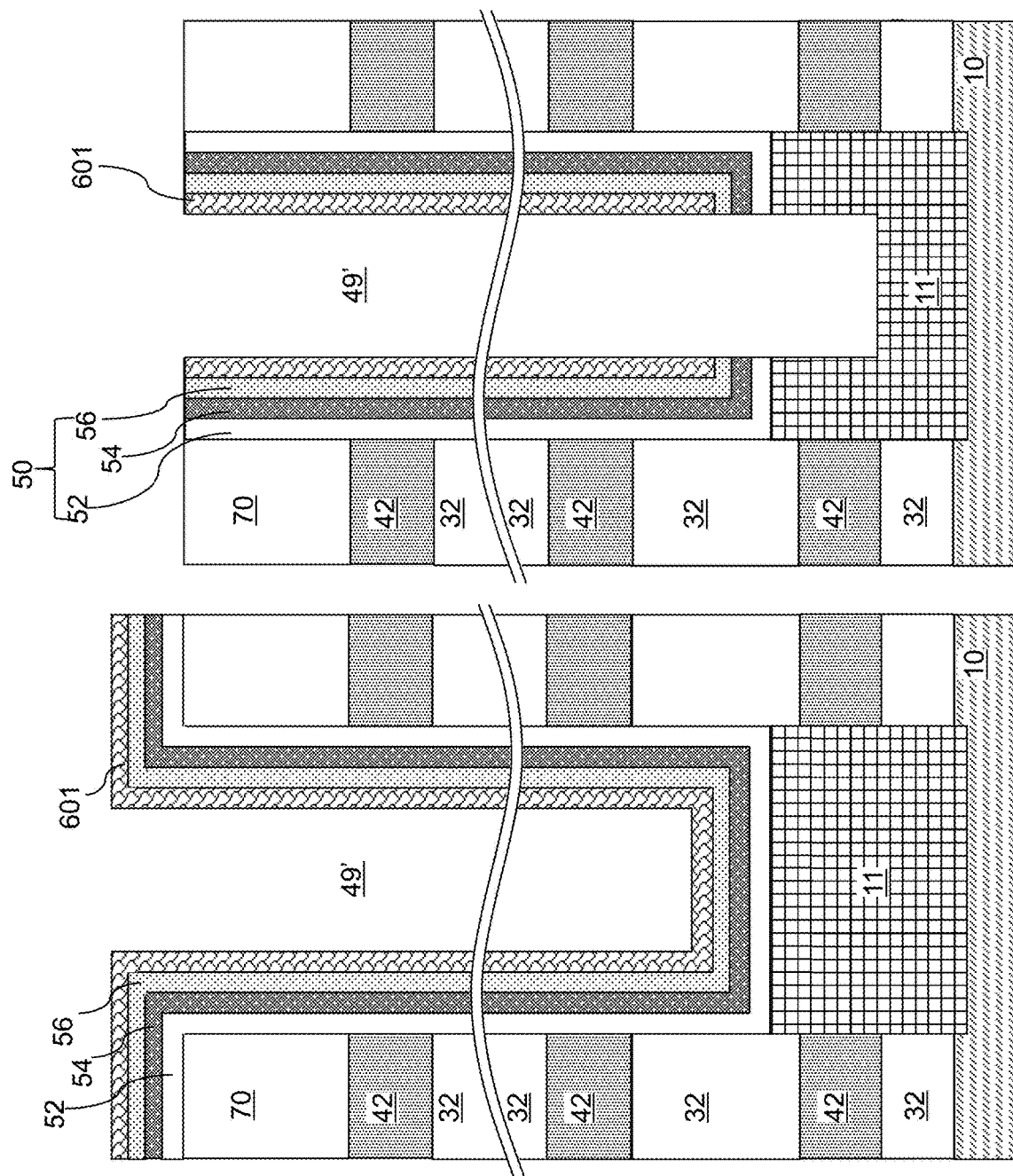

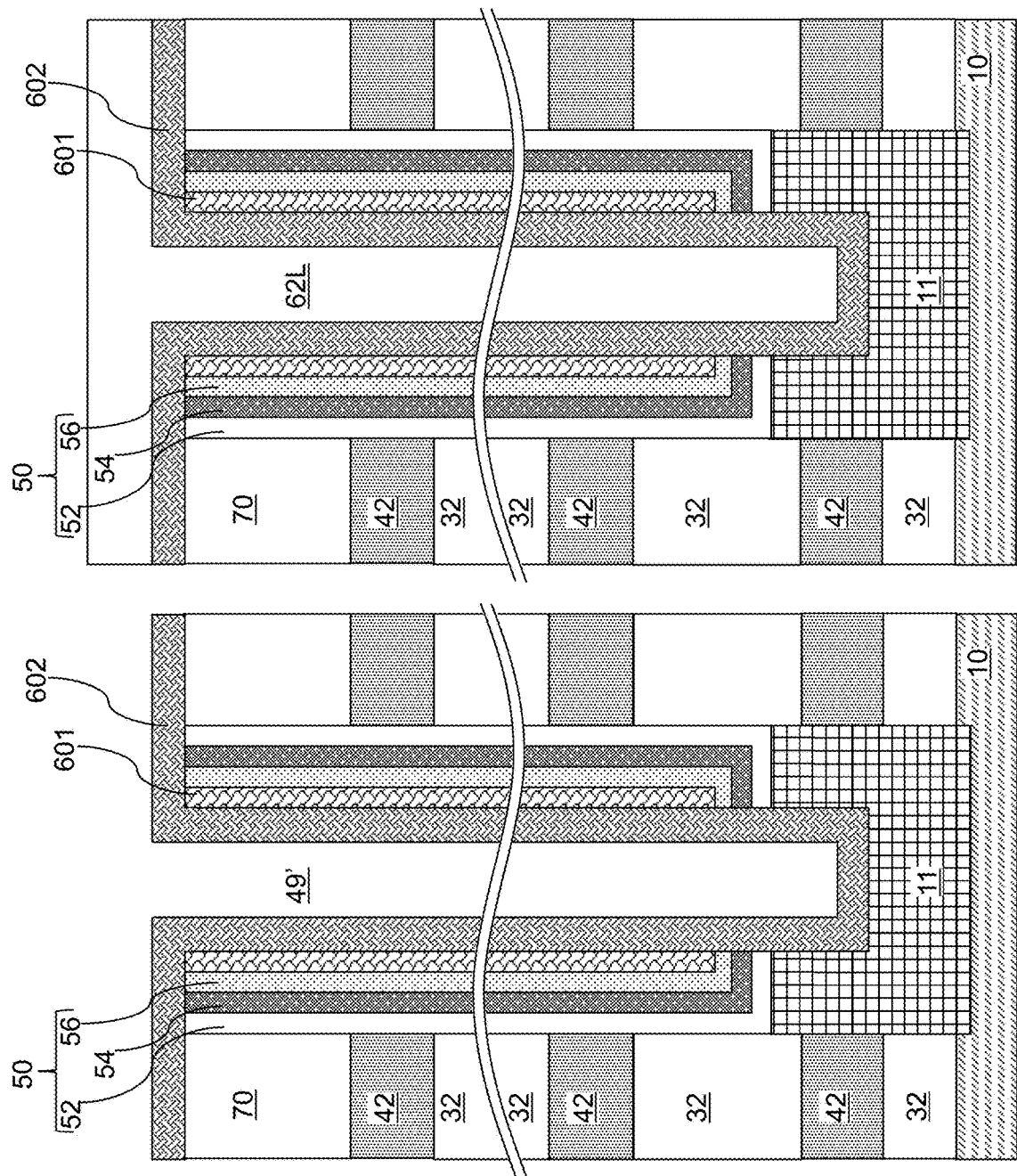

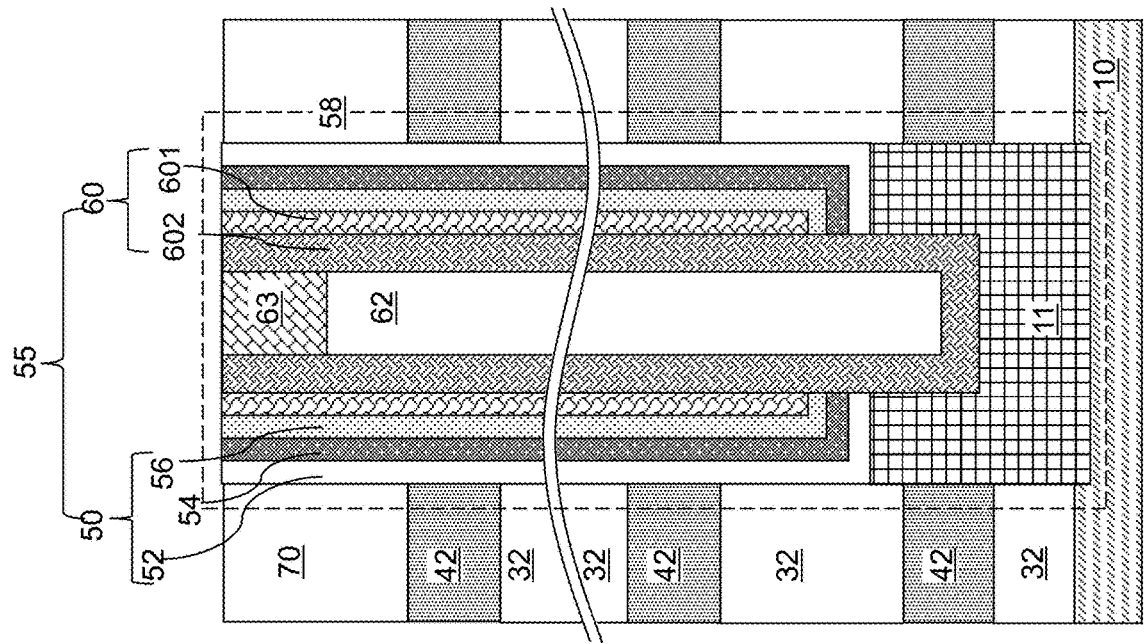
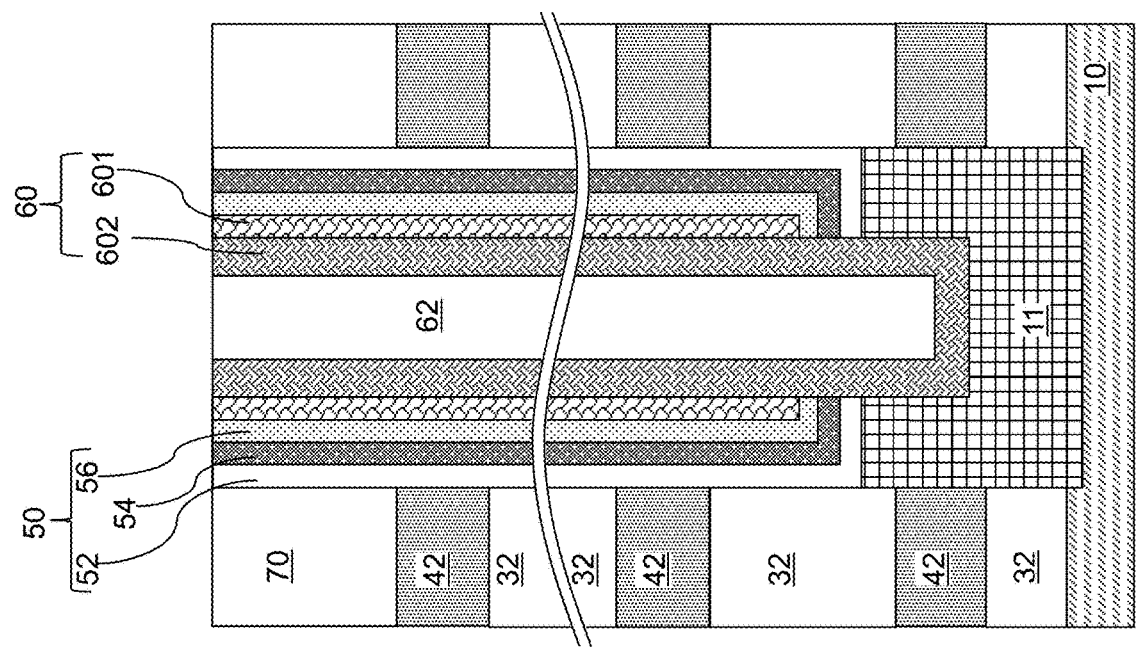

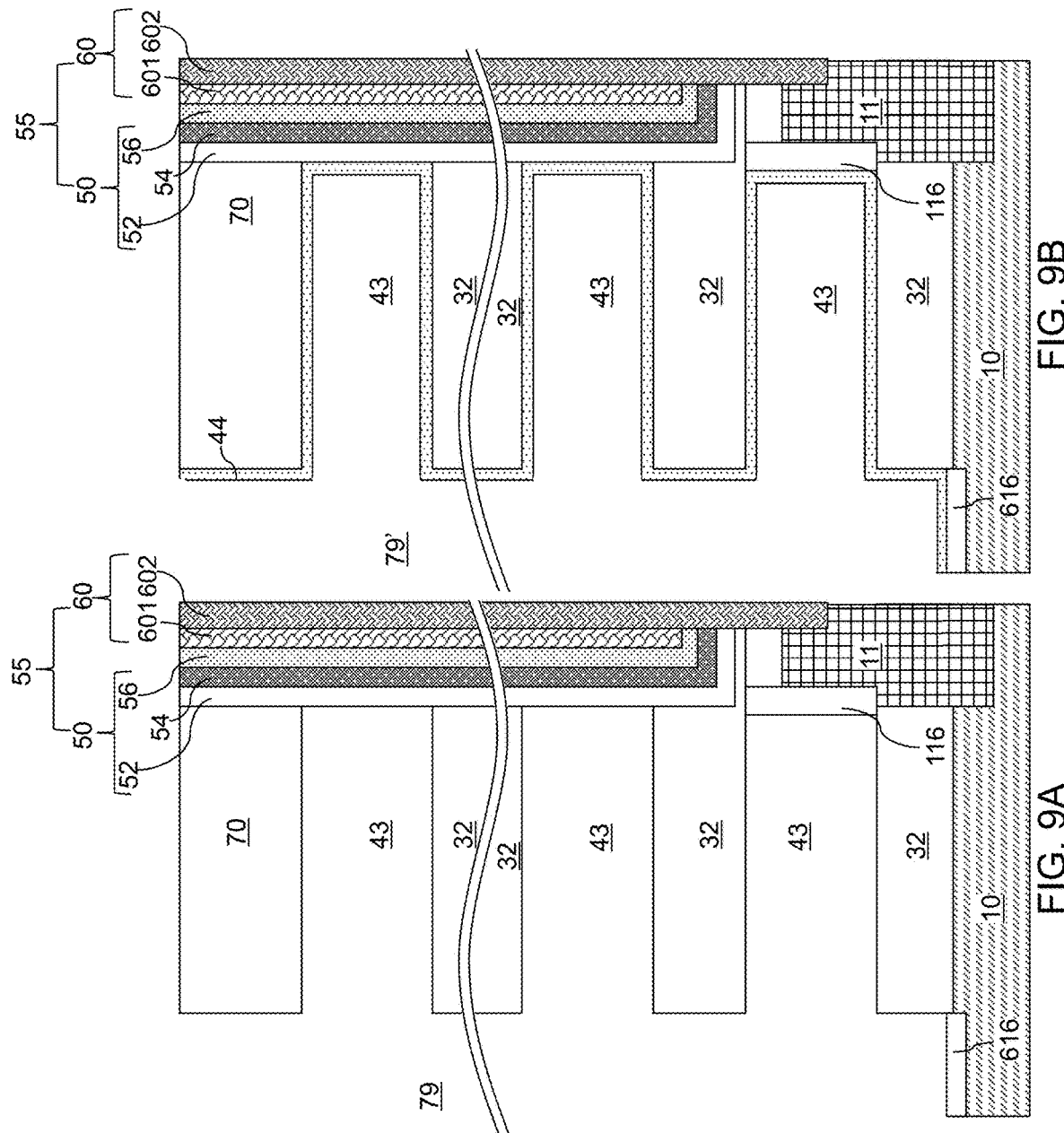

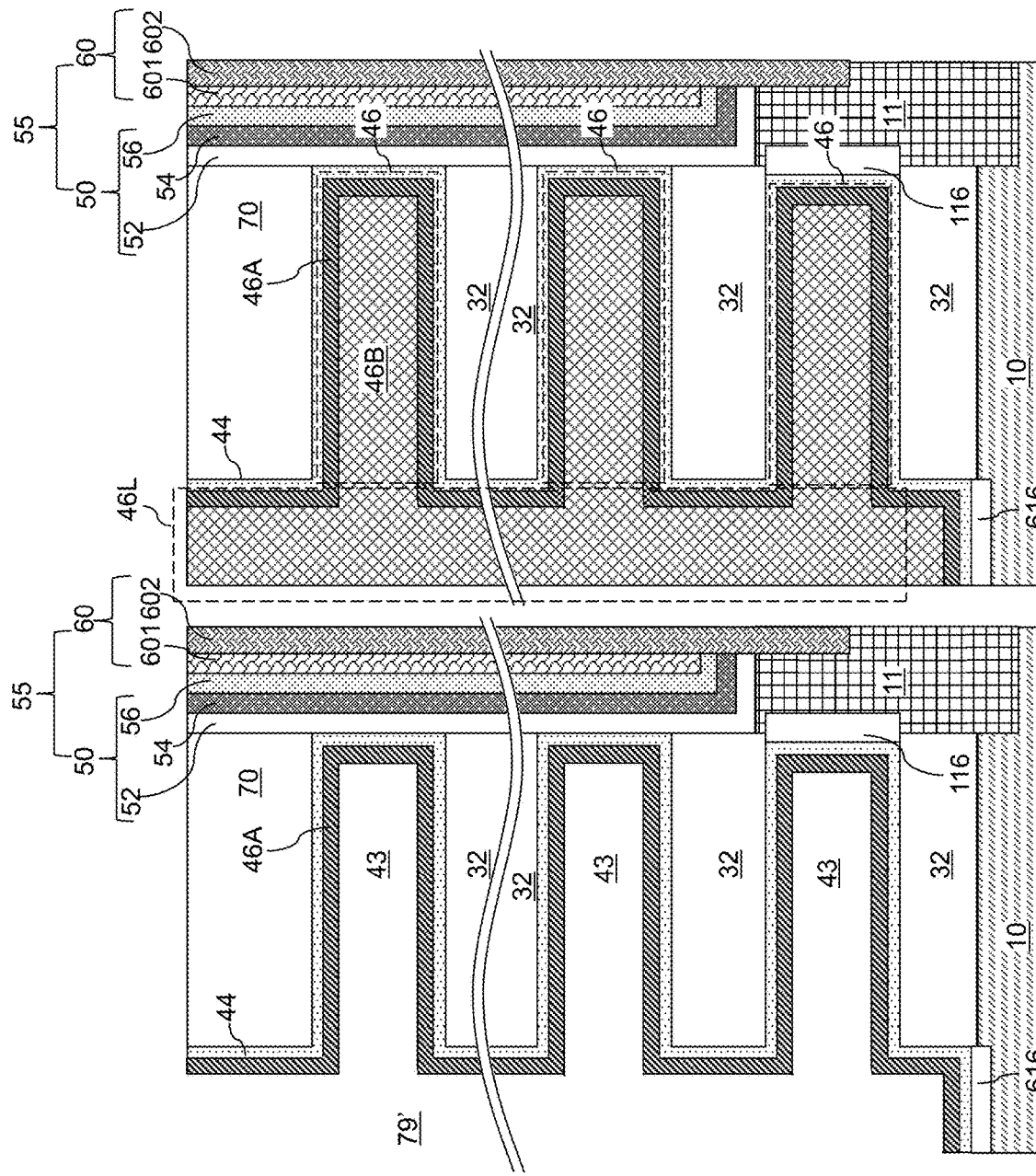

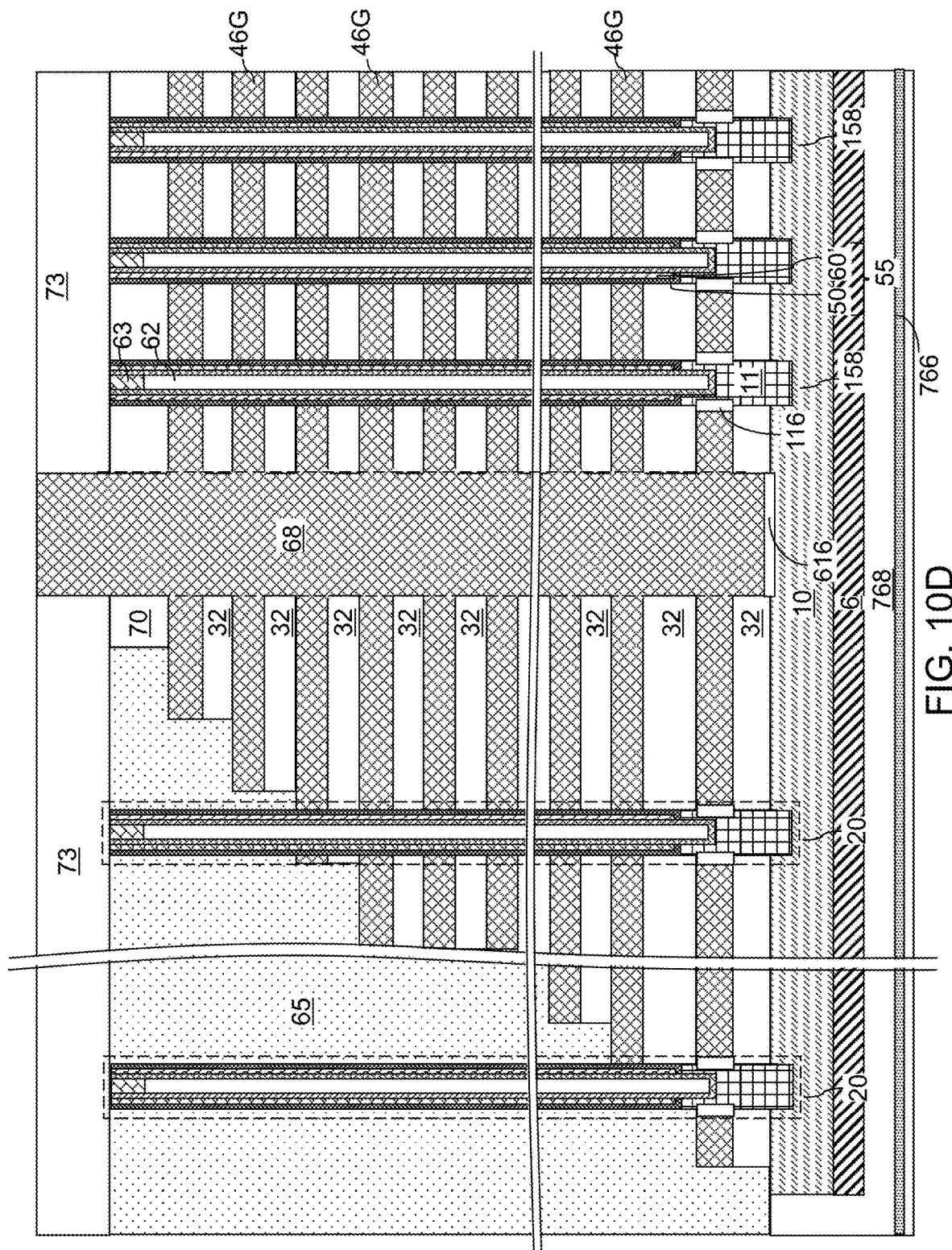

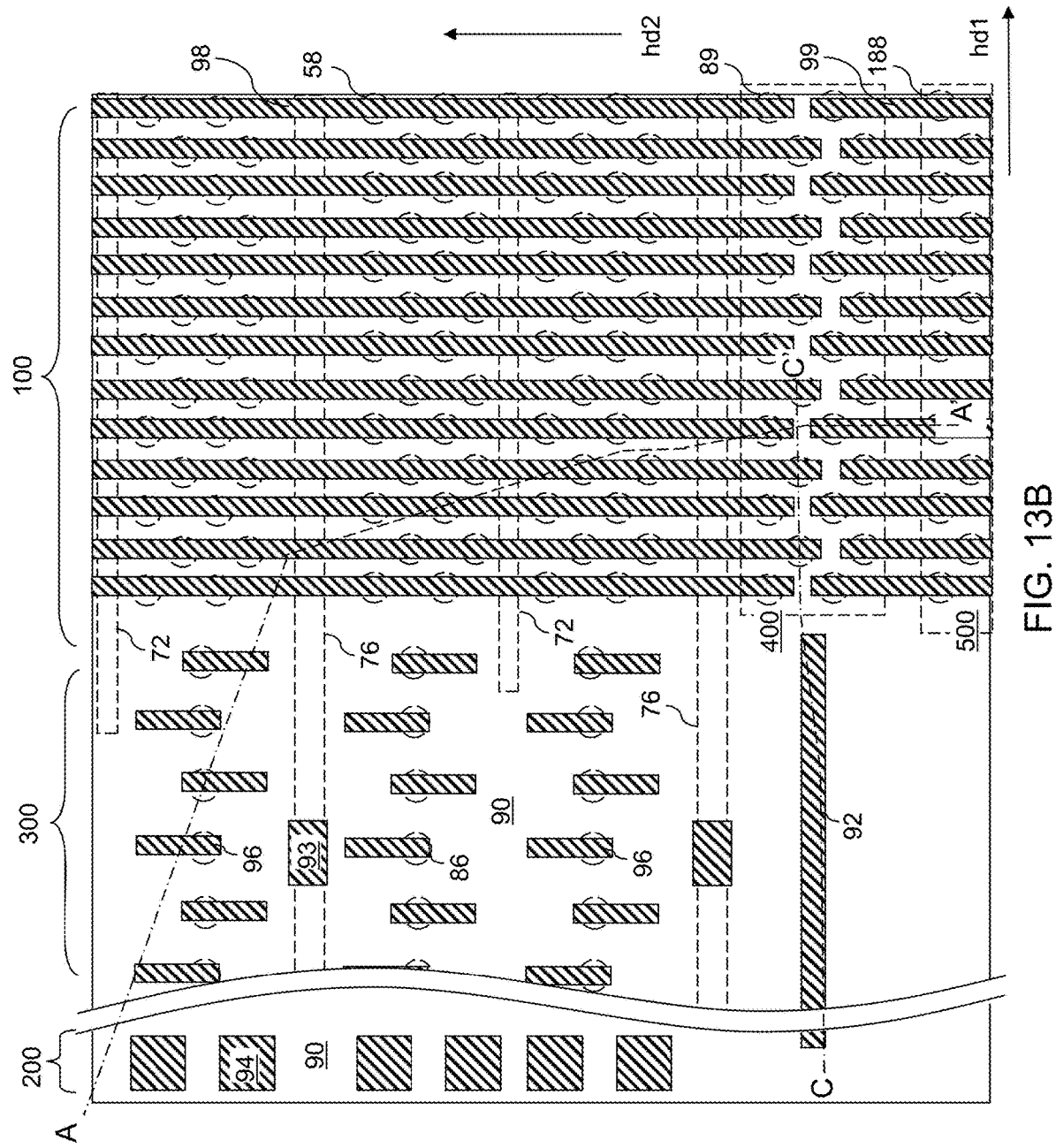

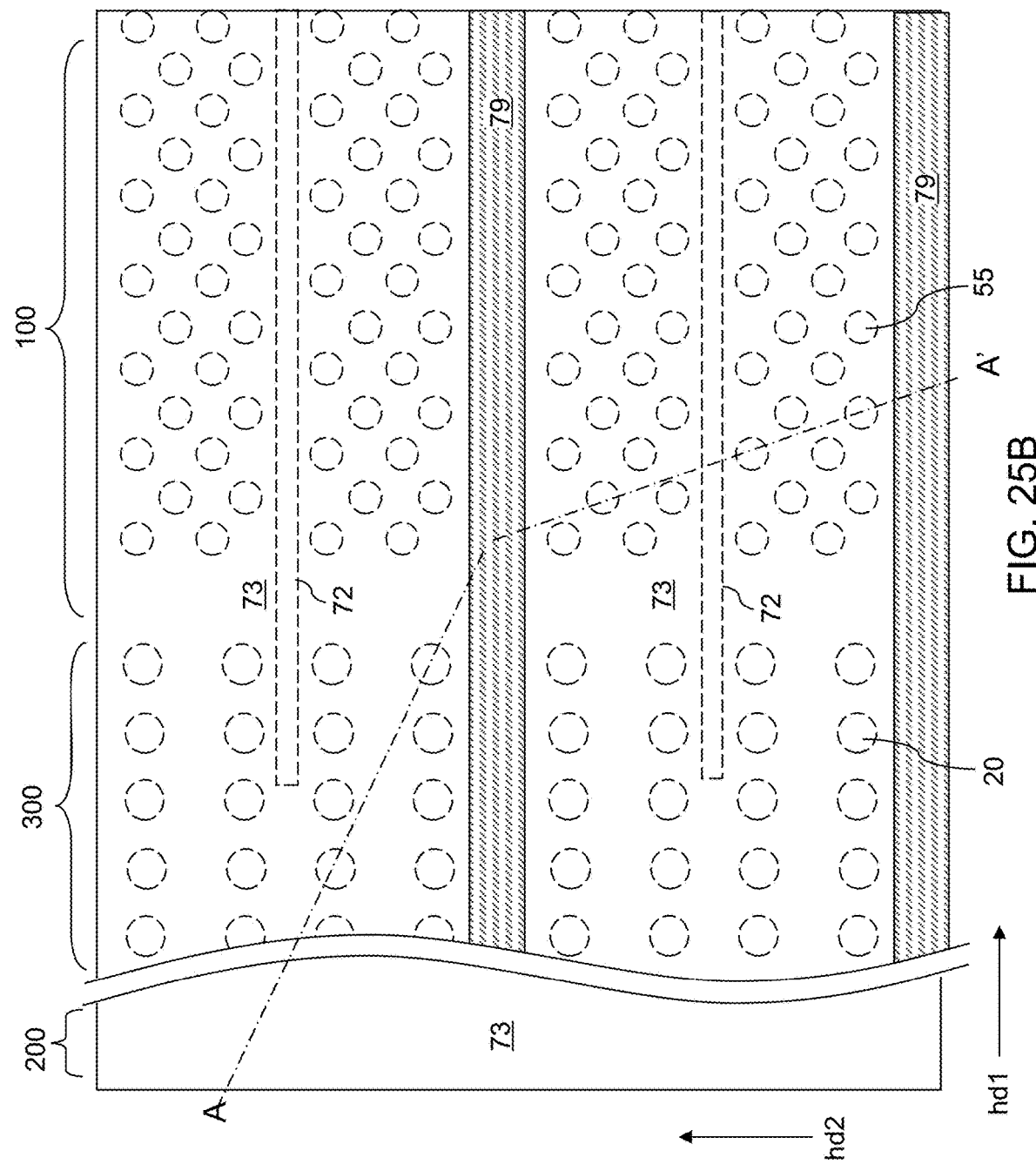

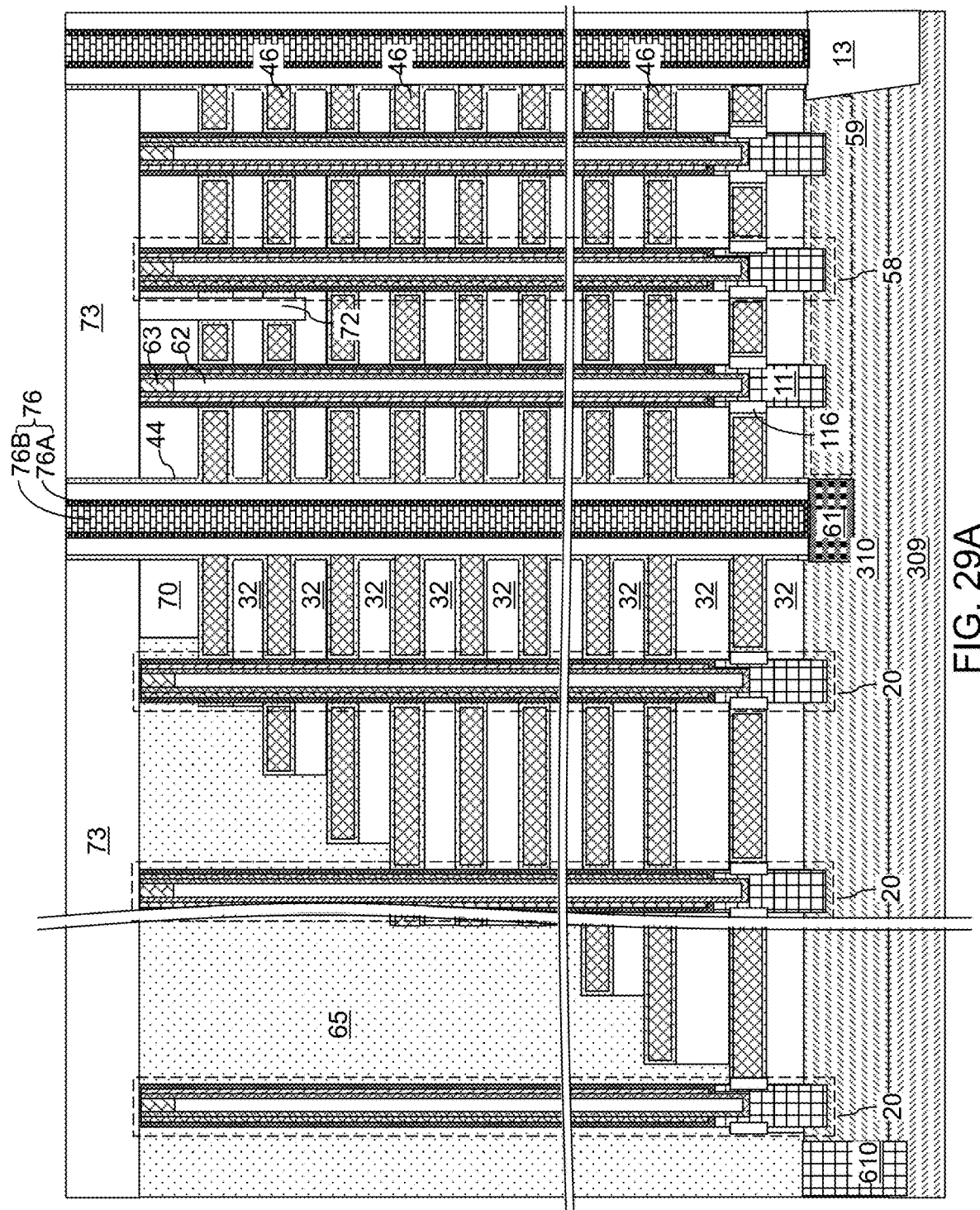

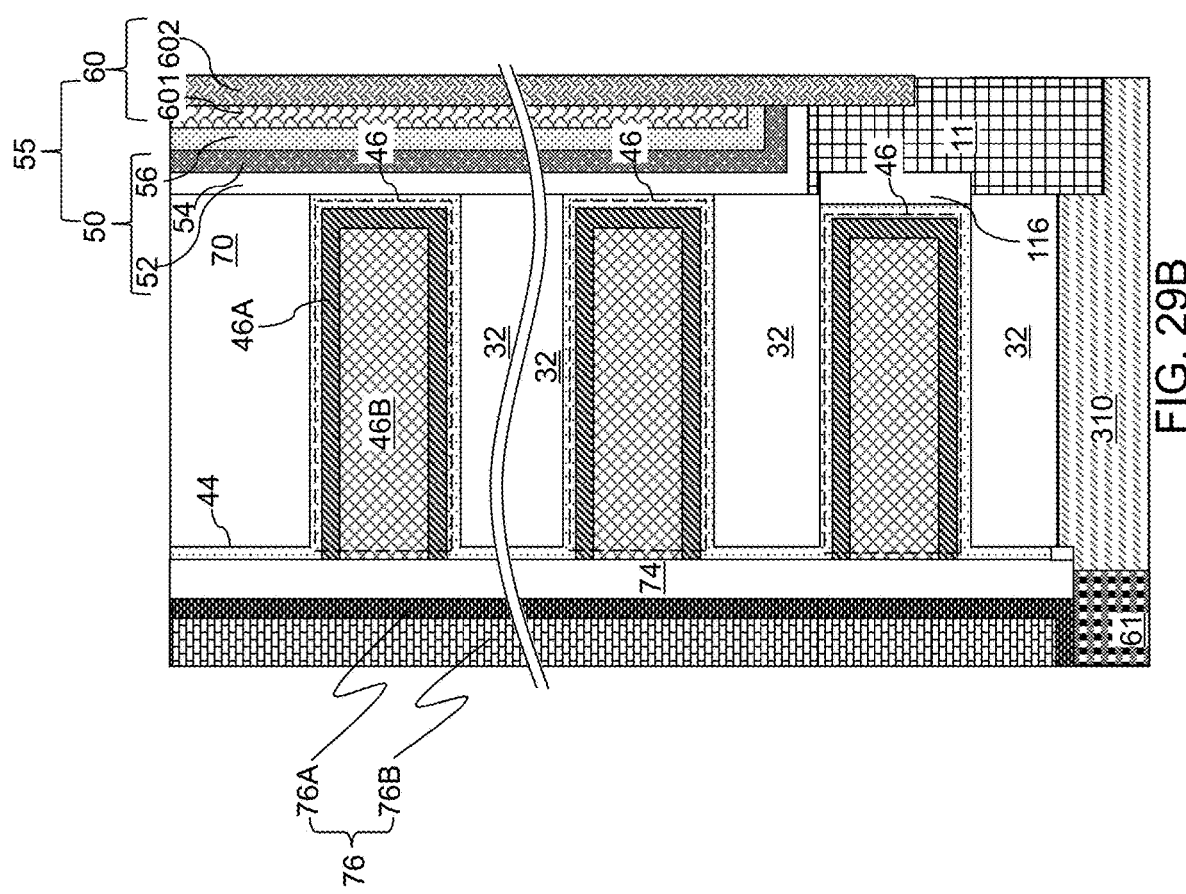

THREE-DIMENSIONAL MEMORY DEVICE CONTAINING BIT LINE SWITCHES

FIELD

The present disclosure relates generally to the field of semiconductor devices, and particularly to a three-dimensional memory device containing bit line switches and methods of making and operating the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a circuit is provided, which comprises: a first memory block region; a second memory block region; a first switch; a second switch; a first portion of a first bit line traversing the first memory block region and electrically connected to the first switch; a second portion of the first bit line traversing the second memory block region and electrically connected to the second switch; and a sense amplifier electrically connected to the first portion of the first bit line through the first switch, and the sense amplifier electrically connected to the second portion of the first bit line through the second switch.

According to another aspect of the present disclosure, a device is provided, which comprises: first memory stack structures extending through a first alternating stack of first insulating layers and first electrically conductive layers in a first memory block region; second memory stack structures extending through a second alternating stack of second insulating layers and second electrically conductive layers in a second memory block region, wherein each of the first and second memory stack structures comprises a respective vertical semiconductor channel and memory film; a first portion of a first bit line electrically connected to the first memory stack structures; a second portion of a first bit line electrically connected to the second memory stack structures; a first interconnect located between the first and the second memory block regions; and a sense amplifier, wherein the sense amplifier is electrically connected to the first and the second portions of the first bit line through the first interconnect.

According to still another aspect of the present disclosure, a semiconductor chip comprising a plurality of the devices of the present disclosure is provided.

According to even another aspect of the present disclosure, a method of operating the circuit of the present disclosure is provided, which comprises: turning on the first switch while the second switch is turned off; and providing a first current from the sense amplifier to the first portion of the first bit line without providing the first current from the sense amplifier to the second portion of the first bit line to perform a read operation, a write operation, or an erase operation on at least one memory cell located in the first memory block.

According to further another aspect of the present disclosure, a circuit is provided, which comprises: a first memory block region; a second memory block region; a first switch; a second switch; a first portion of a first bit line overlying the first memory block region and electrically connected to the first switch; a second portion of the first bit line overlying the second memory block region and electrically connected to the second switch; a sense amplifier electrically connected to the first portion of the first bit line through the first switch, and the sense amplifier electrically connected to the second portion of the first bit line through the second switch; and a first interconnect located between the first and the second memory block regions, wherein: the sense amplifier is located below the first and the second memory block regions; and the first interconnect extends below the first and the second memory block regions to electrically contact the sense amplifier.

According to an aspect of the present disclosure, a circuit is provided, which comprises: a first memory block region and a second memory block region located in a first semiconductor chip; a first switch located in a second semiconductor chip that is bonded to the first semiconductor chip; a second switch located in the second semiconductor chip; a first portion of a first bit line traversing the first memory block region and electrically connected to the first switch; a second portion of the first bit line traversing the second memory block region and electrically connected to the second switch; and a sense amplifier electrically connected to the first portion of the first bit line through the first switch, and the sense amplifier electrically connected to the second portion of the first bit line through the second switch.

According to another aspect of the present disclosure, a device is provided, which comprises: first memory stack structures extending through a first alternating stack of first insulating layers and first electrically conductive layers in a first memory block region of a first semiconductor chip; second memory stack structures extending through a second alternating stack of second insulating layers and second electrically conductive layers in a second memory block region of the first semiconductor chip, wherein each of the first and second memory stack structures comprises a respective vertical semiconductor channel and a respective memory film; a first switch located in a second semiconductor chip that is bonded to the first semiconductor chip and electrically connected to the first memory stack structures via a first portion of a first bit line in the first semiconductor chip; a second switch located in the second semiconductor chip and electrically connected to the second memory stack structures via a second portion of the first bit line in the first semiconductor chip; and a sense amplifier located in the second semiconductor chip and electrically connected to the first switch and to the second switch.

According to yet another aspect of the present disclosure, a bonded chip assembly is provided, which comprises the device of the present disclosure.

According to still another aspect of the present disclosure, a method of operating the circuit of the present disclosure is provided, which comprises: turning on the first switch while the second switch is turned off; and providing a first current from the sense amplifier to the first portion of the first bit line without providing the first current from the sense amplifier to the second portion of the first bit line to perform a read operation, a write operation, or an erase operation on at least one memory cell located in the first memory block.

According to a further embodiment of the present disclosure, a circuit is provided, which comprises: a first memory block region located in a first semiconductor chip; a second memory block region located in the first semiconductor chip; a first switch located in a second semiconductor chip that is bonded to the first semiconductor chip; a second switch located in the second semiconductor chip; a first portion of a first bit line traversing the first memory block region, located in the first semiconductor chip, and electrically connected to the first switch; a second portion of the first bit line traversing the second memory block region, located in the first semiconductor chip, and electrically connected to the second switch; and a sense amplifier located in the second semiconductor chip and electrically connected to the first portion of the first bit line through the first switch, and the sense amplifier electrically connected to the second portion of the first bit line through the second switch.

According to an aspect of the present disclosure, a memory chip is provided, which comprises a first memory block region, a second memory block region, a first switch, a second switch, a first portion of a first bit line traversing the first memory block region and electrically connected to the first switch, a second portion of the first bit line traversing the second memory block region and electrically connected to the second switch, a first interconnect, a sense amplifier electrically connected to the first portion of the first bit line through the first switch, and the sense amplifier electrically connected to the second portion of the first bit line through the second switch, and a memory array controller. The sense amplifier is located below the first and the second memory block regions, and the first interconnect extends below the first and the second memory block regions to electrically contact the sense amplifier. In an embodiment, the memory chip also contains a power supply.

BRIEF DESCRIPTION OF THE DRAWINGS

FIG. 4B is a top-down view of the exemplary structure of FIG. 4A. The vertical plane A-A' is the plane of the cross-section for FIG. 4A.

FIGS. 5A-5H are sequential schematic vertical cross-sectional views of a memory opening within the exemplary structure during formation of a memory stack structure, an optional dielectric core, and a drain region therein according to an embodiment of the present disclosure.

FIGS. 9A-9D are sequential vertical cross-sectional views of a region of the exemplary structure during formation of electrically conductive layers according to an embodiment of the present disclosure.

FIG. 10D is a schematic vertical cross-sectional view of the exemplary structure along the vertical plane D-D' of FIG. 10B.

FIG. 13B is a top-down view of the exemplary structure of FIG. 13A. The vertical plane A-A' is the plane of the schematic vertical cross-sectional view of FIG. 13A.

FIG. 25B is a partial see-through top-down view of the first in-process semiconductor chip of FIG. 25A. The vertical plane A-A' is the plane of the schematic vertical cross-sectional view of FIG. 25A.

FIG. 29A is a schematic vertical cross-sectional view of the first in-process semiconductor chip after formation of an insulating spacer and a backside contact structure according to an embodiment of the present disclosure.

FIG. 29B is a magnified view of a region of the first in-process semiconductor chip of FIG. 29A.

DETAILED DESCRIPTION

Figure 1A:
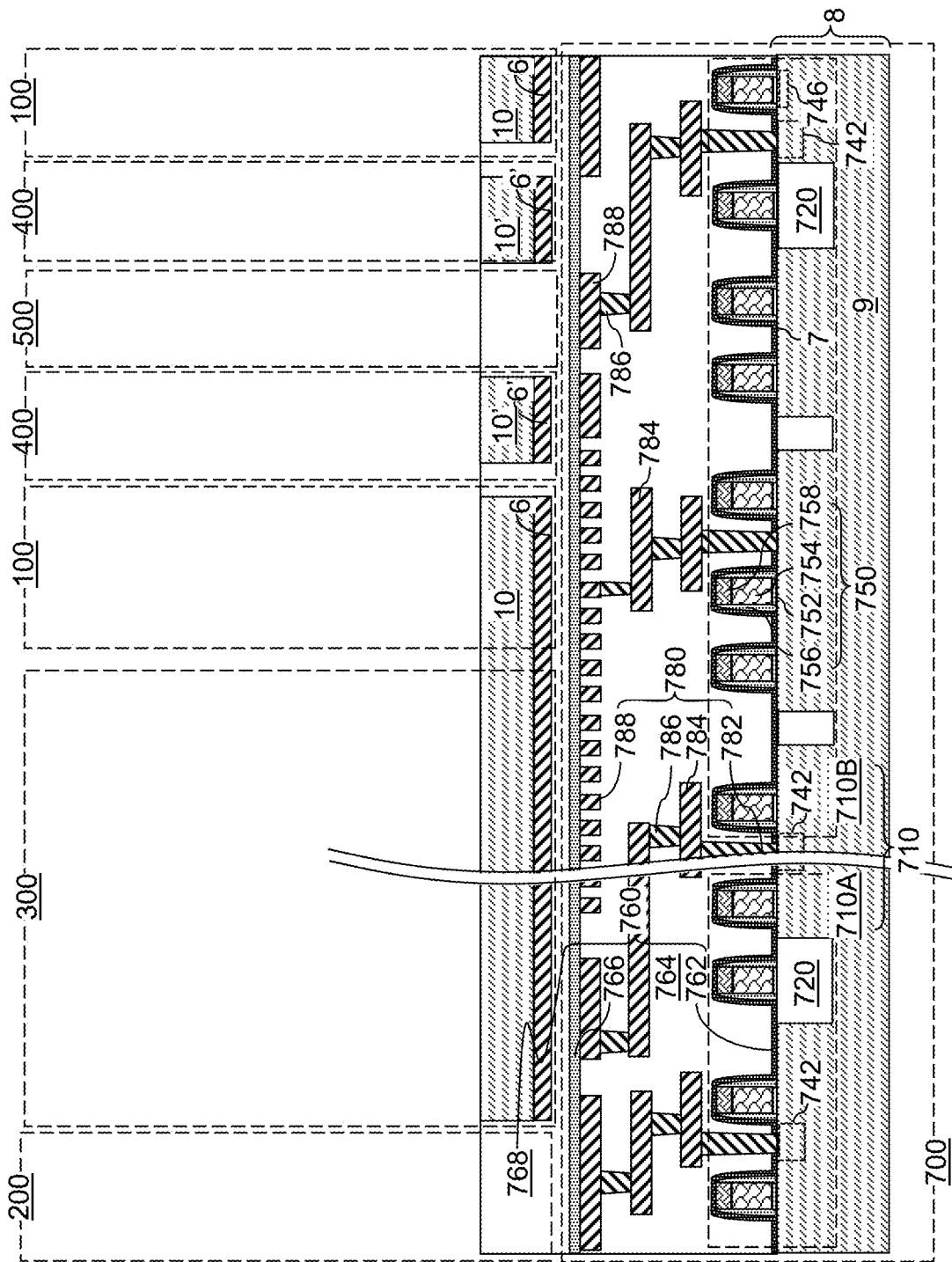
FIG. 1A is a vertical cross-sectional view of an exemplary structure after formation of semiconductor devices, lower level dielectric layers, lower metal interconnect structures, and in-process source level material layers on a semiconductor substrate according to a first embodiment of the present disclosure.

A significant fraction of a total sense time or the total programming time for memory devices is determined by the RC delay (i.e., resistance capacitance delay) of the bit lines in the memory devices. The embodiments of the present disclosure are directed to a three-dimensional memory device containing bit line switches. The switches reduce RC delay in the bit lines and improve the operating speed of a memory device, such as three-dimensional memory device containing vertical NAND strings. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a "prototype" structure or an "in-process" structure refers to a transient structure that is subsequently modified in the shape or composition of at least one component therein.

As used herein, a first electrical component is electrically connected to a second electrical component if there exists an electrically conductive path between the first electrical component and the second electrical component. As used herein, an "electrically conductive path" refers to a path through which electrical current can flow. The path may be made of one or more of various materials include a metal, a semiconductor, and the like. The path may be a solid material, a liquid material or a gas. As used herein, a "switch" refers to any device configured to provide a first configuration that provides an electrically conductive path between two terminals and a second configuration that removes, blocks, or impedes the electrically conductive path between the two terminals depending on an external input. Non-limiting examples of a switch include field effect transistors, junction transistors, bipolar transistors, thyristors, and field programmable gate arrays. An "interconnect" refers to any conductive structure or any set of two or more conductive structures that provides an electrically conductive path between a first electrical node and a second electrical node. The conductive structure may have one or more of a variety of shapes, including a wire, a trace, a column, a pillar, a sheet, and the like. A "conductive structure" refers to a structure made of an electrically conductive material. A "conductive material" is defined below. As used herein, a "bonding structure" refers to any structure that can be used for bonding, connecting, joining, or coupling two or more structures. A bonding structure includes but is not limited to a bonding pad that can be directly bonded to another bonding pad, and/or a solder material portion, such as a solder ball or block, that can be bonded to another solder material portion or to a bonding pad.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor die, or a semiconductor package, can include a memory chip. Each semiconductor package contains one or more dies (for example one, two, or four). The die is the smallest unit that can independently execute commands or report status. Each die contains one or more planes (typically one or two). Identical, concurrent operations can take place on each plane, although with some restrictions. Each plane contains a number of blocks, which are the smallest unit that can be erased by in a single erase operation. Each block contains a number of pages, which are the smallest unit that can be programmed, i.e., a smallest unit on which a read operation can be performed.

Figure 1B:
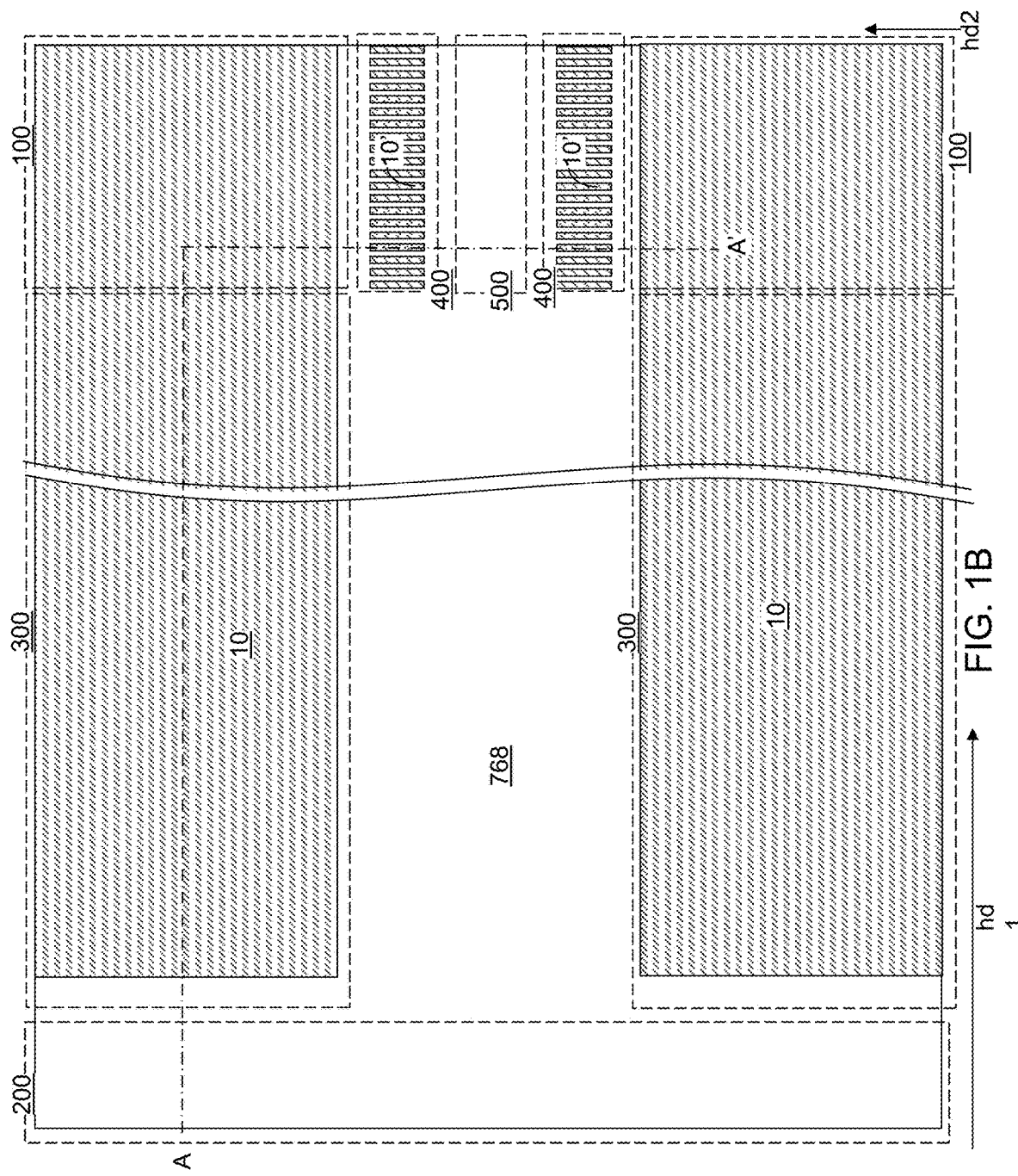
FIG. 1B is a top-down view of the exemplary structure of FIG. 1A. The hinged vertical plane A-A' is the plane of the vertical cross-sectional view of FIG. 1A.

Referring to FIGS. 1A and 1B, an exemplary structure according to an embodiment of the present disclosure is illustrated, which can be employed, for example, to fabricate a device structure containing vertical NAND memory devices. The exemplary structure includes a substrate 8, which can be a semiconductor substrate. The substrate can include a substrate semiconductor layer 9. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^5$ S/cm. As used herein, a "semiconductor material" refers to a material having electrical conductivity in the range from $1.0 \times 10^{-6}$ S/cm to $1.0 \times 10^5$ S/cm in the absence of electrical dopants therein, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-6}$ S/cm to $1.0\times10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

Shallow trench isolation structures 720 is formed in an upper portion of the substrate semiconductor layer 9 to provide electrical isolation among semiconductor devices 710. The semiconductor devices 710 can include, for example, field effect transistors including respective transistor active regions 742 (i.e., source regions and drain regions), channel regions 746, and gate structures 750. The field effect transistors may be arranged in a CMOS configuration. Each gate structure 750 can include, for example, a gate dielectric 752, a gate electrode 754, a dielectric gate spacer 756 and a gate cap dielectric 758. The semiconductor devices can include any semiconductor circuitry to support operation of a memory structure to be subsequently formed, which is typically referred to as a driver circuitry, which is also known as peripheral circuitry. As used herein, a peripheral circuitry refers to any, each, or all, of a word line decoder circuitry, a word line switching circuitry, a bit line decoder circuitry, a bit line sensing and/or switching circuitry, a power supply/distribution circuitry, a data buffer and/or latch, or any other semiconductor circuitry that can be implemented outside a memory array structure for operation of a memory device. For example, the semiconductor devices can include word line switching devices for electrically biasing word lines of three-dimensional memory structures to be subsequently formed. The region in which the semiconductor devices 710 are located is herein referred to as a support device region 700, which include semiconductor devices 710 that function as components of a support circuitry for the memory arrays to be subsequently formed. Some of the semiconductor devices 710 form a sense amplifier (e.g., a sense amplifier circuit) 710B, while the remaining semiconductor device 710A do not form part of the sense amplifier.

Dielectric material layers are formed over the semiconductor devices 710, which are herein referred to as lower-level dielectric layers 760. The lower-level dielectric layers 760 can include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768.

The dielectric layer stack including the lower-level dielectric layers 760 functions as a matrix for lower-level metal interconnect structures 780 that provide electrical wiring among the various nodes of the semiconductor devices and landing pads for through-memory-level contact via structures to be subsequently formed. The lower-level metal interconnect structures 780 are embedded within the dielectric layer stack of the lower-level dielectric layers 760, and comprise a lower-level metal line structure located under and optionally contacting a bottom surface of the silicon nitride layer 766.

For example, the lower-level metal interconnect structures 780 can be embedded within the first dielectric material layers 764. The first dielectric material layers 764 may be a plurality of dielectric material layers in which various elements of the lower-level metal interconnect structures 780 are sequentially embedded. Each dielectric material layer among the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 can comprise, or consist essentially of, dielectric material layers having dielectric constants that do not exceed the dielectric constant of undoped silicate glass (silicon oxide) of 3.9. The lower-level metal interconnect structures 780 can include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level contact via structures to be subsequently formed.

The landing-pad-level metal line structures 788 are formed within a topmost dielectric material layer of the first dielectric material layers 764 (which can be a plurality of dielectric material layers). Each of the lower-level metal interconnect structures 780 can include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 can be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer among the at least one second dielectric material layer 768 may include any of doped silicate glass, undoped silicate glass, and organosilicate glass. In one embodiment, the at least one first second material layer 768 can comprise, or consist essentially of, dielectric material layers having dielectric constants that do not exceed the dielectric constant of undoped silicate glass (silicon oxide) of 3.9.

An optional layer of a metallic material and a layer of a semiconductor material are deposited over, or within patterned recesses of, the at least one second dielectric material layer 768, and is lithographically patterned to form a memory-region source-level stacks (6, 10) and transistor interconnect pads (6', 10'). Each memory-region source-level stack (6, 10) can include a metallic source-level layer 6 and/or a semiconductor source-level layer 10. Each transistor interconnect pad (6', 10') can include a metallic transistor interconnect pad portion 6' and/or a semiconductor transistor interconnect pad portion 10'. The memory-region source-level stacks (6, 10) are formed in memory block regions 100, which are also referred to as array regions. The transistor interconnect pads (6', 10') are formed in switching transistor device regions 400. The metallic source-level layer 6, if present, provides a high conductivity conduction path for electrical current that flows into, or out of, the semiconductor source-level layer 10. Each metallic source-level layer 6 includes a conductive material such as a metal, metal alloy or a heavily doped semiconductor material. The optional metallic source-level layer 6, for example, may include a tungsten or tungsten silicide layer having a thickness in a range from 3 nm to 100 nm, although lesser and greater thicknesses can also be employed. A metal nitride layer (not shown) may be provided as a diffusion barrier layer on top of each metallic source-level layer 6. The metallic source-level layers 6 may function as special source lines in the completed device. The thickness of each metallic source-level layer 6 may be in a range from 5 nm to 100 nm, although lesser and greater thicknesses can also be employed.

Switching transistor devices are subsequently formed within regions that include the transistor interconnect pads (6', 10'). The regions that include the transistor interconnect pads (6', 10') are herein referred to as connection transistor regions 400. Sense amplifier connection regions 500 are provided between each pair of connection transistor regions 400. At least some of the semiconductor devices 710 form a sense amplifier 710B (e.g., a sense amplifier circuit) for the memory device. Interconnect via structures that connect to the sense amplifier are formed within each sense amplifier connection region 500. Each region in which a memory array is subsequently formed is herein referred to as a memory block region 100. Each region in which interconnect via structures to the remaining semiconductor devices 710A other than the sense amplifier 710B are to be subsequently formed is herein referred to as a peripheral device region 200. A contact region 300 for subsequently forming stepped terraces of electrically conductive layers is provided between a memory block region 100 and a peripheral device region 200.

Figure 2:
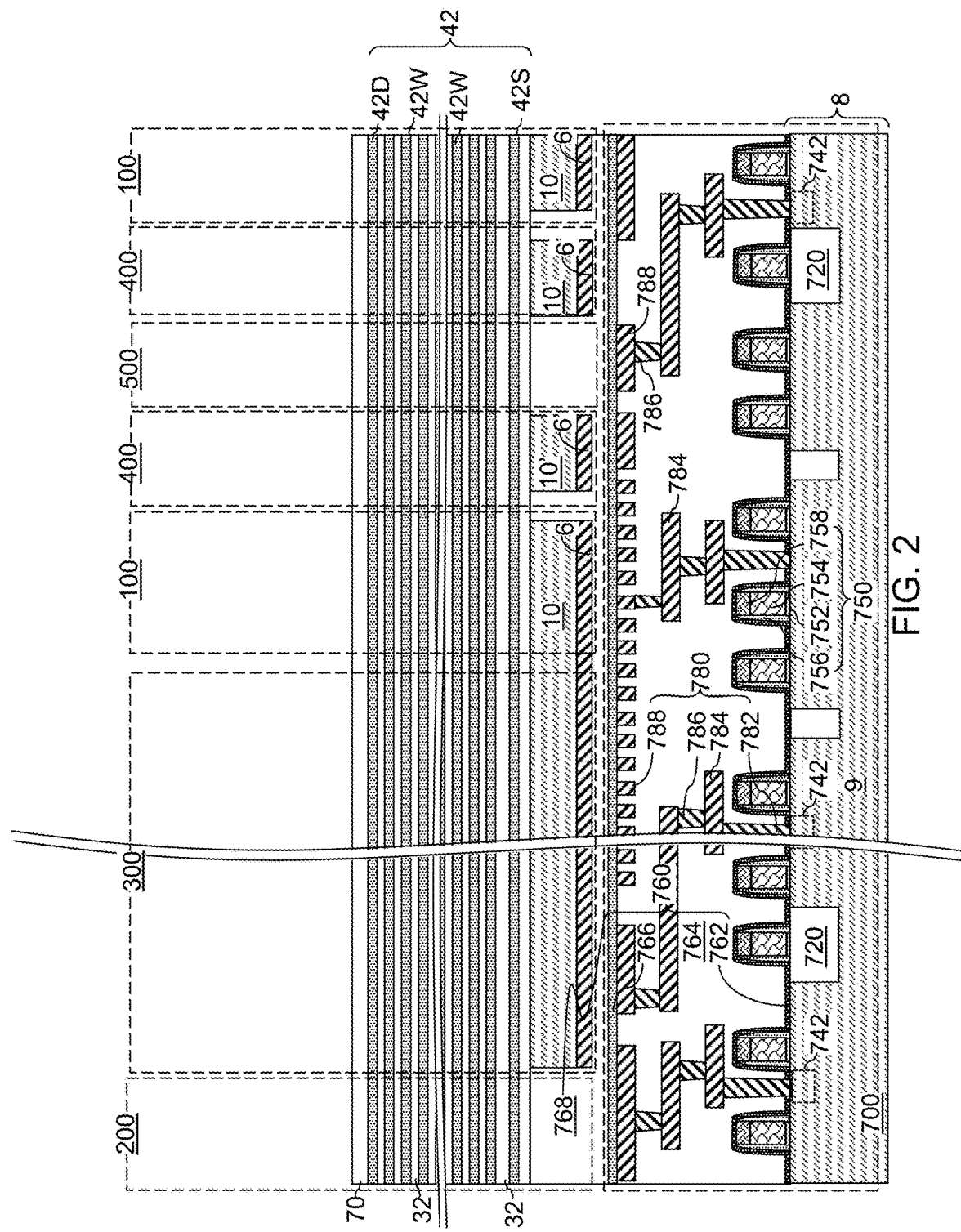
FIG. 2 is a schematic vertical cross-sectional view of the exemplary structure after formation of an alternating stack of insulting layers and spacer material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate 8. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can include a source-select-level sacrificial material layer 42S which is subsequently replaced with a source-select-level electrically conductive layer (i.e., source side select gate) configured to select a block of memory stack structures, word-line-level sacrificial material layers 42W which are subsequently replaced with word-line-level electrically conductive layers (i.e., word lines/control gates), and at least one drain-select-level sacrificial material layer 42D which is subsequently replaced with at least one drain-select-level electrically conductive layer (i.e., drain side select gate) configured to select a string of memory stack structures within a respective block of memory stack structures.

The sacrificial material layers 42 are suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3A:
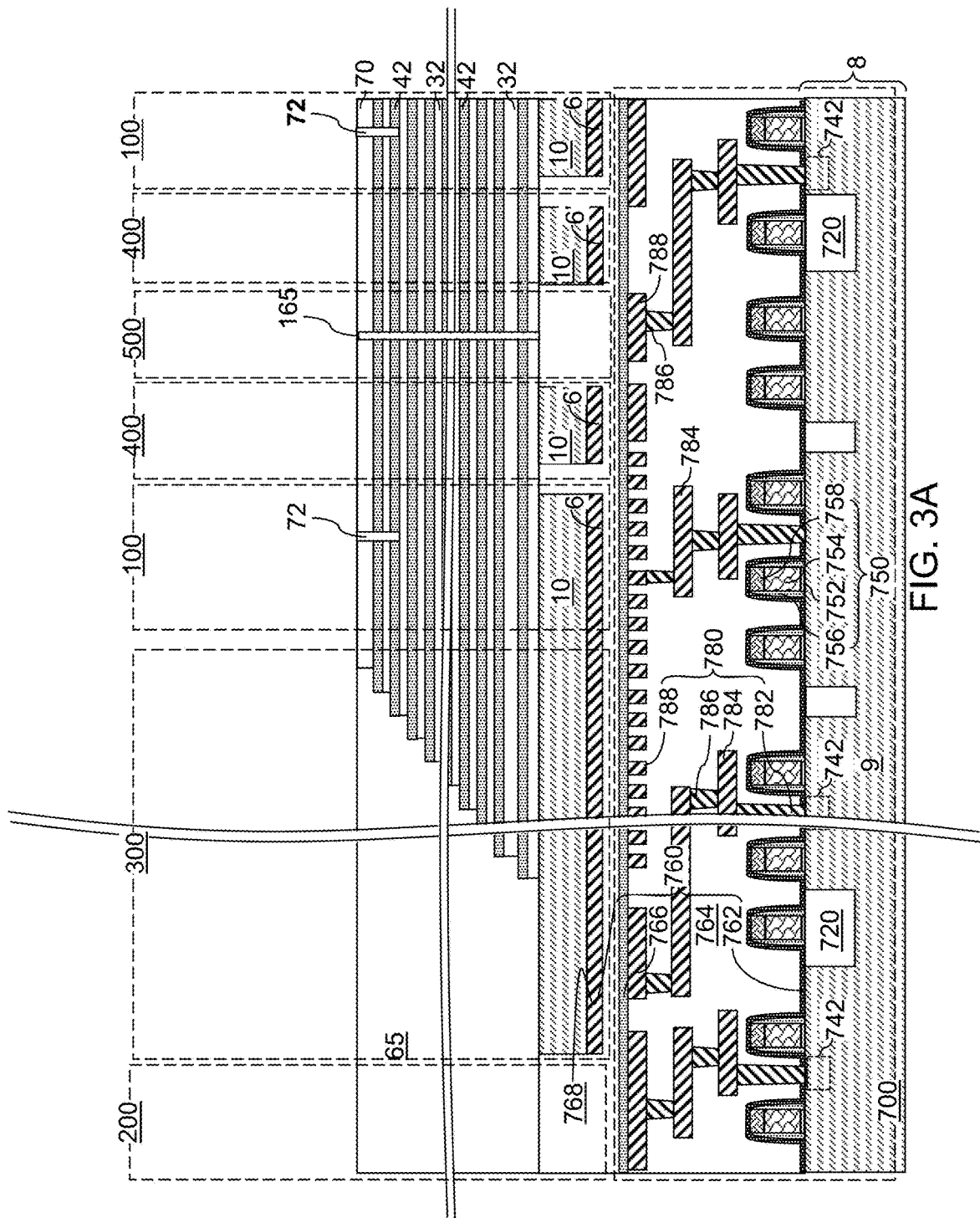
FIG. 3A is a schematic vertical cross-sectional view of the exemplary structure after formation of stepped terraces, a retro-stepped dielectric material portion, and a dielectric isolation structure according to an embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the contact region 300, which is located between the memory block region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate 8. In one embodiment, the stepped cavity is formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases are formed along a first horizontal direction hd1 (e.g., word line direction) such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 (e.g., bit line direction) that is perpendicular to the first horizontal direction hd1 (e.g., word line direction). In one embodiment, the first horizontal direction hd1 may be perpendicular to the boundary between the memory block region 100 and the contact region 300.

A retro-stepped dielectric material portion 65 (i.e., an insulating fill material portion) is formed in the stepped cavity by deposition of a dielectric material therein. For example, a dielectric material such as silicon oxide is deposited in the stepped cavity. Excess portions of the deposited dielectric material is removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 3B:
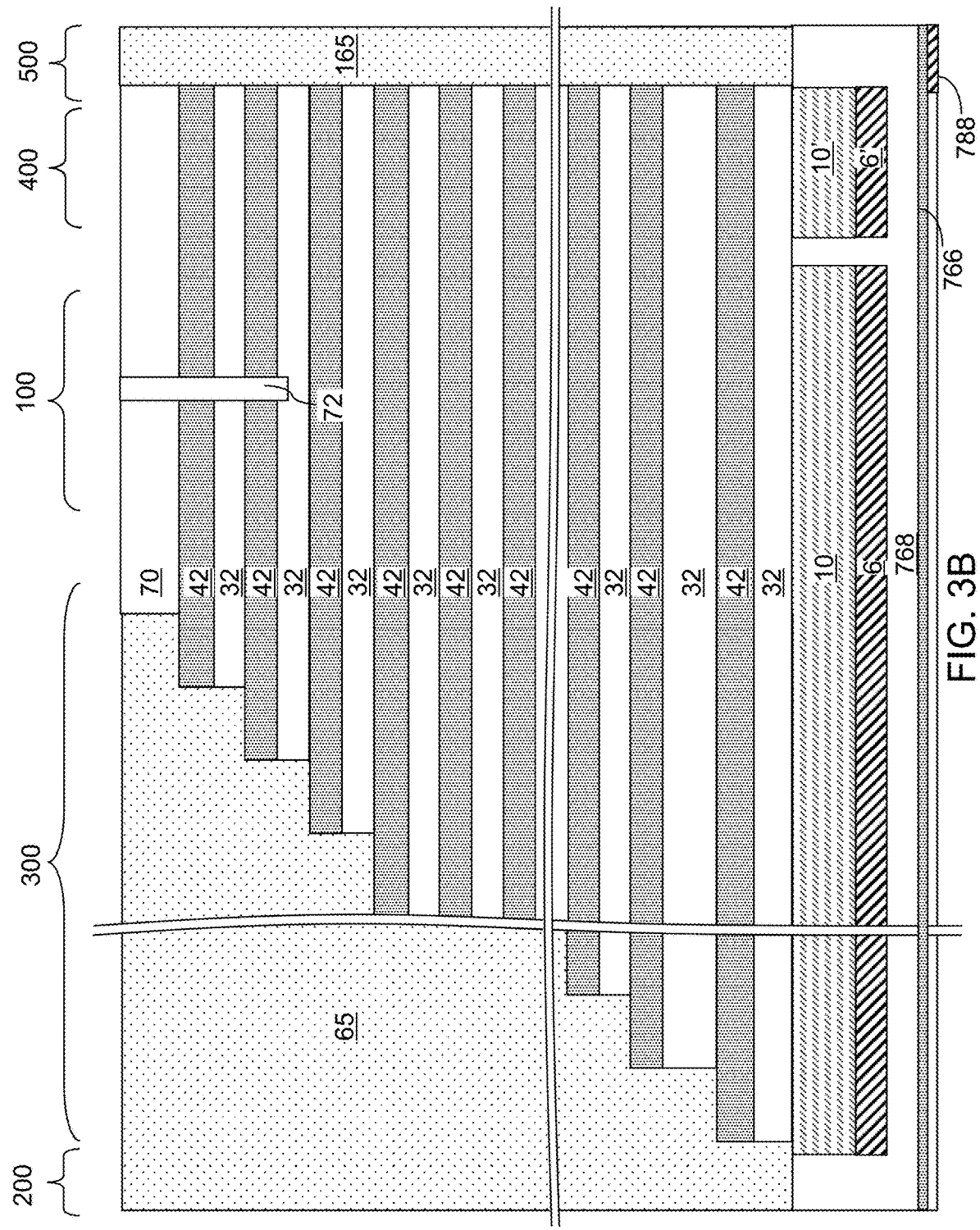
FIG. 3B is a magnified vertical cross-sectional view of a region of the view of FIG. 3A.

Isolation cavities are formed in the sense amplifier connection regions 500. The isolation cavities can vertically extend through the insulating cap layer 70 and the alternating stack (32, 42) with substantially vertical sidewalls. A top surface of the at least one second dielectric layer 768 can be physically exposed at the bottom of each isolation cavity. A dielectric material is deposited in the isolation cavities, and excess portions of the dielectric material is removed from above the horizontal plane including the top surface of the insulating cap layer 70. Each remaining portion of the dielectric material in the isolation cavities constitutes an isolation pillar structure 165, as shown in FIG. 3B. In one embodiment, a predominant portion of each sense amplifier connection region 500 is filled with a respective isolation pillar structure 165.

Optionally, drain select level isolation structures 72 are formed through the insulating cap layer 70 and a subset of the sacrificial material layers 42 located at drain select levels. The drain select level isolation structures 72 are formed, for example, by forming drain select level isolation trenches and filling the drain select level isolation trenches with a dielectric material such as silicon oxide. Excess portions of the dielectric material are removed from above the top surface of the insulating cap layer 70.

Figure 4A:
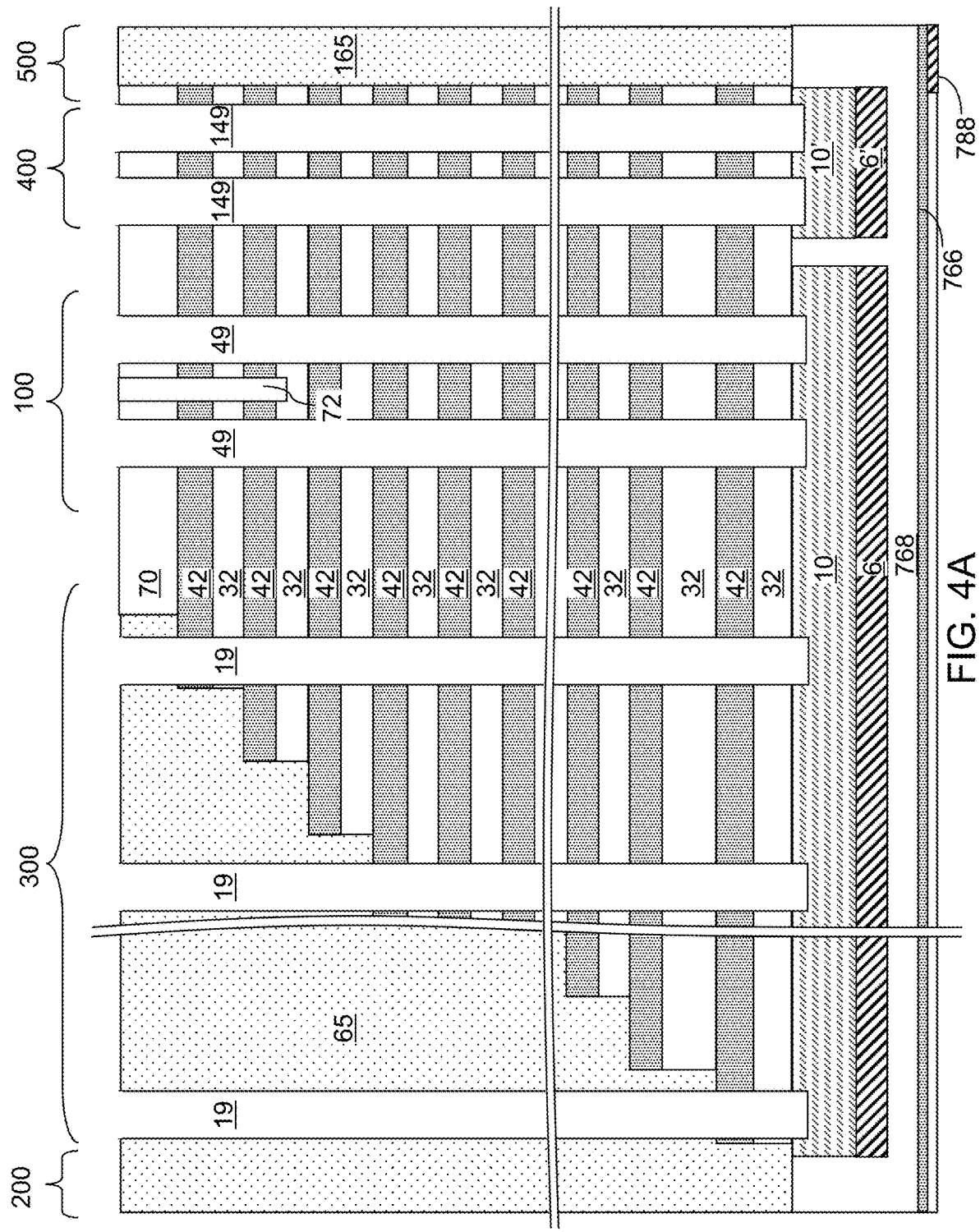
FIG. 4A is a schematic vertical cross-sectional view of the exemplary structure after formation of memory openings, switching transistor device openings, and support openings according to an embodiment of the present disclosure.

Referring to FIGS. 4A and 4B, a lithographic material stack (not shown) including at least a photoresist layer is formed over the insulating cap layer 70 and the retro-stepped dielectric material portion 65, and is lithographically patterned to form openings therein. The openings include a first set of openings formed over the memory block region 100, a second set of openings formed over the contact region 300, and a third set of openings formed over a switch transistor region 400. The switch transistor region 400 can be in a strip shape and can be located between neighboring pairs of memory block regions 100. While only a single memory block region 100 is illustrated in FIGS. 4A and 4B, it is understood that multiple memory block regions 100 and multiple switch transistor regions 400 can be employed. Each switch transistor region 400 is located between a pair of memory block regions 100 that are laterally spaced apart along the second horizontal direction hd2. Each of the memory block regions 100 can include rows of memory openings extending along the first horizontal direction hd1. Each of the switch transistor regions 400 can include rows of switch transistor openings extending along the first horizontal direction hd1.

The pattern in the lithographic material stack is transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49, support openings 19, and switch transistor openings 149. As used herein, a "memory opening" refers to an opening in which memory elements, such as a memory stack structure, is subsequently formed. As used herein, a "support opening" refers to an opening in which a support structure (such as a support pillar structure) that mechanically supports other elements is subsequently formed. As used herein, a "switch transistor opening" refers to an opening in which a switch transistor to be employed to provide electrical connection to, and electrical disconnection from, a respective portion of a bit line is to be subsequently formed. The memory openings 49 and the switch transistor openings 149 are formed through the insulating cap layer 70 and the entirety of the alternating stack (32, 42) in the memory block region 100. The support openings 19 are formed through the retro-stepped dielectric material portion 65 and the portion of the alternating stack (32, 42) that underlie the stepped surfaces in the contact region 300.

The memory openings 49 and the switch transistor openings 149 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49, the switch transistor openings 149, and the support openings 19 can extend at least from the horizontal plane including the top surface of the alternating stack (32, 42) to at least the horizontal plane including the topmost surface of a semiconductor source-level layer 10. In one embodiment, the memory openings 49, the switch transistor openings 149, and the support openings 19 can extend from the horizontal plane including the top surface of the insulating cap layer 70 to at least the horizontal plane including the topmost surface of the semiconductor source-level layer 10. In one embodiment, an overetch into the semiconductor source-level layer 10 may be optionally performed after the top surface of the semiconductor source-level layer 10 is physically exposed at a bottom of each memory opening 49 and each support opening 19. The overetch may be performed prior to, or after, removal of the lithographic material stack. In other words, the recessed surfaces of the semiconductor source-level layer 10 may be vertically offset from the un-recessed top surfaces of the semiconductor source-level layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor source-level layer 10.

Each of the memory openings 49, switch transistor openings 149, and the support openings 19 may include a sidewall (or a plurality of sidewalls) that extends substantially perpendicular to the topmost surface of the substrate 8. A two-dimensional array of memory openings 49 is formed in each memory block region 100. A two-dimensional array of switch transistor openings 149 is formed in the switch transistor regions 400. A two-dimensional array of support openings 19 is formed in the contact region 300.

FIGS. 5A-5H illustrate structural changes in a memory opening 49, which is one of the memory openings 49 in the exemplary structure of FIGS. 4A and 4B. The same structural change occurs simultaneously in each of the other memory openings 49, each of the switch transistor openings 149, and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor source-level layer 10. At this processing step, each support opening 19 can extend through the retro-stepped dielectric material portion 65, a subset of layers in the alternating stack (32, 42), and optionally through the upper portion of the semiconductor source-level layer 10. The recess depth of the bottom surface of each memory opening with respect to the top surface of the semiconductor source-level layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 is formed at the bottom portion of each memory opening 49 and each support openings 19, for example, by selective semiconductor deposition process. In one embodiment, the pedestal channel portion 11 is doped with electrical dopants of the same conductivity type as the vertical semiconductor channels to be subsequently formed. In one embodiment, the top surface of each pedestal channel portion 11 is formed above a horizontal plane including the top surface of a sacrificial material layer 42. In this case, at least one source select gate electrode is subsequently formed by replacing each sacrificial material layer 42 located below the horizontal plane including the top surfaces of the pedestal channel portions 11 with a respective conductive material layer. The pedestal channel portion 11 is a portion of a transistor channel that extends between a source region to be subsequently formed in the substrate 8 and a drain region to be subsequently formed in an upper portion of the memory opening 49. A memory cavity 49' is present in the unfilled portion of the memory opening 49 above the pedestal channel portion 11.

Referring to FIG. 5C, a stack of layers including a blocking dielectric layer 52, a charge storage layer 54, a tunneling dielectric layer 56, and an optional first semiconductor channel layer 601 is sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 is formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 is removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' is removed to form openings in remaining portions thereof. Each of the first semiconductor channel layer 601, the tunneling dielectric layer 56, the charge storage layer 54, and the blocking dielectric layer 52 is etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 is a charge storage layer in which each portion adjacent to the sacrificial material layers 42 constitutes a charge storage region.

A surface of the pedestal channel portion 11 (or a surface of the semiconductor source-level layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor source-level layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 is deposited directly on the semiconductor surface of the pedestal channel portion 11 or the semiconductor source-level layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L is removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 is removed by a planarization process, which can employ a recess etch or chemical mechanical planarization (CMP). Each remaining portion of the second semiconductor channel layer 602 is located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 is further recessed within each memory opening, for example, by a recess etch to a depth that is located between the top surface of the insulating cap layer 70 and the bottom surface of the insulating cap layer 70. Active regions 63 (such as drain regions or source regions) can be formed by depositing a doped semiconductor material within each recessed region above the dielectric cores 62. The active regions 63 can have a doping of a second conductivity type that is the opposite of the first conductivity type. For example, if the first conductivity type is p-type, the second conductivity type is n-type, and vice versa. The dopant concentration in the active regions 63 can be in a range from $5.0 \times 10^{19}/cm^3$ to $2.0 \times 10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the active regions 63. The active regions 63 in the memory block region 100 can function as drain regions.

Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and an active region 63 (such as a drain region) within a memory opening 49 is herein referred to as a memory opening fill structure 58.

Figure 6:
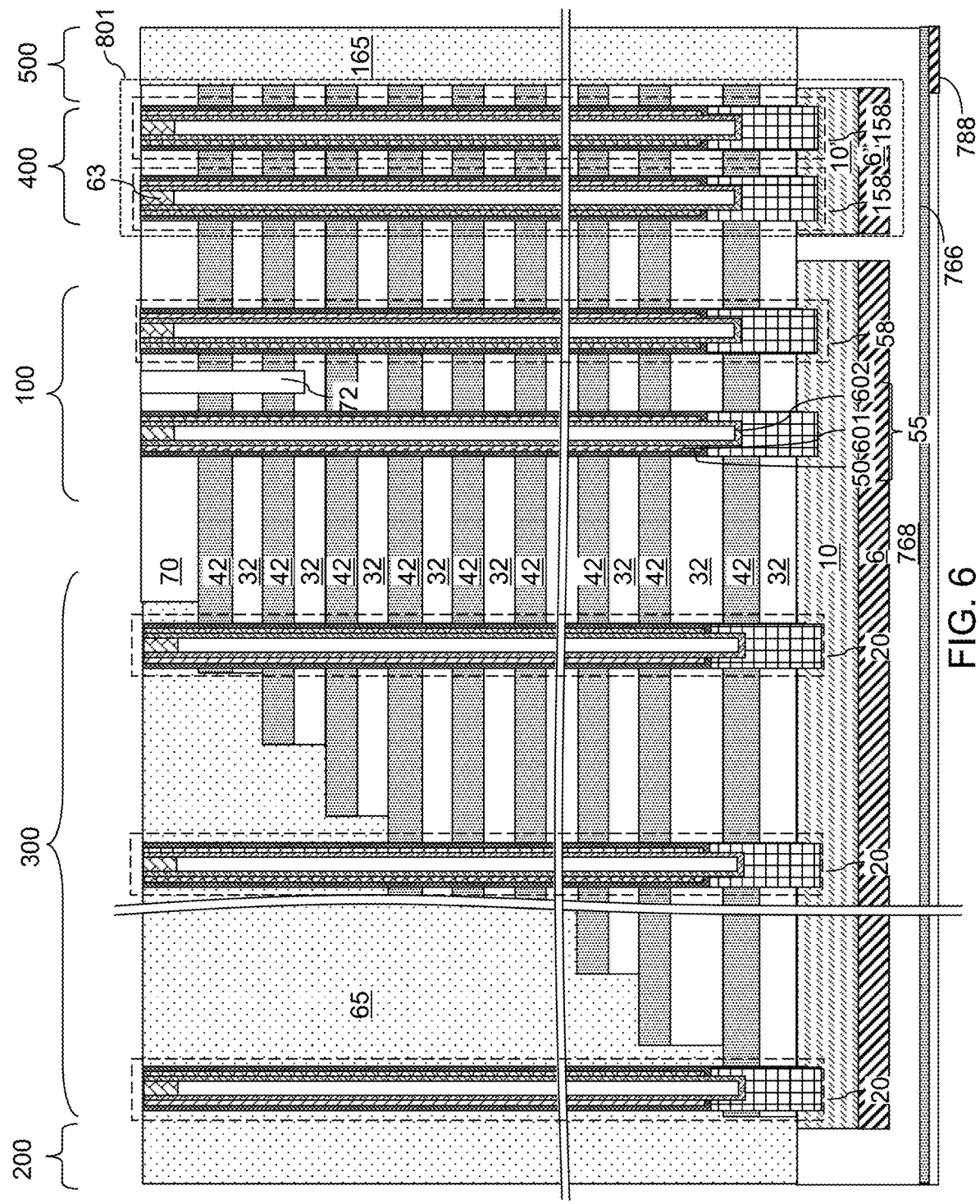
FIG. 6 is a schematic vertical cross-sectional view of the exemplary structure after formation of memory stack structures, switching transistor device pairs, and support pillar structures according to an embodiment of the present disclosure.

Referring to FIG. 6, the exemplary structure is illustrated after formation of memory opening fill structures 58, switch transistor structures 158, and support pillar structure 20 within the memory openings 49, the switch transistor openings 149, and the support openings 19, respectively. A memory opening fill structure 58 is formed within each memory opening 49 of the structure of FIGS. 4A and 4B. A switch transistor structure 158 is formed within each switch transistor opening 149 of the structure of FIGS. 4A and 4B. A support pillar structure 20 is formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Each combination of a pedestal channel portion 11 (if present), a memory stack structure 55, a dielectric core 62, and an active region 63 within a switch transistor opening 149 is herein referred to as a switch transistor structure 158. Each combination of a pedestal channel portion 11 (if present), a memory film 50, a vertical semiconductor channel 60, a dielectric core 62, and an active region 63 within each support opening 19 fills the respective support openings 19, and constitutes a support pillar structure 20.

The memory film 50 of each switch transistor structure 158 constitutes a gate dielectric of a vertical switch transistor 801 that includes two switch transistor structures 158. The vertical semiconductor channel 60 of each switch transistor structure 158 constitutes a transistor channel of the vertical switch transistor 801, which is herein referred to as a vertical switch transistor channel 60'. Thus, each of the vertical semiconductor channels 60 of the memory opening fill structures 58 and each of the vertical switch transistor channels 60' of the vertical switch transistors 801 can have the same doped semiconductor material having the same dopant concentration.

Thus, as described above, each switching transistor structure 158 includes a channel region 60', a gate dielectric 50, and an active region 63 of a vertical switch transistor 801. The channel region of each switching transistor structure 158 comprises a combination of a pedestal channel portion 11 and a vertical semiconductor channel 60'. The gate dielectric of each switching transistor structure 158 comprises a memory film 50. The active region 63 of the each switching transistor structure 158 may function as a drain region or a source region of the vertical field effect transistor 801 depending on the operational mode of the vertical field effect transistor. Each vertical field effect transistor 801 includes two switching transistor structures 158. Thus, the entire channel of each vertical field effect transistor 801 comprises two vertical semiconductor channels 60' (located in two adjacent switching transistor structures 158) electrically connected to each other by a respect transistor interconnect pad (6', 10'). Two adjacent active regions 63 of two respective adjacent switching transistor structures 158 function as the respective drain and source regions of the vertical field effect transistor 801.

Referring to FIGS. 7A-7D, a contact level dielectric layer 73 is formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) is applied over the contact level dielectric layer 73, and is lithographically patterned to form openings in areas between clusters of memory stack structures 55 and between neighboring clusters of memory stack structures 55 and the switch transistor structures 158. Optionally, additional openings can be formed through each layer of the alternating stack (32, 42) adjacent to clusters of switch transistor structures 158.

The pattern in the photoresist layer is transferred through the contact level dielectric layer 73, the alternating stack (32, 42) and/or the retro-stepped dielectric material portion 65 employing an anisotropic etch to form backside trenches 79 and backside openings 69. The backside trenches 79 vertically extend from the top surface of the contact level dielectric layer 73 at least to the top surface of the substrate 8, and laterally extend through the memory block region 100 and the contact region 300. The backside openings 69 are formed in portions of the contact region 300 that are proximal to a respective one of the switch transistor regions 400.

The continuous alternating stack of insulating layers 32 and sacrificial material layers 42 provided at the processing steps of FIG. 6 is divided into first portions of the alternating stack (32, 42) including the memory stack structures 55 and second portions of the alternating stack (32, 42) including the switch transistor structures 158. In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 are arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1.

Multiple rows of memory stack structures 55 is located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. Each patterned portion of the alternating stack (32, 42) is laterally bounded by a pair of backside trenches 79. Each two-dimensional array of memory stack structures 55 includes columns of memory stack structures 55 that extend along the second horizontal direction hd2. Each column of memory stack structures 55 extend across at least one patterned portion of the alternating stack (32, 42), and may extend across a plurality of patterned portions of the alternating stack (32, 42). Each switch transistor structure 158 is aligned to a respective column of memory stack structures 55, i.e., located within a same vertical plane which extends in the second horizontal direction hd2 and passing through geometrical centers of the memory stack structures 55 within the column of memory stack structures 55. The photoresist layer can be removed, for example, by ashing.

Figure 7A:
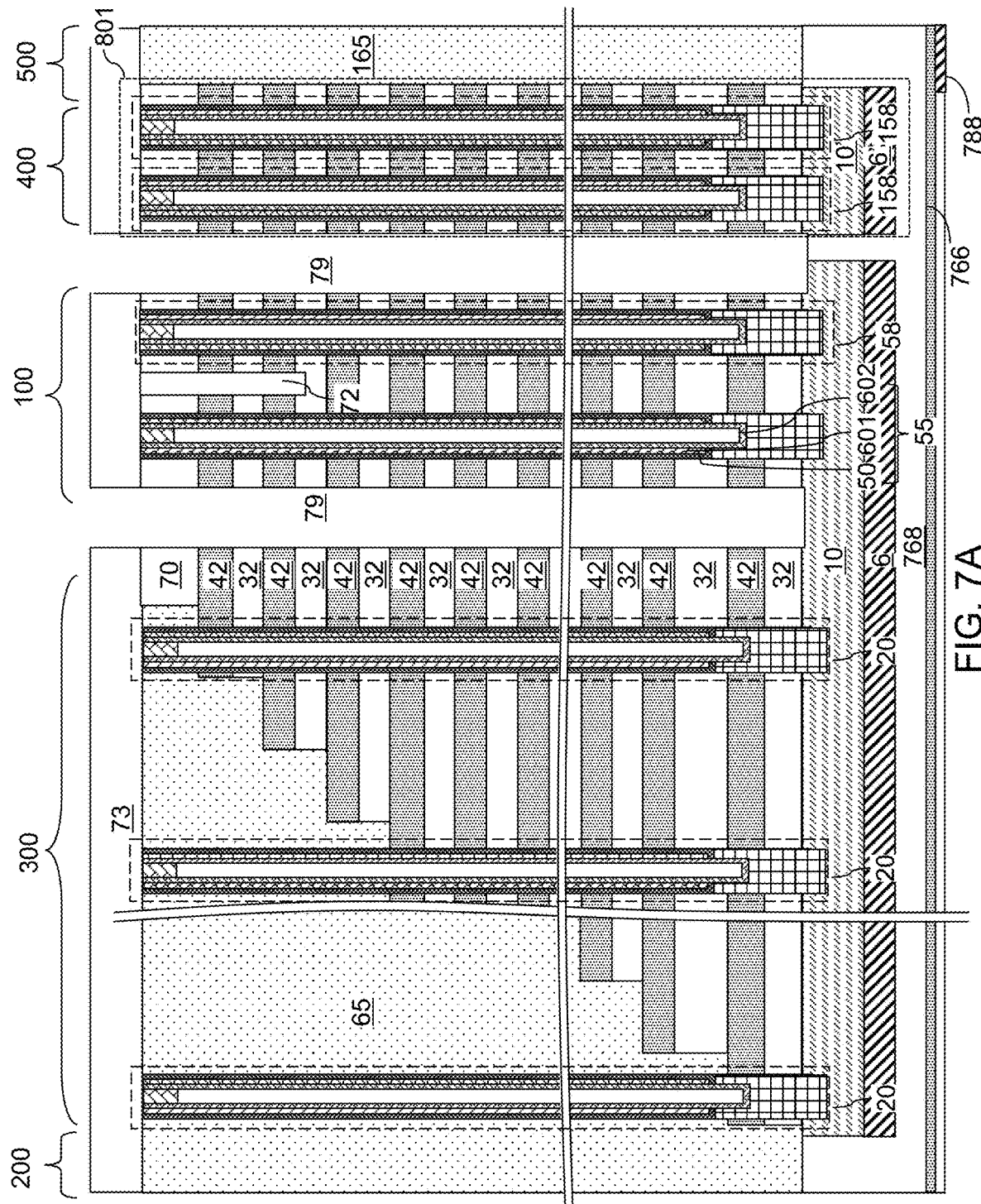
FIG. 7A is a schematic vertical cross-sectional view of the exemplary structure after formation of backside trenches according to an embodiment of the present disclosure.
Figure 7B:
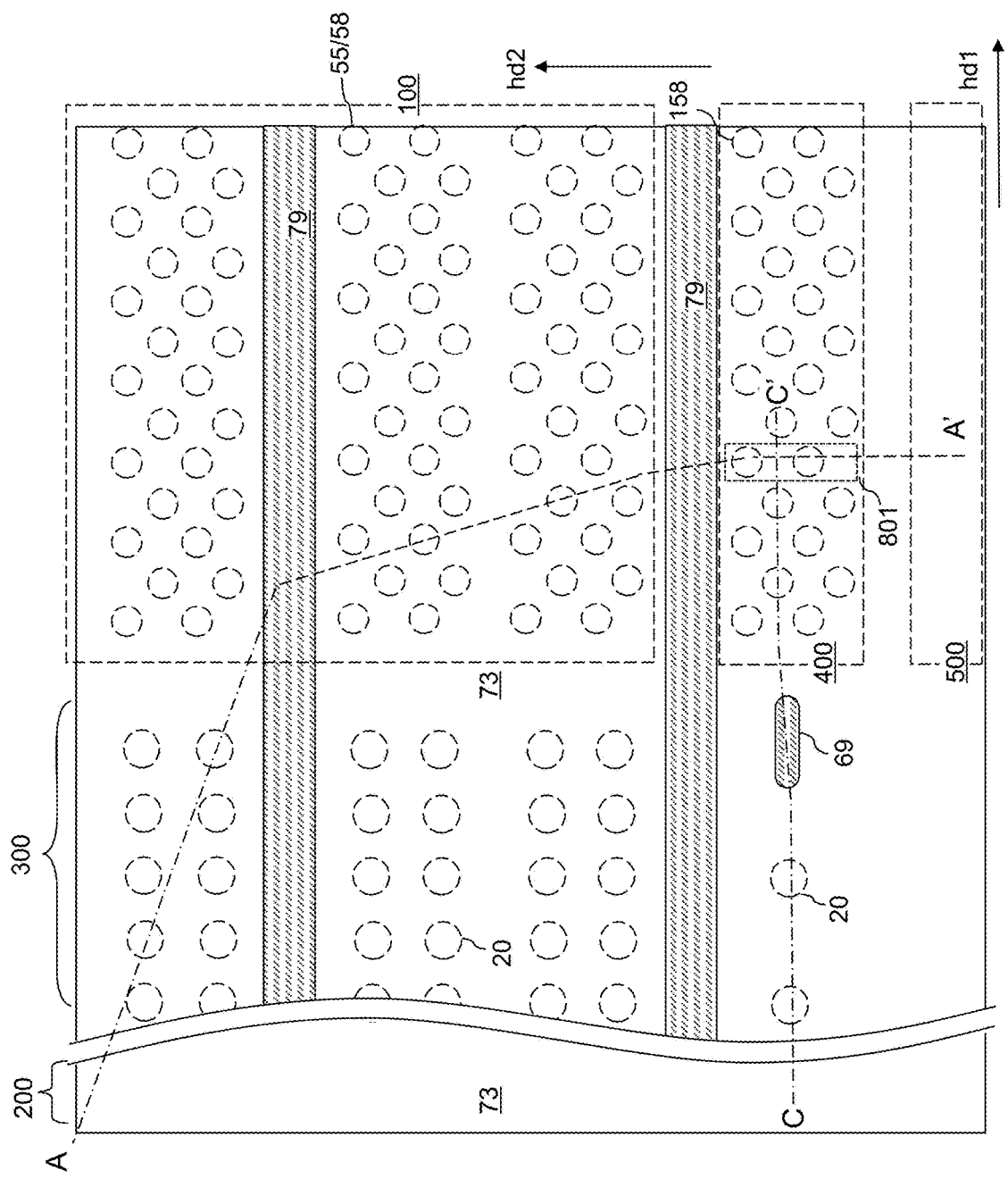
FIG. 7B is a partial see-through top-down view of the exemplary structure of FIG. 7A. The vertical plane A-A' is the plane of the schematic vertical cross-sectional view of FIG. 7A.
Figure 7C:
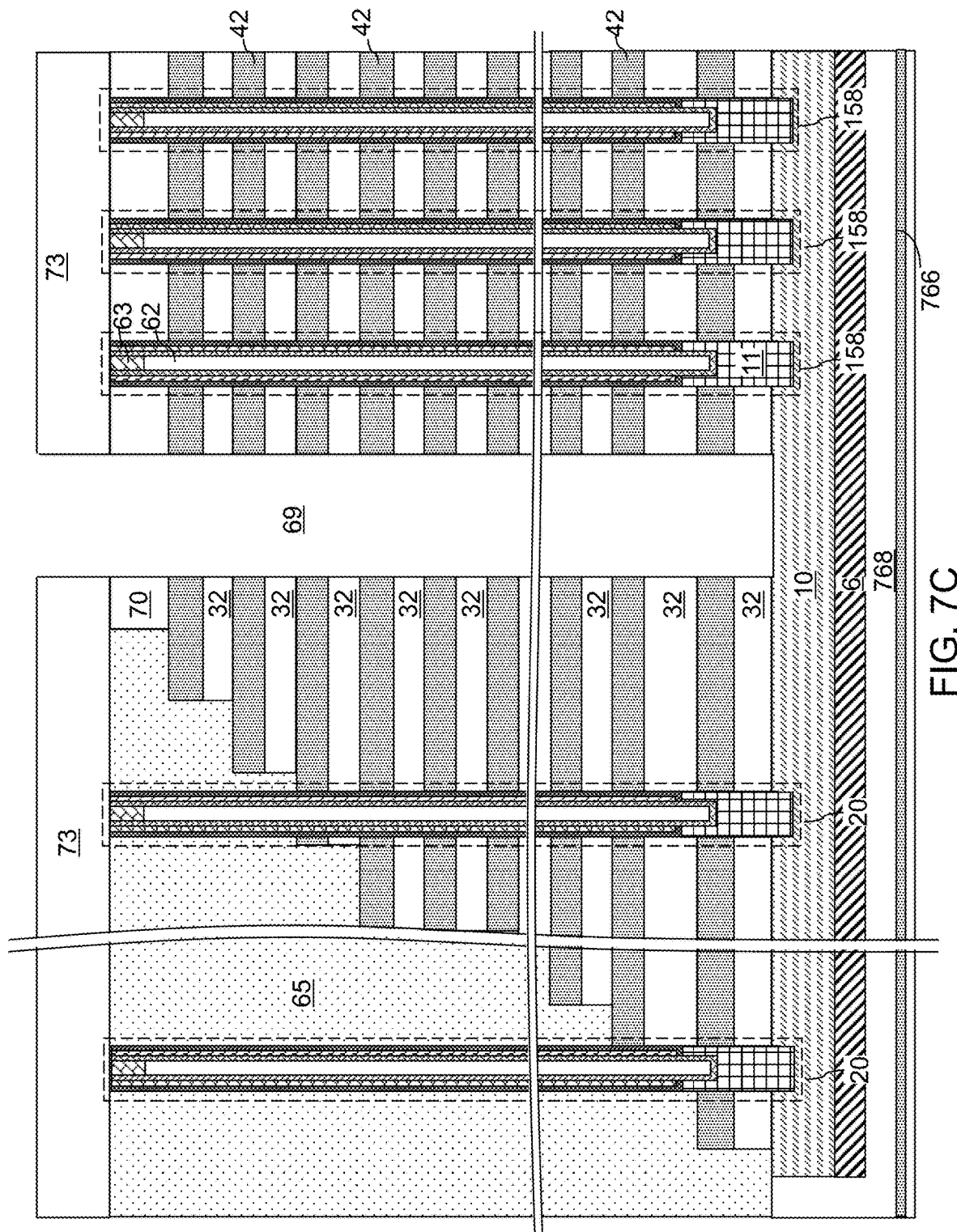
FIG. 7C is a schematic vertical cross-sectional view of the exemplary structure along the vertical plane C-C' of FIG. 7B.
Figure 7D:
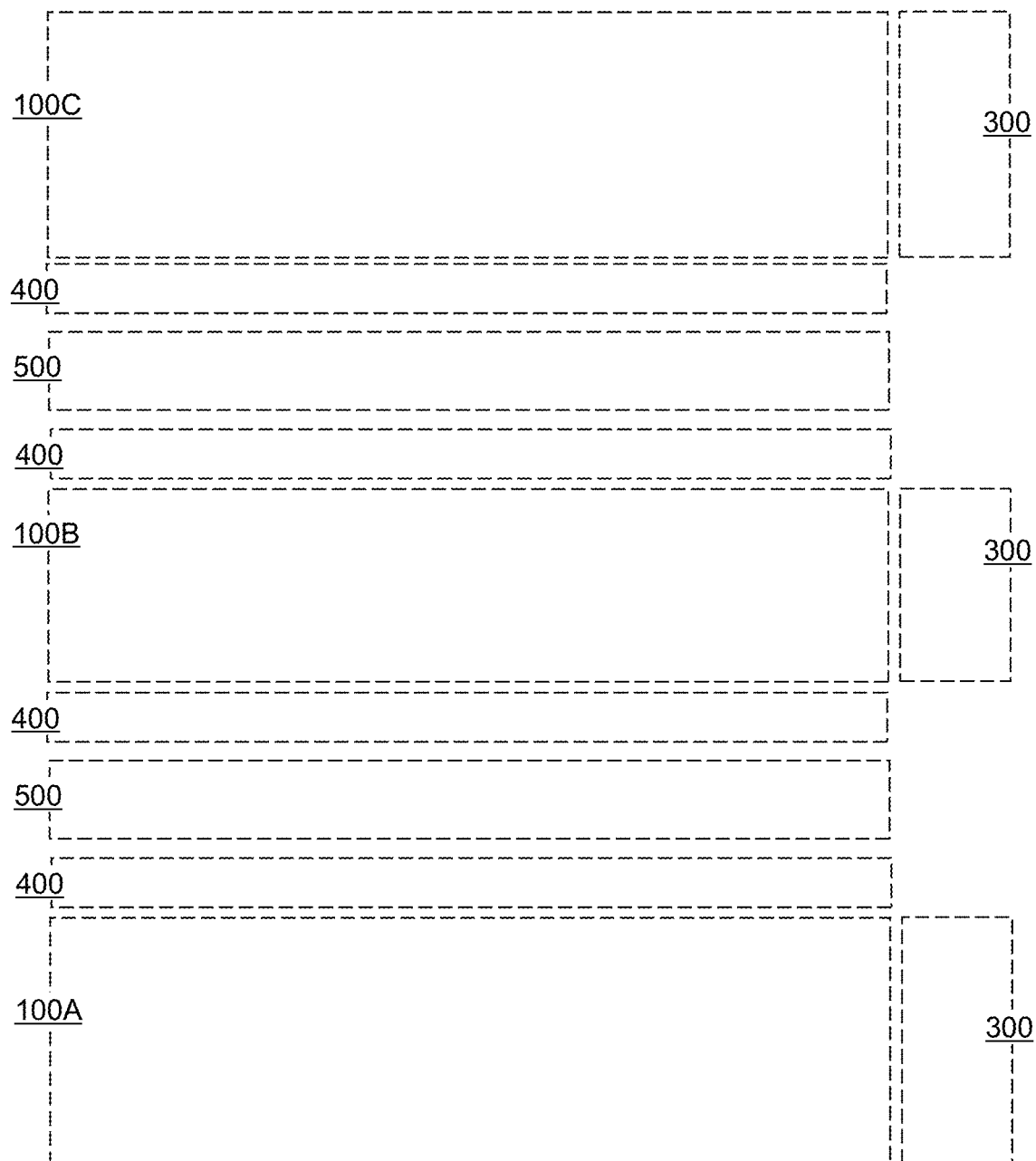
FIG. 7D is a schematic layout of a configuration of the exemplary structure of FIGS. 7A-7C according to an embodiment of the present disclosure.

As shown in FIGS. 7B and 7D, the exemplary structure includes first memory stack structures 55 extending through a first alternating stack of first insulating layers 32 and first sacrificial material layers 42 in a first memory block region 100A (which is a first memory block region 100), second memory stack structures 55 extending through a second alternating stack of second insulating layers 32 and second sacrificial material layers 42 in a second memory block region 100B (which is a second memory block region 100). Each of the first and second memory stack structures 55 comprises a respective vertical semiconductor channel 60 and memory film 50. Sense amplifier 710B for the first and second memory stack structures 55 is located on a top surface of the substrate 8 (e.g., in the substrate semiconductor layer 9) under the first and second memory block regions (100A, 100B) and/or under the sense amplifier connection regions 500.

Figure 8:
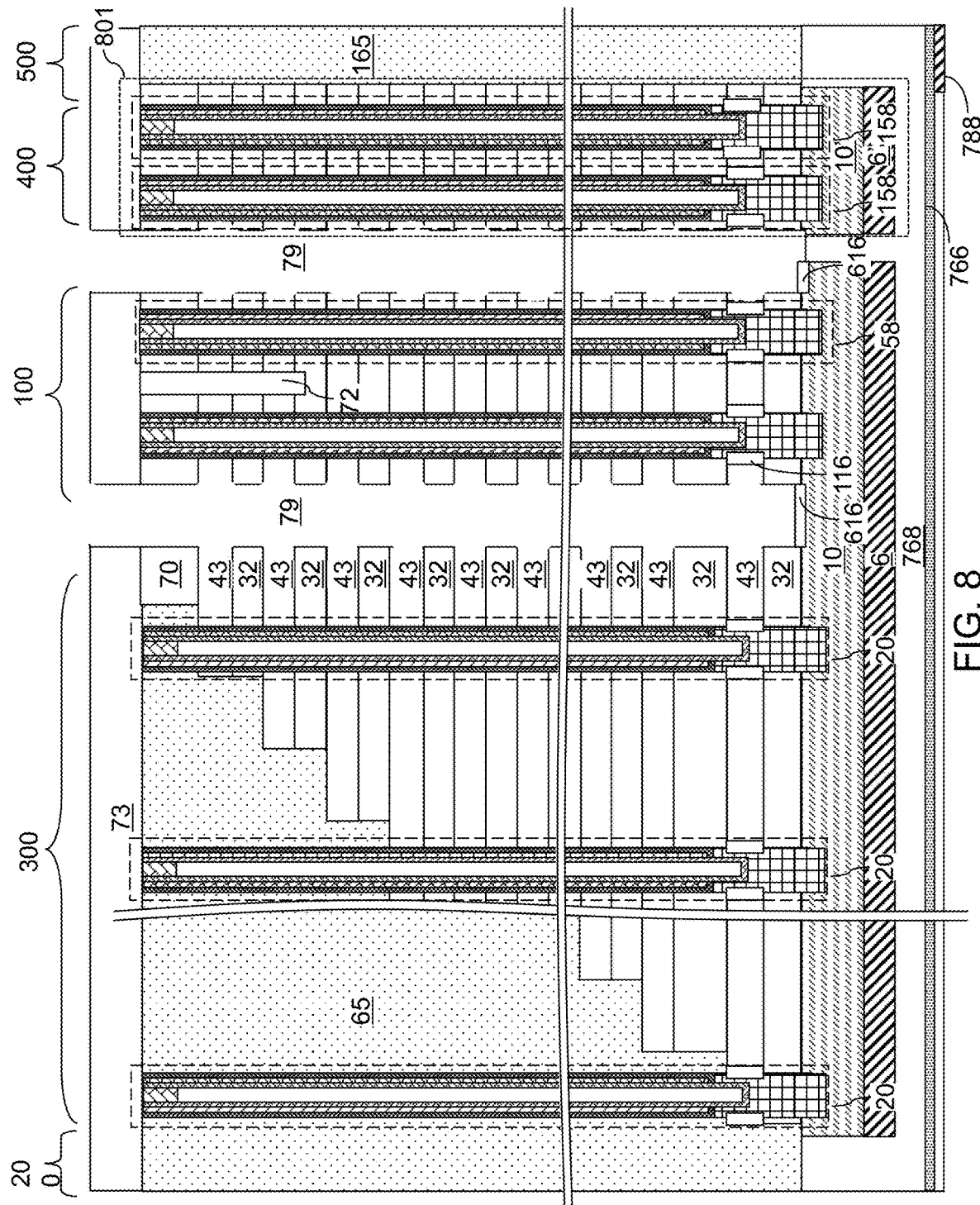
FIG. 8 is a schematic vertical cross-sectional view of the exemplary structure after formation of backside recesses according to an embodiment of the present disclosure.
Figure 10A:
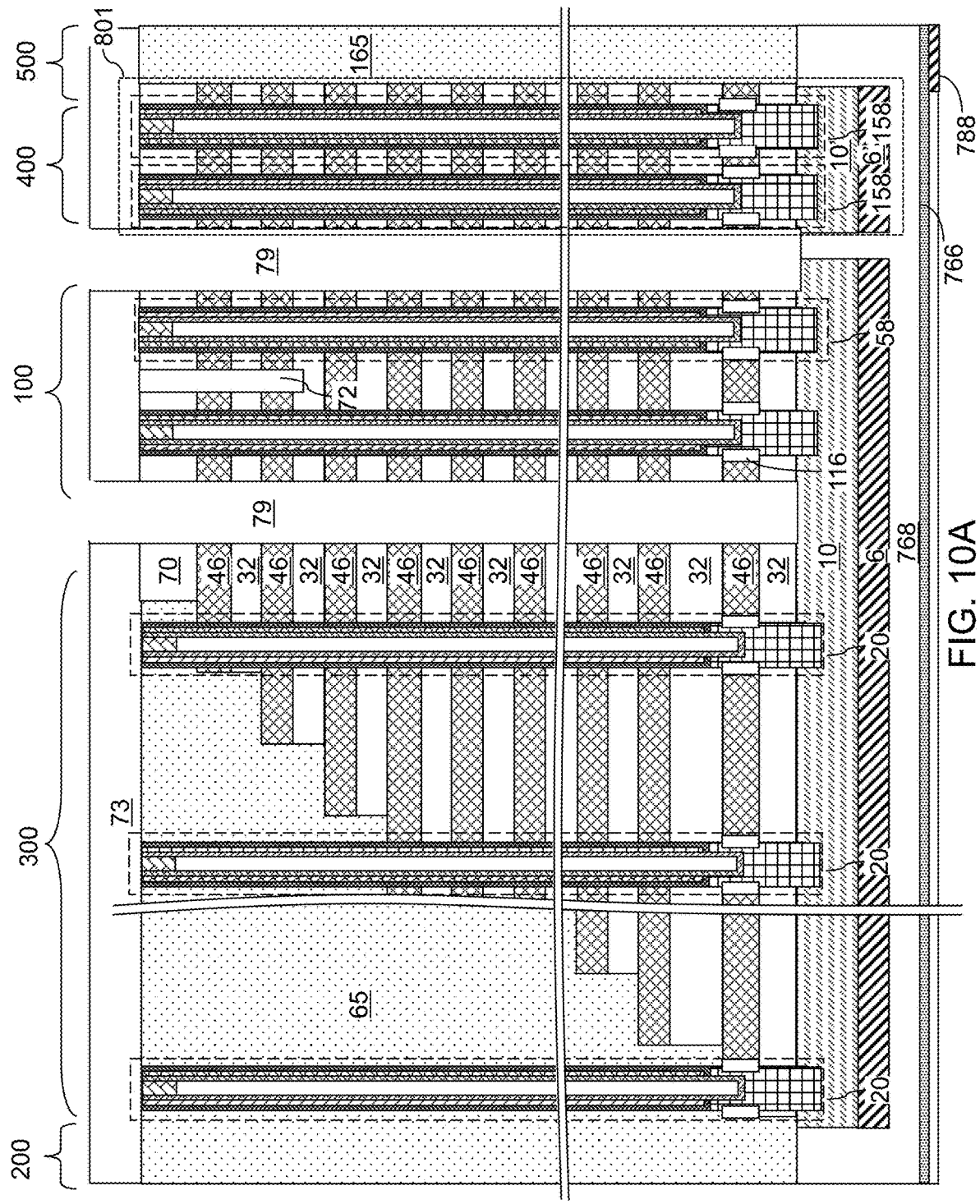
FIG. 10A is a schematic vertical cross-sectional view of the exemplary structure after removal of a deposited conductive material from within the backside trench according to an embodiment of the present disclosure.
Figure 10B:
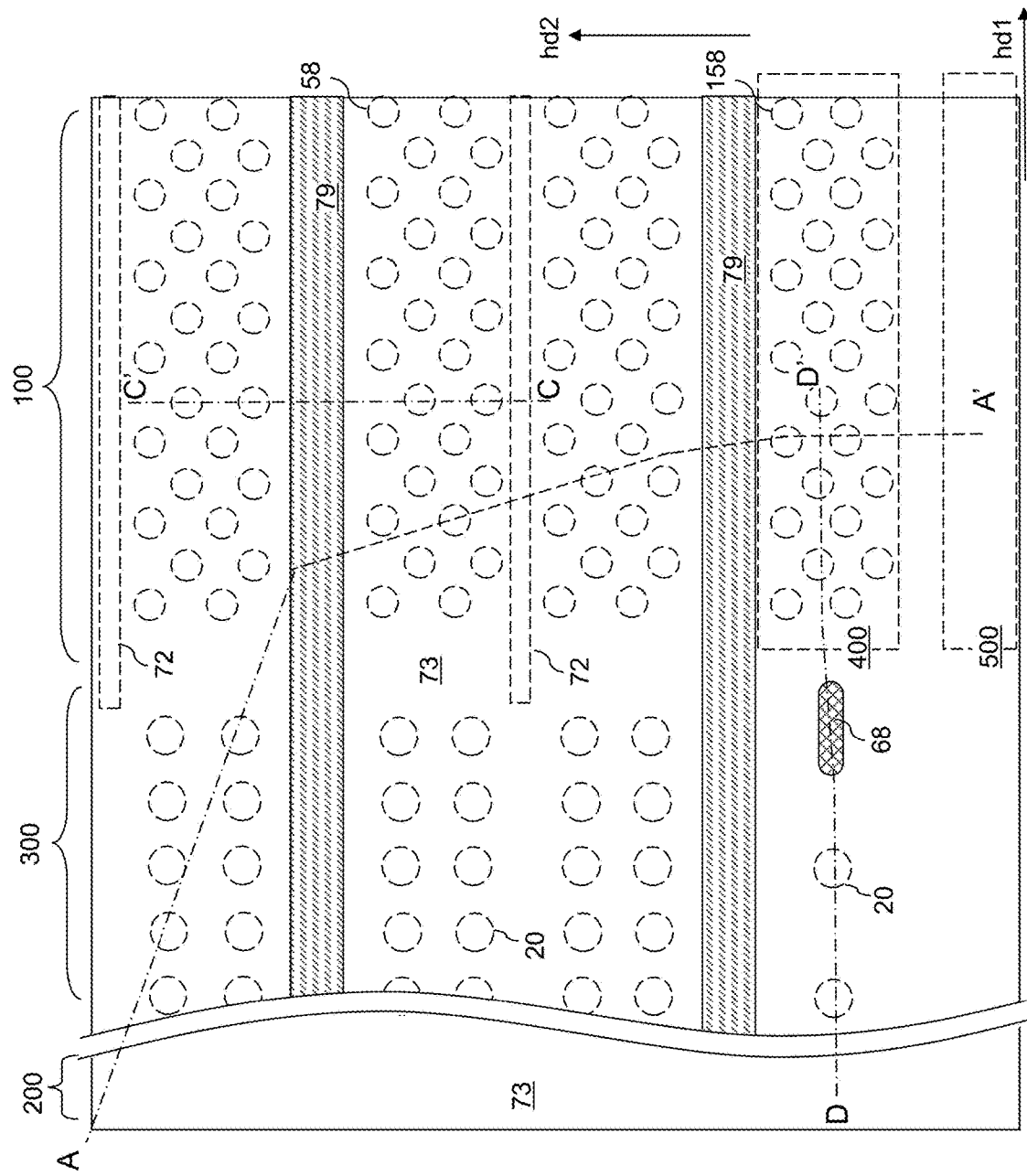
FIG. 10B is a partial see-through top-down view of the exemplary structure of FIG. 10A. The vertical plane A-A' is the plane of the schematic vertical cross-sectional view of FIG. 10A.
Figure 10C:
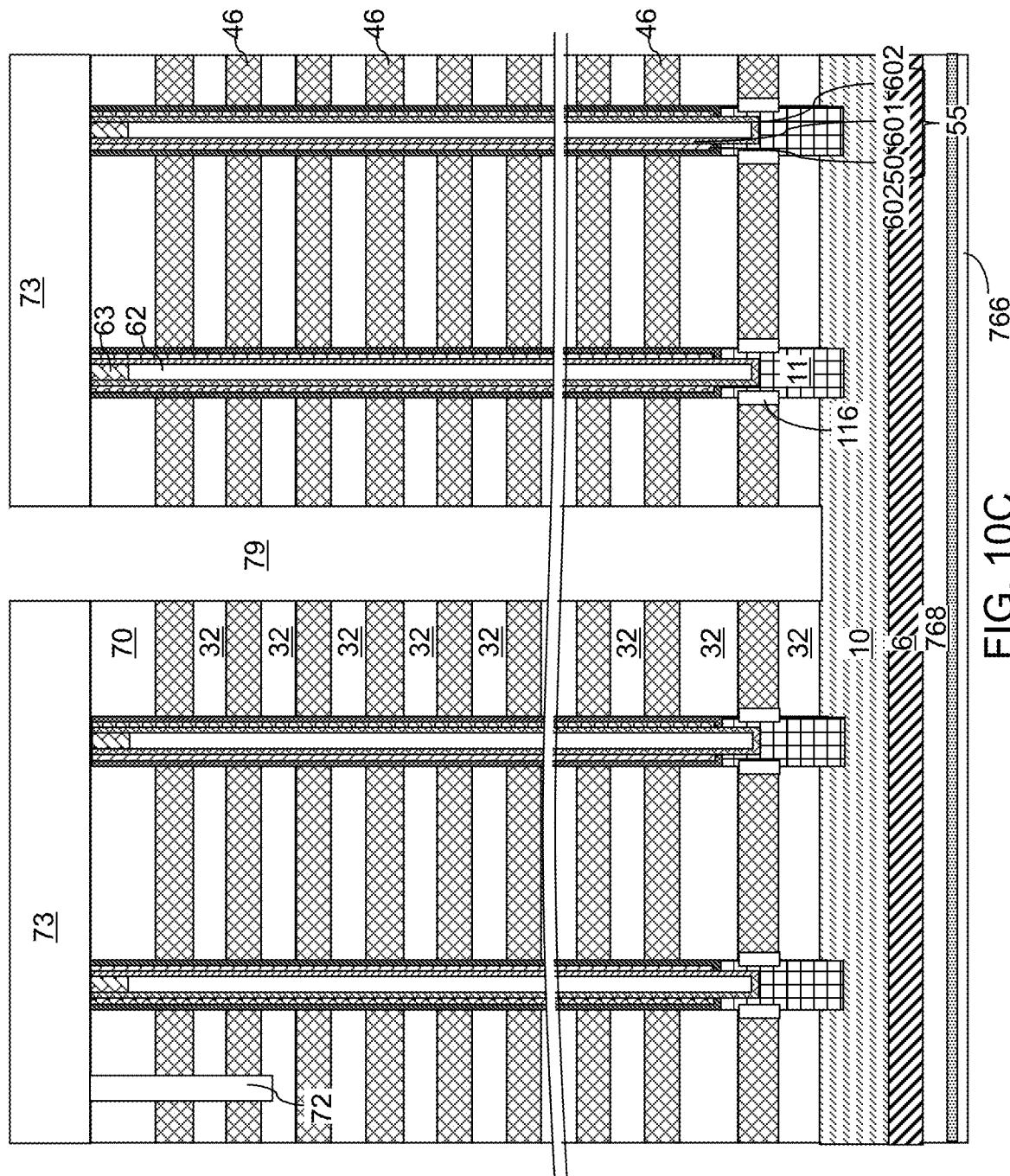
FIG. 10C is a schematic vertical cross-sectional view of the exemplary structure along the vertical plane C-C' of FIG. 10B.

Referring to FIGS. 8 and 9A, an etchant that selectively etches the second material of the sacrificial material layers 42 with respect to the first material of the insulating layers 32 is introduced into the backside trenches 79 and the backside openings 69, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 is selective to the first material of the insulating layers 32, the material of the retro-stepped dielectric material portion 65, the semiconductor material of the semiconductor source-level layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory block region 100 comprises an array of monolithic three-dimensional NAND strings having a plurality of device levels disposed above the substrate 8. In this case, each backside recess 43 can define a space for receiving a respective word line of the array of monolithic three-dimensional NAND strings.

Each of the plurality of backside recesses 43 can extend substantially parallel to the top surface of the substrate 8. A backside recess 43 is vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor source-level layer 10 is converted into dielectric material portions by thermal conversion and/or plasma conversion of the semiconductor materials into dielectric materials. For example, thermal conversion and/or plasma conversion is employed to convert a surface portion of each pedestal channel portion 11 into a tubular dielectric spacer 116, and to convert each physically exposed surface portion of the semiconductor source-level layer 10 into a planar dielectric portion 616. In one embodiment, each tubular dielectric spacer 116 is topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor source-level layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A is deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Referring to FIG. 9D, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 are formed in the plurality of backside recesses 43, and a continuous metallic material layer 46L are formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous metallic material layer 46L includes a continuous portion of the metallic barrier layer 46A and a continuous portion of the metallic fill material layer 46B that are located in the backside trenches 79 or above the contact level dielectric layer 73. Each backside opening 69 can have a minimum lateral dimension that is less than twice the thickness of the deposited conductive material, and thus, is completely filled with the at least one conductive material.

Each sacrificial material layer 42 is replaced with an electrically conductive layer 46. A backside cavity 79' is present in the portion of each backside trench 79 that is not filled with the backside blocking dielectric layer 44 and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Referring to FIGS. 10A-10D, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. The planar dielectric portions 616 is removed during removal of the continuous electrically conductive material layer 46L. A backside cavity 79' is present within each backside trench 79. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46. The deposited metallic material fills each of the backside openings 69, and forms conductive via structures 68, which are also referred to switch transistor gate interconnection via structure. The conductive via structures 68 short all vertically spaced electrically conductive layers 46 (e.g., gate electrodes 46G shown in FIG. 10D) of the vertical switch transistors (i.e., of the switch transistor structures 158) in region 400, but do not short the vertically spaced electrically conductive layers 46 (e.g., word lines/control gate electrodes and select gate electrodes) in the memory block regions 100.

Thus, remaining portions of the continuous sacrificial material layers 42 after formation of the backside trenches 79 and the backside openings 69 are replaced with electrically conductive layers 46 including the at least one electrically conductive material. First alternating stacks of insulating layers 32 and electrically conductive layers 46 are formed within the memory block regions 100. Second alternating stacks of insulating layers 32 and electrically conductive layers 46G are formed within the switch transistor regions 400.

Each electrically conductive layer 46 in the memory block regions 100 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 in the memory block regions 100 are the control gate electrodes for the vertical memory devices including the memory stack structures 55. In other words, each electrically conductive layer 46 in the memory block regions 100 can be a word line that functions as a common control gate electrode for the plurality of vertical memory devices.

Electrically conductive layers 46 in each switch transistor regions 400 are electrically connected to each other by a respective switch transistor gate contact via structure 68. The electrically conductive layers 46 that are electrically connected to a switch transistor gate contact via structure 68 constitute a switch transistor gate electrode 46G, which is a common gate electrode for multiple pairs of vertical field effect transistors. Each pair of vertical field effect transistors includes a series connection of two vertical field effect transistors. The multiple pairs of vertical field effect transistors in the same switch transistor regions 400 share the same switch transistor gate electrode 46G as a common gate electrode.

Generally, first alternating stacks (32, 46) of first insulating layers 32 and first electrically conductive layers 46 are formed over the substrate 8 in the memory block regions 100. Memory stack structures 55 extend through the first alternating stacks (32, 46), and each of the memory stack structures comprises a memory film 50 and a vertical semiconductor channel 60. Second alternating stacks (32, 46G) of second insulating layers 32 and second electrically conductive layers 46G are formed over the substrate 8 in the switch transistor regions 400. Each second alternating stack (32, 46G) is laterally spaced from the first alternating stacks (32, 46). The vertical switch transistors (e.g., structures 158) including a respective vertical switch transistor channel 60' extend through each second alternating stack (32, 46G). The second electrically conductive layers 46G are electrically connected to each other by the contact via structure 68 that vertically extends through and contacts an edge of each of the second electrically conductive layers 46G. The combination of the second electrically conductive layers 46G which electrically contact the contact via structure 68 constitutes a common gate electrode that concurrently switches the vertical switch transistors. In one embodiment, the conductive via structure 68 and the second electrically conductive layers 46G constitute a continuous unitary structure, i.e., a single continuous structure without microstructural interfaces therein.

Figure 11A:
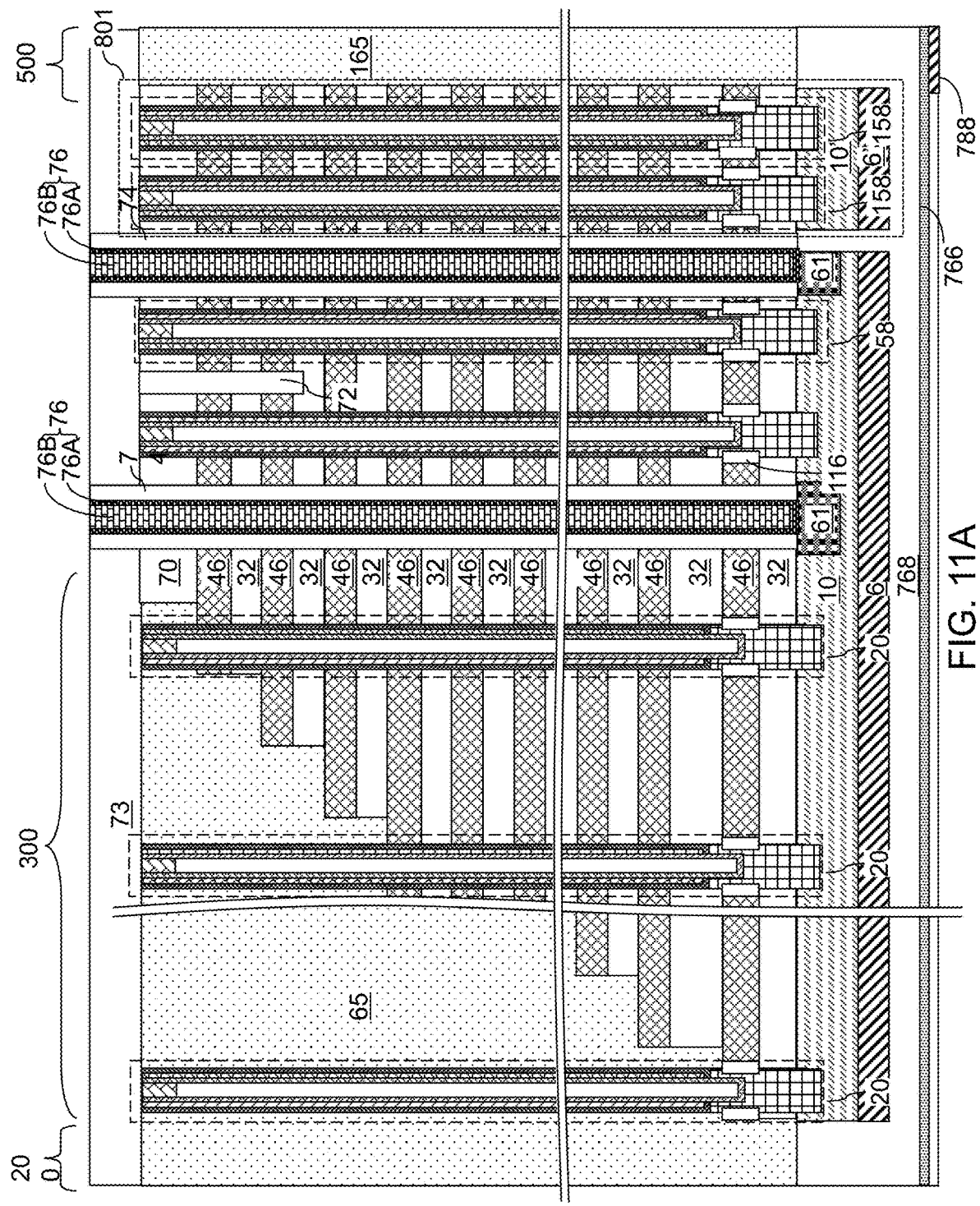
FIG. 11A is a schematic vertical cross-sectional view of the exemplary structure after formation of insulating spacers and backside contact structures according to an embodiment of the present disclosure.
Figure 11B:
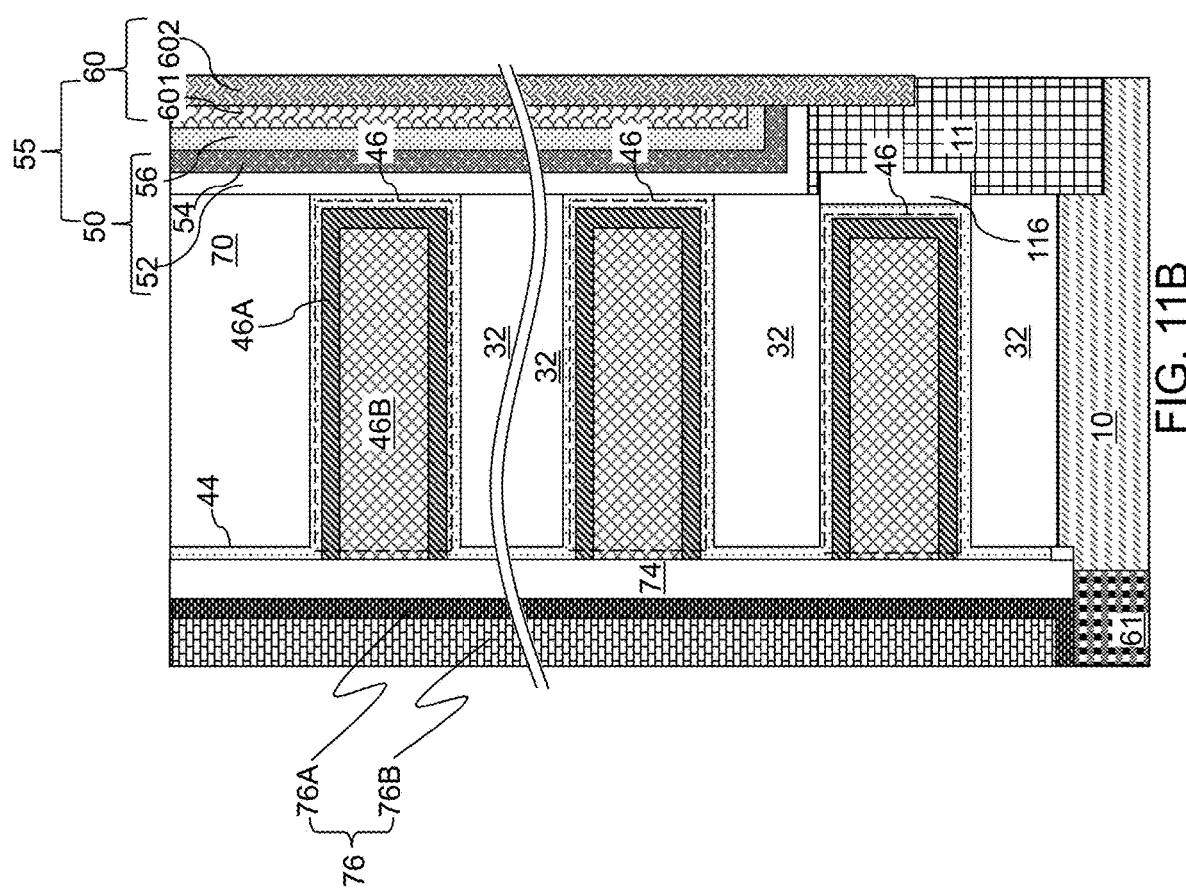
FIG. 11B is a magnified view of a region of the exemplary structure of FIG. 11A.

Referring to FIGS. 11A and 11B, an insulating material layer is formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

An anisotropic etch is performed to remove horizontal portions of the insulating material layer from above the contact level dielectric layer 73 and at the bottom of each backside trench 79. Each remaining portion of the insulating material layer constitutes an insulating spacer 74, which is a dielectric wall structure that laterally extends along the first horizontal direction hd1. A backside cavity 79' is present within a volume surrounded by each insulating spacer 74. A top surface of the semiconductor source-level layer 10 is physically exposed at the bottom of each backside trench 79.

Another active region, such as a source region 61 is formed at a surface portion of the semiconductor source-level layer 10 under each backside cavity 79' by implantation of electrical dopants into physically exposed surface portions of the semiconductor source-level layer 10. Each source region 61 is formed in a surface portion of the substrate 8 that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor source-level layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate 8. Semiconductor channels {60 or (59, 11, 60)} extend between each source region 61 and a respective set of active regions 63 that function as drain regions in the memory block region 100.

A backside contact via structure 76 is formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material is planarized employing the contact level dielectric layer 73 overlying the alternating stack (32, 46) as a stopping layer. If chemical mechanical planarization (CMP) process is employed, the contact level dielectric layer 73 is employed as a CMP stopping layer. Each remaining continuous portion of the at least one conductive material in the backside trenches 79 constitutes a backside contact via structure 76. The backside contact via structure 76 extends through the alternating stack (32, 46), and contacts a top surface of the source region 61.

Figure 12A:
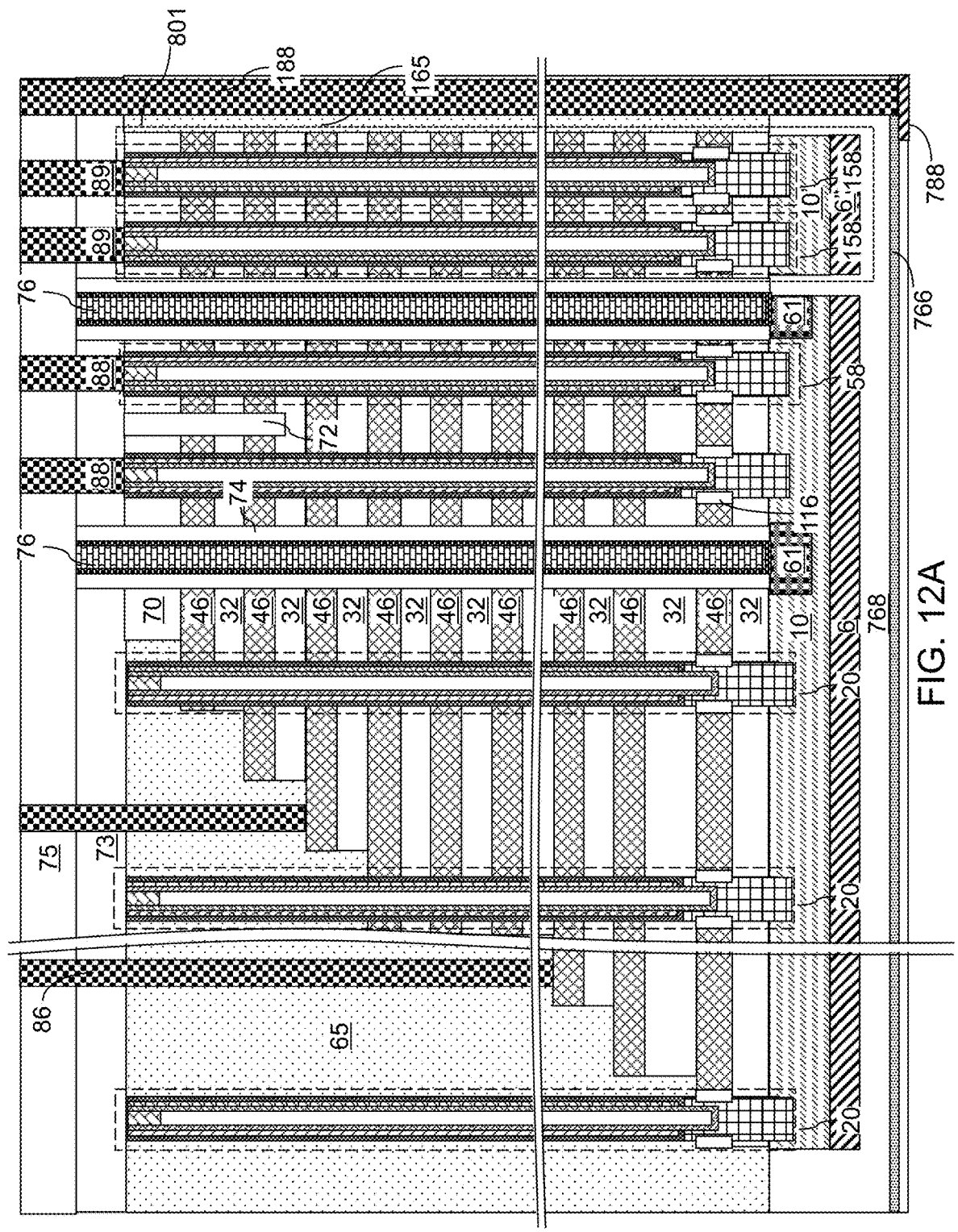
FIG. 12A is a schematic vertical cross-sectional view of the exemplary structure after formation of additional contact via structures according to an embodiment of the present disclosure.
Figure 12B:
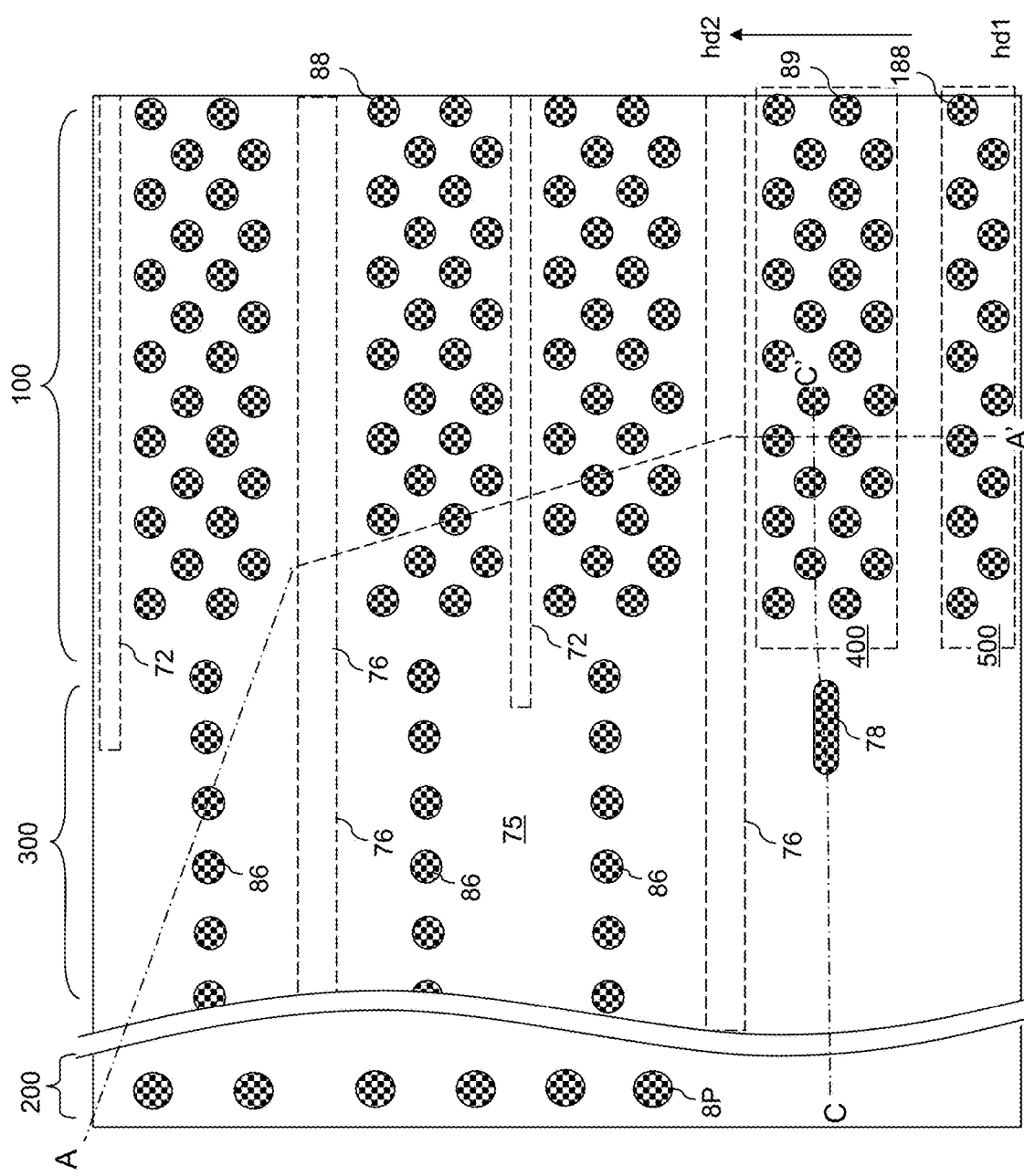
FIG. 12B is a top-down view of the exemplary structure of FIG. 12A. The vertical plane A-A' is the plane of the schematic vertical cross-sectional view of FIG. 12A.
Figure 12C:
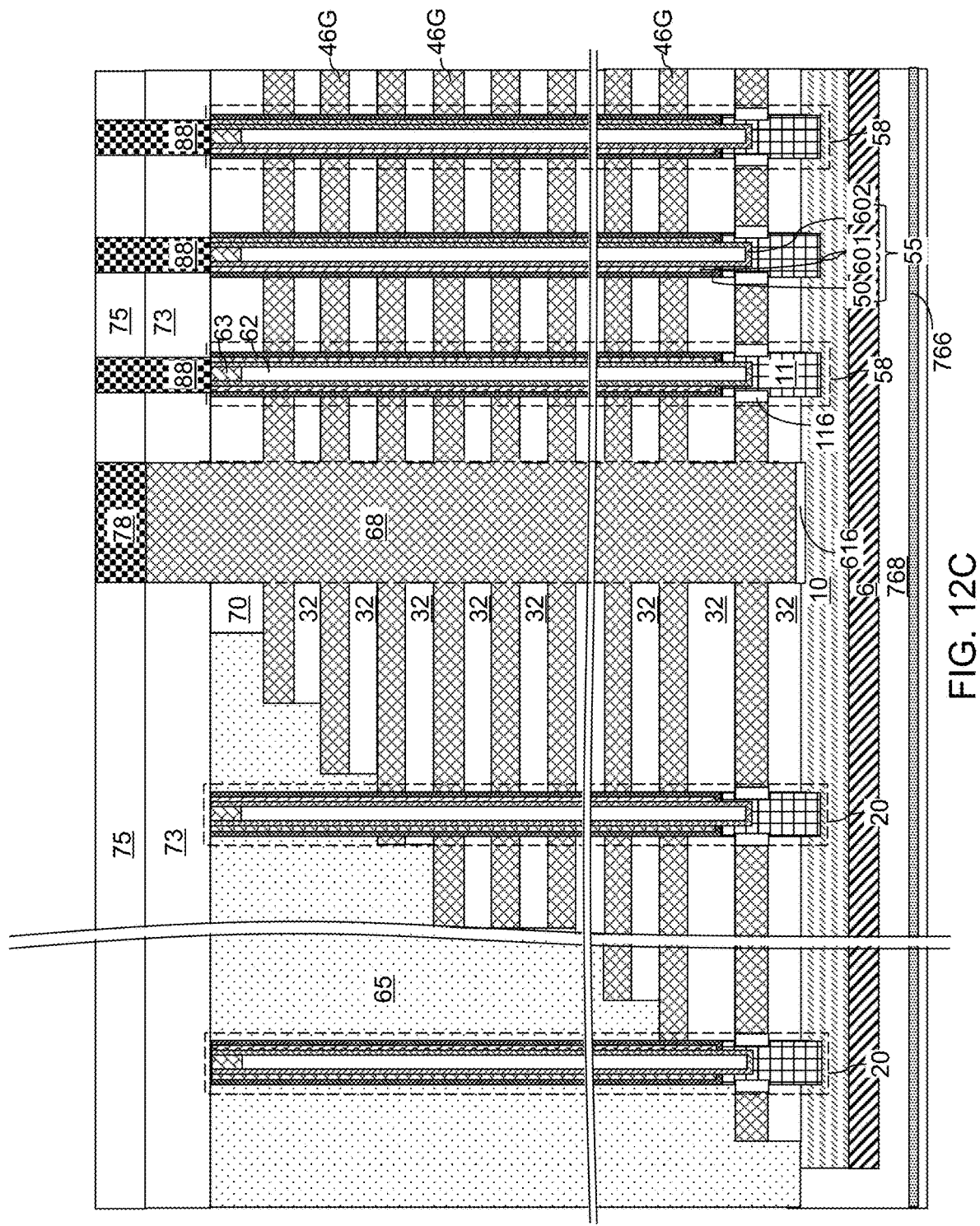
FIG. 12C is a schematic vertical cross-sectional view of the exemplary structure along the vertical plane C-C' of FIG. 12B.

Referring to FIGS. 12A-12C, a via level dielectric layer 75 is formed over the contact level dielectric layer 73. Additional contact via structures (78, 88, 89, 188, 86, 8P) are formed through the via level dielectric layer 75, contact level dielectric layer 73, and optionally through the retro-stepped dielectric material portion 65. For example, drain contact via structures 88 are formed through the via level dielectric layer 75 and the contact level dielectric layer 73 on each active region 63. A switch transistor contact via structure 89 (e.g., source or drain electrode of the transistor) are formed through the via level dielectric layer 75 and the contact level dielectric layer 88 on the active region (e.g., source or drain region) 63 of each switch transistor structure 158. At least one through-memory-level contact via structure 188 are formed through each isolation pillar structure 165. Word line contact via structures 86 are formed on the electrically conductive layers 46 in the memory block regions 100 through the contact level dielectric layer 73, and through the retro-stepped dielectric material portion 65. Switch transistor gate contact via structure 78 (e.g., gate contact) is formed through the contact level dielectric layer 73 on the top surfaces of the contact via structures 68 (i.e., the switch transistor gate interconnection via structures). Peripheral device contact via structures 8P are formed through the retro-stepped dielectric material portion 65 directly on respective nodes of the peripheral devices.

Each first alternating stack of insulating layers 32 and electrically conductive layers 46 in the memory block regions 100 comprises a set of stepped surfaces that continuous extends from a bottommost one of the first electrically conductive layers 32 to a topmost one of the first electrically conductive layers 46. The word line contact via structures contact 86 contact a respective one of the first electrically conductive layers 46 through a respective horizontal surface within the set of stepped surfaces.

Figure 13A:
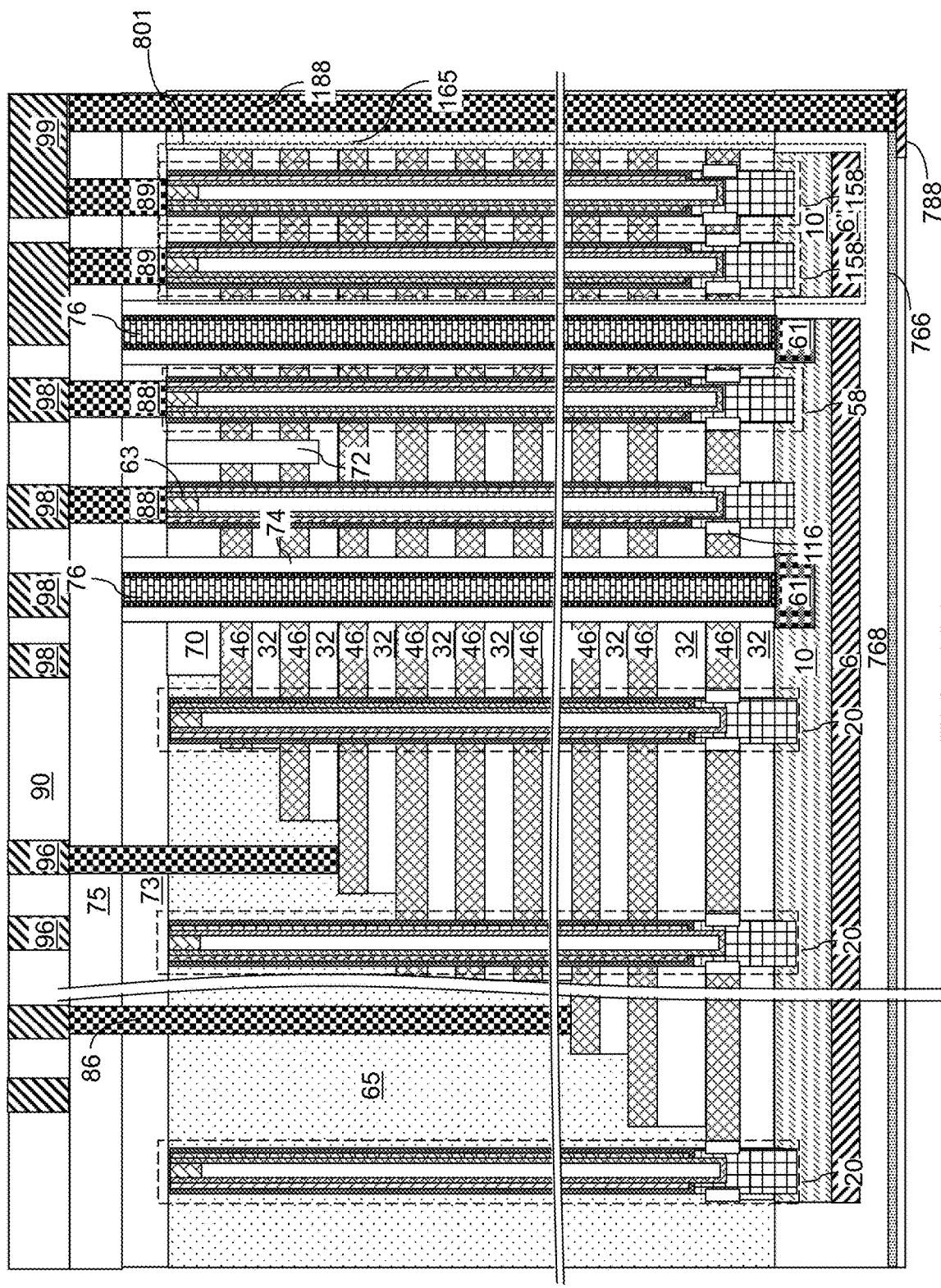
FIG. 13A is a schematic vertical cross-sectional view of the exemplary structure after formation of metal interconnect lines according to an embodiment of the present disclosure.
Figure 13C:
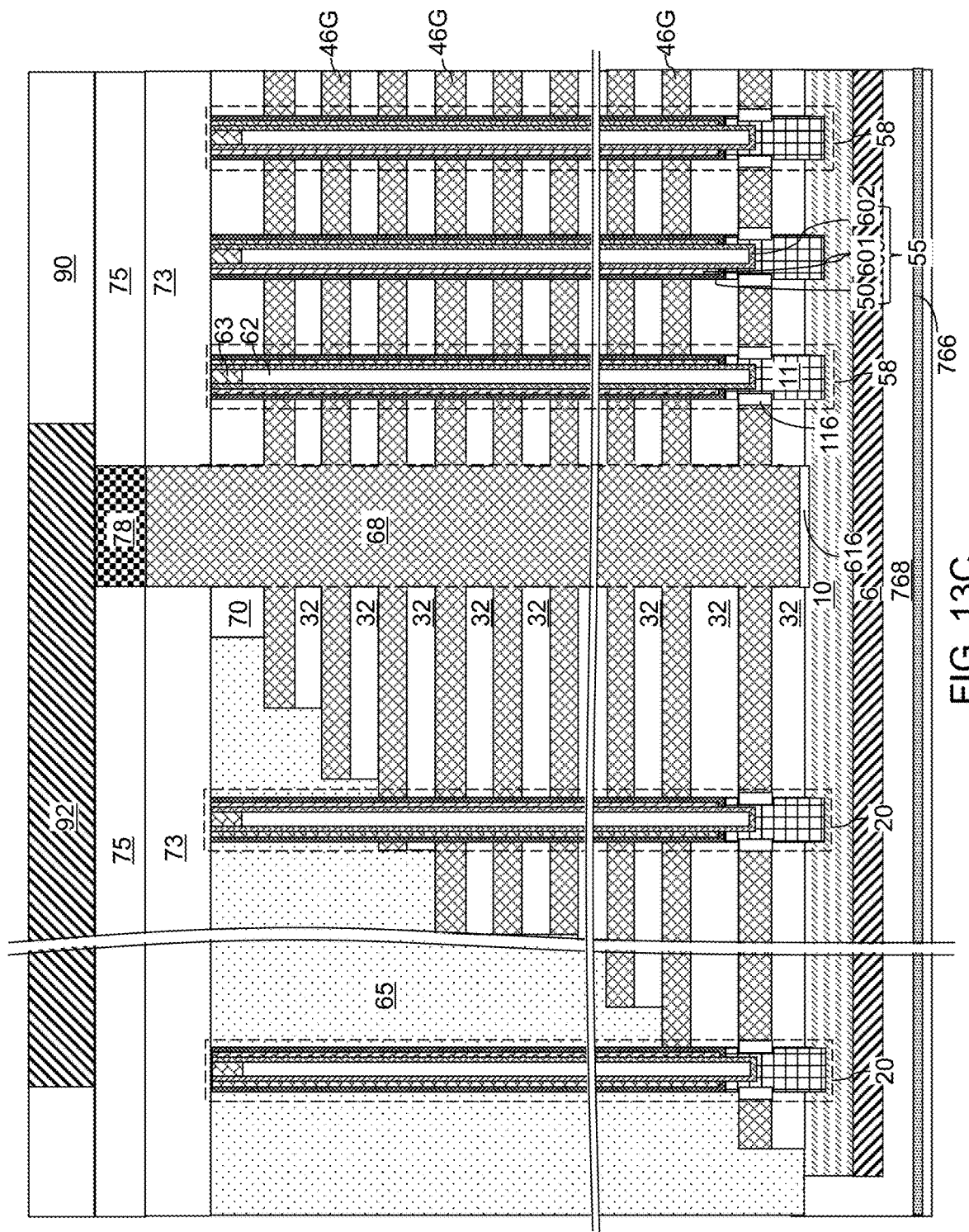
FIG. 13C is a schematic vertical cross-sectional view of the exemplary structure along the vertical plane C-C' of FIG. 13B.

Referring to FIGS. 13A-13C, a line level dielectric layer 90 is deposited over the via level dielectric layer 75. Various metal line structures (98, 99, 96, 94, 92, 93) are formed in the line level dielectric layer 90. The various metal line structure (98, 99, 96, 94, 92, 93) include bit lines 98 that are electrically connected to a respective plurality of the drain contact via structures 88 and one respective switch transistor contact via structure 89 of one respective vertical switch transistor 801, sense amplifier connection lines 99 that connect another switch transistor contact via structure 89 of the respective vertical switch transistor 801 and a respective through-memory-level contact via structure 188, a word-line-connection metal interconnect lines 98 that are electrically connected to a respective one of the word line contact via structures 86, and peripheral metal interconnect lines 94 that are electrically connected to a respective one of the peripheral device contact via structures 8P. Each switch transistor gate contact via structure 78 can be contacted by a gate electrode contact metal line 92. Source connection lines 93 can provide electrical connection to a respective source region 61 through one of the backside contact via structures 76.

The bit lines 98 are electrically connected to upper ends of a respective subset of the vertical semiconductor channels 60 in the memory stack structures 55 in the memory block region(s) 100 and a respective subset of the vertical switch transistor channels 60' of a respective vertical switch transistor 801. Each bit line 98 is electrically connected to at least one vertical switch transistor channel 60' vertical switch transistor 801, which may be a single vertical switch transistor channel 60' of a single vertical switch transistor 801, or a plurality of vertical switch transistor channels 60' of plural vertical switch transistors 801. In some embodiments, each of the bit lines 98 is electrically connected to two vertical switch transistor channels 60' of the same vertical switch transistor 801. The two vertical switch transistor channels 60' are electrically connected to each other by the pad (6', 10') and are controlled by a common gate electrode (46G, 68), which includes a set of electrically conductive layers 46G located between each neighboring pair of insulating layers 32 in a respective switch transistor region 400 and physically and electrically connected to each other by the contact via structure 68.

In one embodiment, the memory stack structures 55 are arranged in rows that extend along the first horizontal direction hd1 (e.g., word line direction) and the bit lines 98 laterally extend along the second horizontal direction hd2 (e.g., bit line direction). In one embodiment, the first alternating stacks and the second alternating stacks can be laterally spaced from each other by dielectric wall structures such as the insulating spacers 74. The dielectric wall structures can vertically extend through levels of each layer within the first alternating stacks and the second alternating stacks, and can laterally extend along the first horizontal direction hd1.

Figure 14:
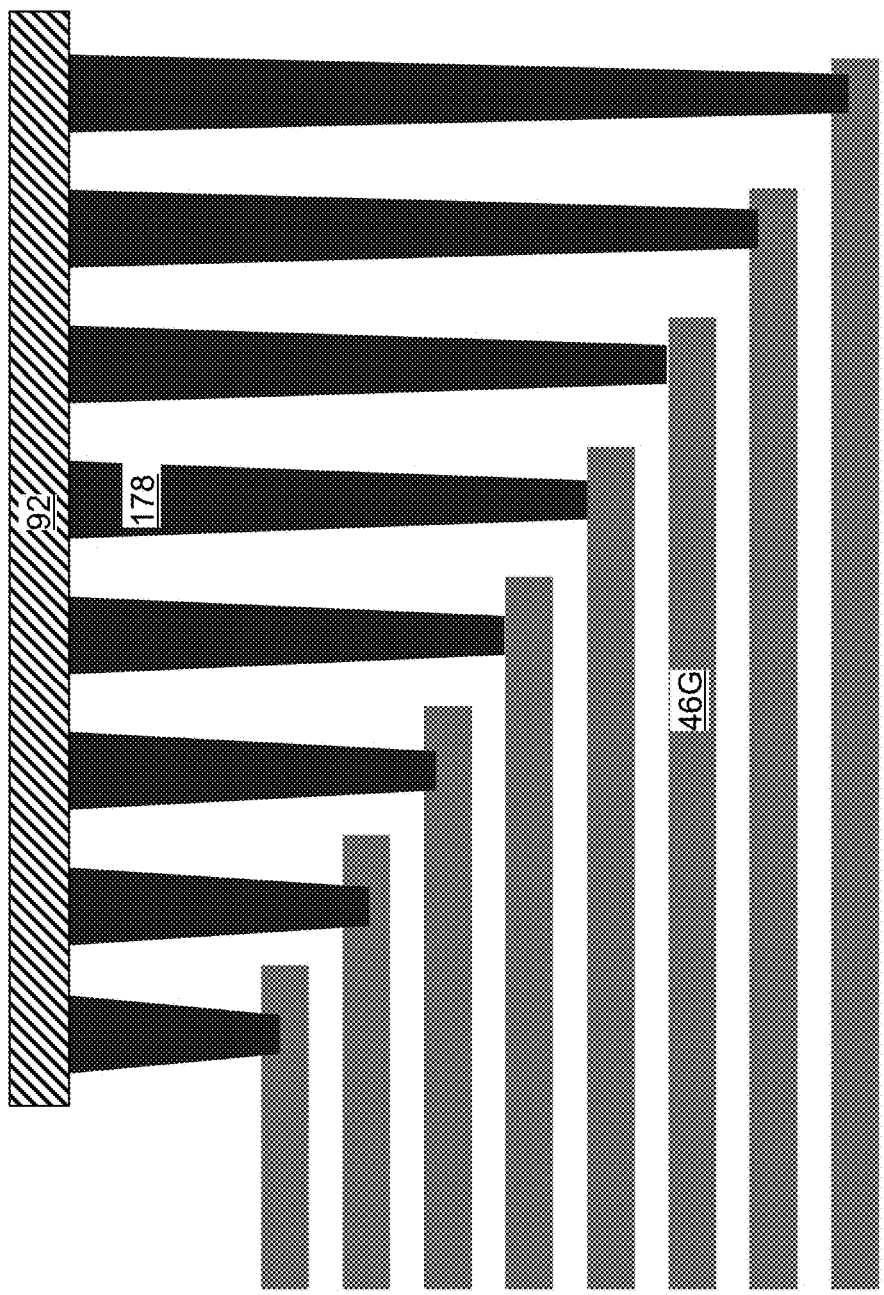
FIG. 14 is a schematic vertical cross-sectional view of an alternative configuration of the exemplary structure according to an embodiment of the present disclosure.
Figure 15:
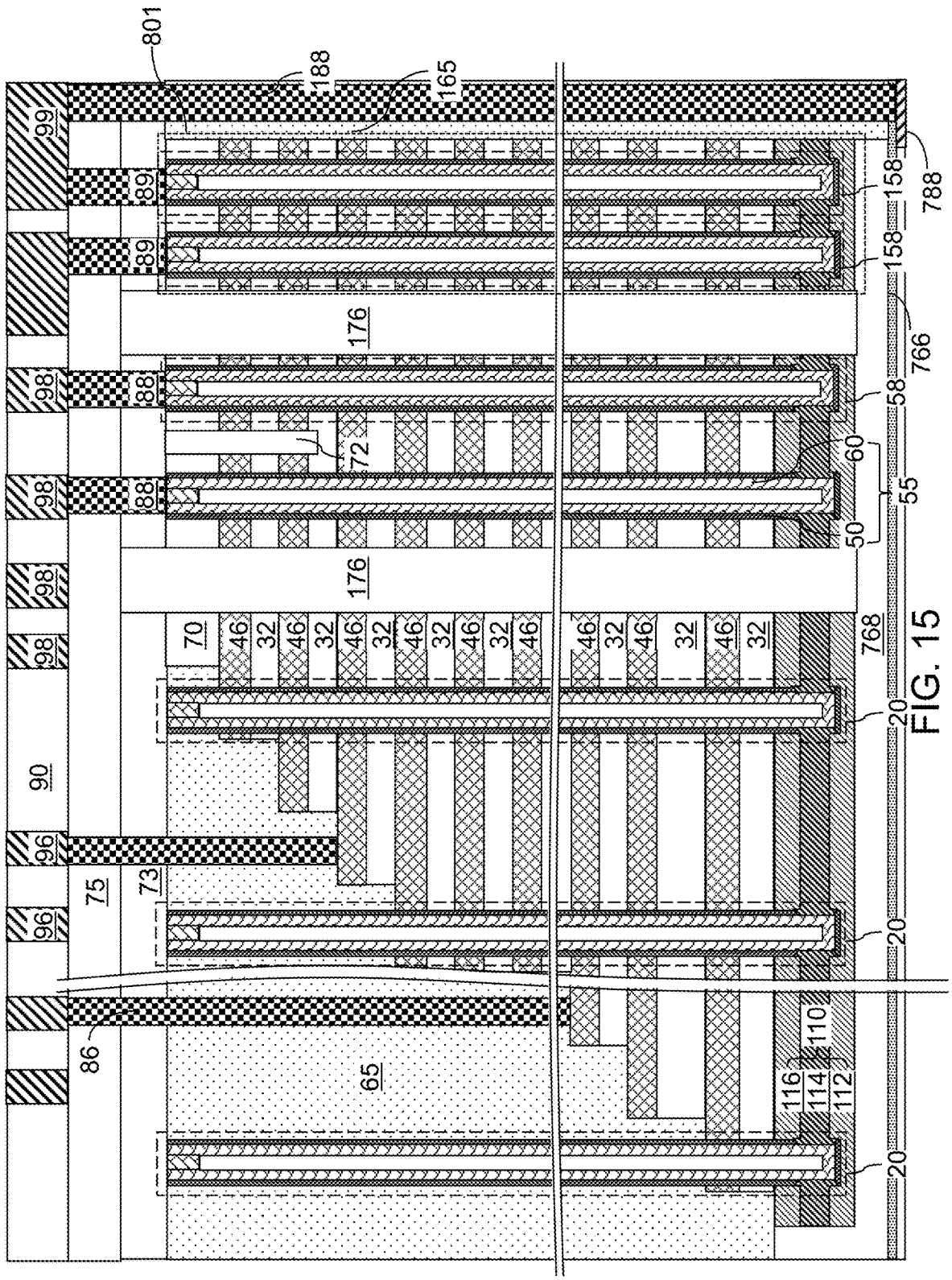
FIG. 15 is a schematic vertical cross-sectional view of another alternative configuration of the exemplary structure according to an embodiment of the present disclosure.

Referring to FIG. 14, an alternative configuration of the exemplary structure is illustrated, which includes a set of switch transistor gate contact via structures 178 contacting a respective one of the second electrically conductive layers 46G in a switch transistor region 400, i.e., the various electrically conductive layers that belong to the same vertical switch transistor's gate electrode. The set of switch transistor gate contact via structures 178 can be electrically connected to each other by a gate electrode contact metal line 92. Thus, a switch transistor gate contact via structure 78 directly contacting sidewalls of multiple electrically conductive layers 46G in a switch transistor gate electrode can be replaced by a set of switch transistor gate contact via structures 178 contacting a respective one of the second electrically conductive layers 46G, while a gate electrode contact metal line 92 contacts each of the switch transistor gate contact via structures 178. Thus, the switch transistor gate electrode of a vertical switch transistor 801 in this embodiment comprises the combination of the set of switch transistor gate contact via structures 178 contacting a respective one of the second electrically conductive layers 46G, Referring to FIG. 15, an alternative configuration of the exemplary structure according to an embodiment of the present disclosure is illustrated. The alternative configuration can be derived from the exemplary structure of FIGS. 13A-13C by providing in-process source level material layers in lieu of the semiconductor source-level layer 10 at the processing steps of FIGS. 1A and 1B. The in-process source level material layers can include a lower source level material layer 112, a sacrificial source level material layer (not shown), and an upper source level material layer 116. A source level cavity is formed by etching the sacrificial source level material layer selective to the upper source level material layer 116 and the lower source level material layer 112 after formation of the backside trenches 79 by providing an isotropic etchant into the backside trenches 79. Physically exposed portions of the memory films 50 is removed by a subsequent isotropic etch. A source contact semiconductor layer 114 having a doping of the second conductivity type is formed in the volume of the source cavity. The lower source level material layer 112, the source contact semiconductor layer 114, and the upper source level material layer 116 collectively constitute source level material layers 110. After replacement of the sacrificial material layers 42 with electrically conductive layers 46 and after formation of contact via structures 68 (i.e., the switch transistor gate interconnection via structures), a dielectric wall structure 176 is formed within each backside trench 79.

Figure 16:
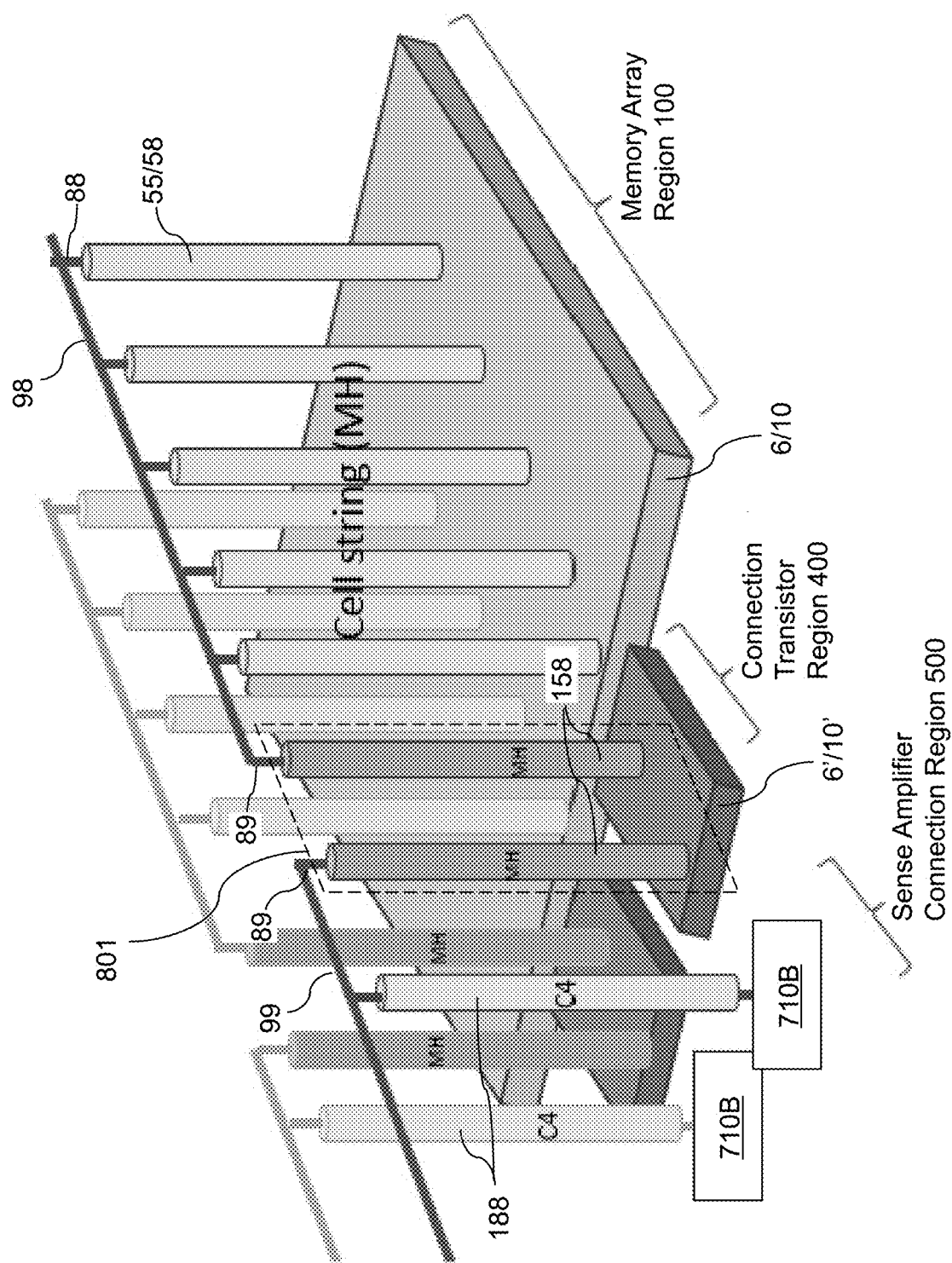
FIG. 16 is a schematic layout of a configuration of the exemplary structure according to an embodiment of the present disclosure.

FIG. 16 is a schematic layout of a configuration of the exemplary structure according to the first embodiment of the present disclosure.

Figure 17:
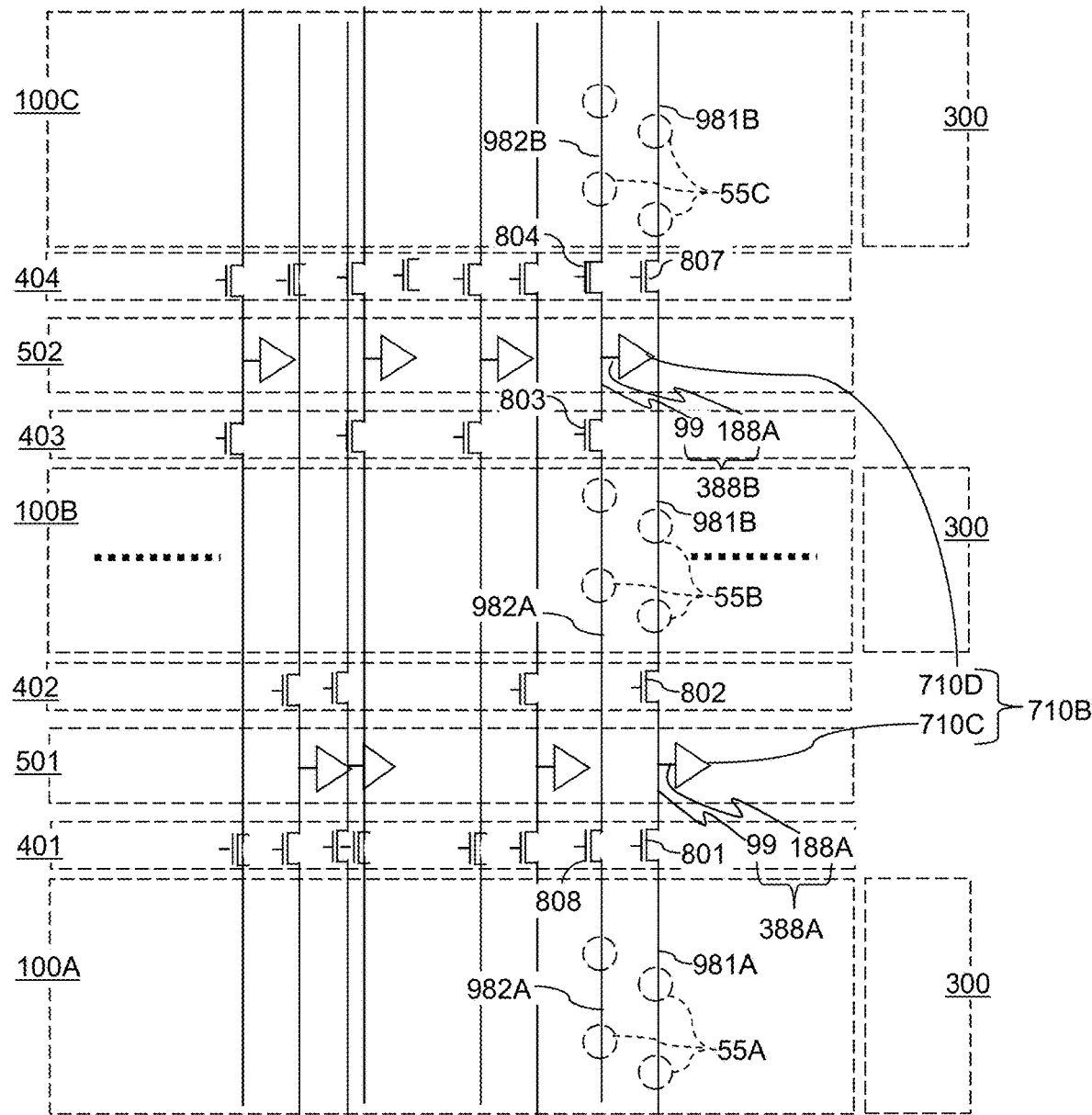
FIG. 17 is a circuit schematic of the exemplary structure according to the first embodiment of the present disclosure.

FIG. 17 is a circuit schematic of the exemplary structure according to the first embodiment of the present disclosure.

Figure 18:
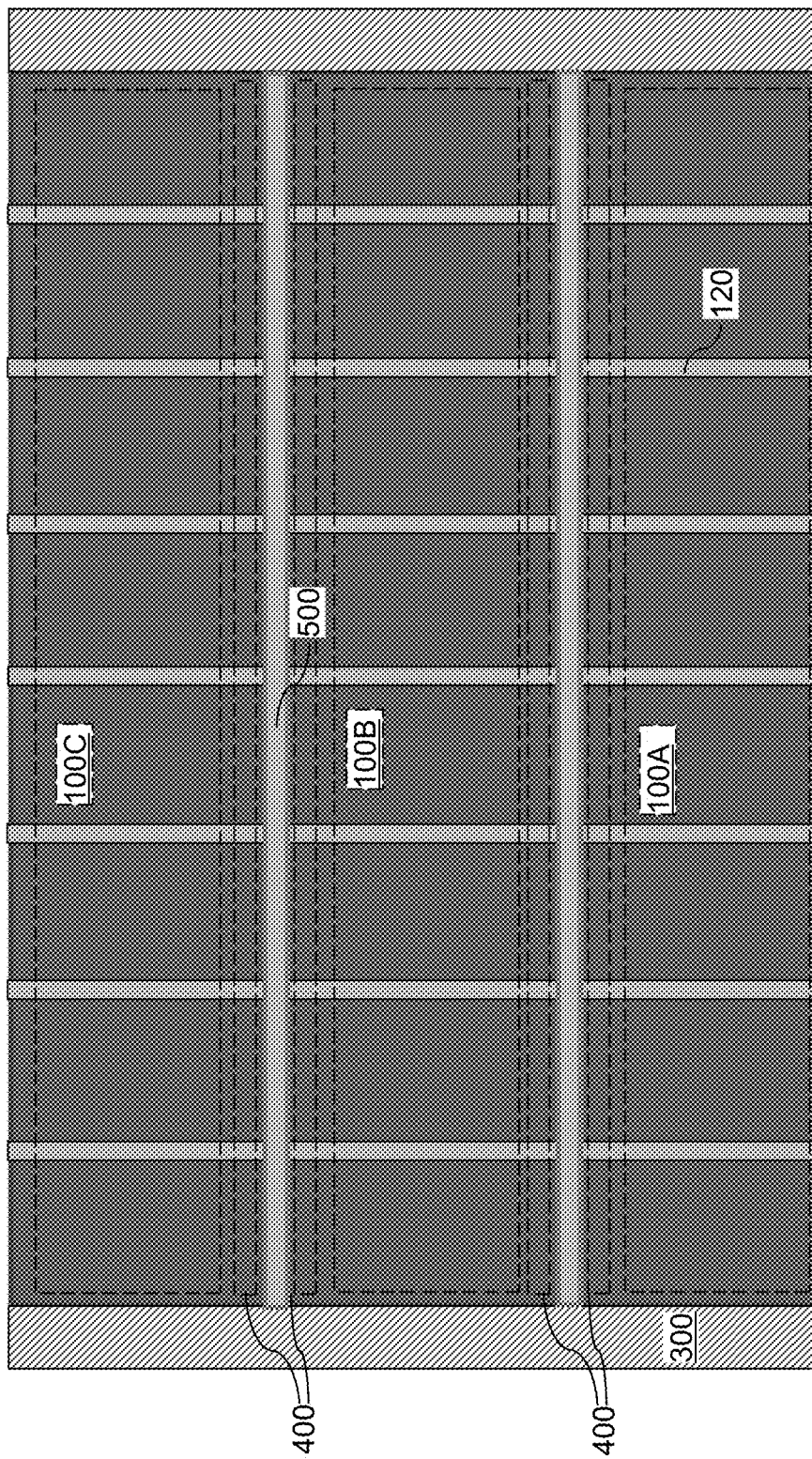
FIG. 18 is a plan view of a configuration of the exemplary structure according to an embodiment of the present disclosure.

FIG. 18 is a plan view of a configuration of a semiconductor chip including the exemplary structure according to the first embodiment of the present disclosure. Interconnection regions 120 contain electrical connections between the semiconductor devices 710 located on or in the substrate 8 and the overlying memory devices through the various metal line structures (98, 99, 96, 94, 92, 93).

Referring collectively to FIGS. 13A-13C, 16 and 17, each bit line 98 is connected to a respective column (e.g., one-dimensional array) of memory stack structures 55 in a respective memory block region 100. Each memory stack structure 55 includes a vertical NAND cell string, i.e., a string (a series connection) of vertical NAND cells. Each vertical NAND cell string has a first end electrically connected to a memory-region source-level stack (6, 10) that contains a source region 61 (shown in FIG. 13A) for the vertical NAND cell string, and a second end electrically connected to the bit line 98 through a respective active region 63 (shown in FIG. 13A) that functions as a drain region on a vertical NAND cell string and a respective drain contact via structure 88.

Referring to FIG. 17, first memory stack structures 55A extend through a first alternating stack of first insulating layers 32 and first electrically conductive layers 46 (e.g., shown in FIG. 13A) in a first memory block region 100A, which is a memory block region 100. Second memory stack structures 55B extend through a second alternating stack of second insulating layers 32 and second electrically conductive layers 46 in a second memory block region 100B, which is another memory block region 100 that is adjacent to the first memory block region 100A. Third memory stack structures 55C extend through a third alternating stack of third insulating layers 32 and third electrically conductive layers in a third memory block region 100C, which is yet another memory block region that is adjacent to the second memory block region 100B and is laterally spaced from the first memory block region 100A by the second memory block region 100B. Each of the first, second, and third memory stack structures 55 comprises a respective vertical semiconductor channel 60 and memory film 50. A first portion 981A of a first bit line 981 is electrically connected to the first memory stack structures 55A in the first memory block region 100A through a respective set of drain contact via structures 88 and a respective set of active regions 63. A second portion 981B of the first bit line 981 is electrically connected to the second memory stack structures 55B in the second memory block region 100B through a respective set of drain contact via structures 88 and a respective set of active regions 63. A first interconnect 388A is located between the first and the second memory block regions (100A, 100B). The first interconnect 388A includes a sense amplifier connection line 99 electrically connected to the least one through-memory-level contact via structure 188. The sense amplifier (i.e., the sense amplifier circuit) 710B is electrically connected to the first and the second portions (981A, 981B) of the first bit line 981 through the first interconnect 388A. The individual sense amps 710C and 710D of the sense amplifier circuit 710B are also shown using the amplifier symbols in FIG. 17.

A first transistor (e.g., a first vertical switching transistor) 801 is located adjacent to the first memory block region 100A and a second transistor 802 is located adjacent to the second memory block region 100B, as shown in FIG. 17. The first transistor 801 is a vertical field effect transistor including a pair of switch transistor structures 158 and a transistor interconnect pad (6', 10') located in a first switching transistor device region 401. The second transistor 802 is a vertical field effect transistor including a pair of switch transistor structures 158 and a transistor interconnect pad (6', 10') located in a second switching transistor device region 402. The first switching transistor device region 401 is located between a first sense amplifier connection region 501 and the first memory block region 100A. The second switching transistor device region 402 is located between the first sense amplifier connection region 501 and the second memory block region 100B.

The second memory block region 100B is laterally spaced from the first memory block region 100A. The first portion 981A of the first bit line 981 overlies the first memory block region 100A. The second portion 981B of the first bit line 981 overlies the second memory block region 100B. The sense amplifier 710B is electrically connected to the first portion 981A of the first bit line 981 through both the first interconnect 388A and the first transistor 801. The sense amplifier 710B is electrically connected to the second portion 981B of the first bit line 981 through both the first interconnect 388A and the second transistor 802.

The first transistor 801 comprises a pair of first vertical semiconductor channels 60' electrically connected in series by a first interconnection pad (6', 10'). The first interconnect 388A is electrically connected to, and may directly contact, a first active region 63 of the first transistor 801. The first portion 981A of the first bit line 981 is electrically connected to a second active region 63 of the first transistor 801 through a respective switch transistor contact via structure 89. The second transistor 802 comprises a pair of second vertical semiconductor channels 60 electrically connected in series by a second interconnection pad (6', 10'). The first interconnect 388A is electrically connected to a first active region 63 of the second transistor 802. The second portion 981B of the first bit line 981 is electrically connected to a second active region 63 of the second transistor 802.

A first gate electrode {(78, 46G) or 178, 46G)} located within the first switching transistor device region 401 laterally surrounds each pair of the first vertical semiconductor channels 60' of the first transistor 801. Second gate electrode {(78, 46G) or 178, 46G)} located within the second switching transistor device region 402 and electrically isolated from the first gate electrode 46G laterally surrounds each pair of the second vertical semiconductor channels 60 of the second transistor 802. Electrically conductive layers 46G of the first gate electrode {(78, 46G) or 178, 46G)} are vertically spaced from each other, and are electrically connected to each other. Electrically conductive layers 46G of the second gate electrode {(78, 46G) or 178, 46G)} are vertically spaced from each other, and are electrically connected to each other.

Each memory film 50 comprises a tunneling dielectric 56 and a charge storage layer 54. The first electrically conductive layers 46 comprise first word lines for the first memory stack structures 55A. The second electrically conductive layers 46 comprise second word lines for the second memory stack structures 55B.

A third transistor 803 is provided in a third switching transistor device region 403, and a fourth transistor 804 is provided in a fourth switching transistor device region 404. A first portion 982A of a second bit line 982 can traverse (i.e., laterally extend through the region of) the first and second memory block regions (100A, 100B) and is electrically connected to the third transistor 803. A second portion 982B of the second bit line 822 can traverse the third memory block region 100C and electrically connected to the fourth transistor 804. A second interconnect 388B is located in the second sense amplifier connection region 502 between the second and third memory block regions (100B, 100C) and between regions 403 and 404. The second interconnect 388B includes another sense amplifier connection line 99 electrically connected to another at the least one through-memory-level contact via structure 188. The second portion 981B of the first bit line 981 also traverses the third memory block region 100C. The sense amplifier 710B is electrically connected to the first portion 982A of the second bit line 982 through both the second interconnect 388B and the third transistor 803. The sense amplifier 710B is electrically connected to the second portion 982B of the second bit line 982 through both the second interconnect 388B and the fourth transistor 804.

Each pair of the first vertical semiconductor channels 60' vertically extends at least from a first horizontal plane including a bottom surface of a bottommost one of the first electrically conductive layers 46 and at least to a second horizontal plane including a top surface of a topmost one of the first electrically conductive layers 46 within the first memory block region 100A. Each pair of the second vertical semiconductor channels 60' also vertically extends at least from the first horizontal plane including a bottom surface of a bottommost one of the second electrically conductive layers 46 and at least to the second horizontal plane including a top surface of a topmost one of the second electrically conductive layers 46.

A device of one embodiment of the present disclosure can comprise a three-dimensional NAND memory device. In one embodiment, a semiconductor chip can comprise a plurality of the three-dimensional NAND memory devices.

According to another aspect of the present disclosure, a circuit is provided, which comprises: a first memory block region 100A, a second memory block region 100B, a first switch comprising the first transistor 801, a second switch comprising the second transistor 802, a first portion 981A of a first bit line 981 traversing the first memory block region 100A and electrically connected to the first switch 801, and a second portion 981B of the first bit line 981 traversing the second memory block region 100B and electrically connected to the second switch 802. The sense amplifier 710B is electrically connected to the first portion 981A of the first bit line 981 through the first switch 801, and is electrically connected to the second portion 981B of the first bit line 981 through the second switch 802.

A first interconnect 388A is located between the first and the second memory block regions (100A, 100B) in the first sense amplifier connection region 501. The sense amplifier 710B is located below the at least one second dielectric layer 768 within the support device region 700, and the first memory block region 100A and the second memory block region 100B are located above the at least one second dielectric layer 768. In this case, the sense amplifier 710B is located below the first memory block region 100A and below the second memory block region 100B. The first interconnect 388A extends from above the memory stack structures 55 of the first memory block region 100A and second memory block region 100B and below the first memory block region 100A and the second memory block region 100B to electrically contact the sense amplifier.

In one embodiment, the sense amplifier 710B (which corresponds to the sense amplifier 710B in FIG. 1A) is electrically connected to the first portion 981A of the first bit line 981 through both the first interconnect 388A and the first switch 801, and the sense amplifier 710B is electrically connected to the second portion 981B of the first bit line 981 through both the first interconnect 388A and the second switch 802.

In one embodiment, the first switch 801 comprises a first transistor 801 having a pair of first vertical semiconductor channels 60' electrically connected in series by a first interconnection pad (6', 10'). The first interconnect 388A is electrically connected to a first active region 63 of the first transistor 801. The first portion 981A of the first bit line 981 is electrically connected to a second active region 63 of the first transistor 801. The second switch 802 comprises a second transistor 802 having a pair of second vertical semiconductor channels 60' electrically connected in series by a second interconnection pad (6', 10'). The first interconnect 388A is electrically connected to a first active region 63 of the second transistor 802. The second portion 981B of the first bit line 981 is electrically connected to a second active region 63 of the second transistor 802.

A first gate electrode {(78, 46G) or 178, 46G)} laterally surrounds each pair of the first vertical semiconductor channels 60'. Electrically conductive layers 46G of the first gate electrode are vertically spaced from each other, and are electrically connected to each other. All first switches 801 for multiple first bit lines 981 is switched simultaneously by the first gate electrode. A second gate electrode {(78, 46G) or 178, 46G)} laterally surrounds each pair of the second vertical semiconductor channels 60'. Electrically conductive layers 46G of the second gate electrode are vertically spaced from each other, and are electrically connected to each other. All second switches 802 for multiple first bit lines 981 is switched simultaneously by the first gate electrode.

The circuit can comprise a third memory block region 100C, a third switch comprising a third transistor 803, and a fourth switch comprising a fourth transistor 804. A first portion 982A of a second bit line 982 traverses the first and second memory block regions (100A, 100B) and is electrically connected to the third switch 803. A second portion 982B of the second bit line 982 traverses the third memory block region 100C and is electrically connected to the fourth switch 804. A second interconnect 388B is located between the third and the second memory block regions (100B, 100C) in the second sense amplifier connection region 502 between regions 403 and 404.

In one embodiment, the second portion 981B of the first bit line 981 also traverses the third memory block region 100C. The sense amplifier is electrically connected to the first portion 982A of the second bit line 982 through both the second interconnect 388B and the third switch 803. The sense amplifier is electrically connected to the second portion 982B of the second bit line 982 through both the second interconnect 388B and the fourth switch 804.

Optionally, an additional switch 807 comprising an additional transistor contains a pair of switch transistor structures 158 and an interconnection pad (6', 10'). The additional switch 807 can be provided in the third switching transistor device region 403 or the fourth switching transistor device region 404.

The additional switch 807 can electrically disconnect a segment of the second portion 981B of the first bit line 981 in the third memory block region 100C while the first bit line 981 accesses the memory elements within the second memory block region 100B. The capacitance and the resistance of the second portion of the first bit line 981 decreases for the purpose of accessing the memory elements within the second memory block region 100B because the segment of the second portion 981B of the first bit line 981 in the third memory block region 100C is disconnected by switching off the additional switch.

Further, an additional switch 808 comprising additional transistor including a pair of switch transistor structures 158 and an interconnection pad (6', 10') can be provided in the first switching transistor device region 401 or the second switching transistor device region 402. The additional switch 808 can electrically disconnect a segment of the first portion 982A of the second bit line 982 in the first memory block region 100A while the second bit line 982 accesses the memory elements within the second memory block region 100B. The capacitance and the resistance of the first portion 9281 of the second bit line 982 decreases for the purpose of accessing the memory elements within the second memory block region 100B because the segment of the first portion 982A of the second bit line 982 in the first memory block region 100B is disconnected by switching off the additional switch.

Multiple instances of a combination of the first bit line 981 and the second bit line 982 is repeated along the first horizontal direction (hd1) that is perpendicular to the lengthwise direction (hd2) of the first and second bit lines (981, 982). In one embodiment, each odd numbered bit line can have the same configuration as the first bit line 981, and each even numbered bit line can have the same configuration as the second bit line 982. The laterally alternating configuration for the bit line connection can minimize inter-bit line signal coupling during sensing by reducing the capacitive coupling among adjacent bit lines 98.

According to an aspect of the present disclosure, the circuit of an embodiment of the present disclosure is operated by turning on the first switch 801 while the second switch 802 is turned off, and by providing a first current from the sense amplifier 710B to the first portion 981A of the first bit line 981 without providing the first current from the sense amplifier to the second portion 981B of the first bit line 981 to perform a read operation, a write operation, or an erase operation on at least one memory cell located in the first memory stack structure 55A in the first memory block 100A.

In one embodiment, the first switch 801 is turned off and the second switch 802 is turned on. A second current is provided from the sense amplifier to the second portion 981B of the first bit line 981 without providing the second current from the sense amplifier to the first portion 981A of the first bit line 981 to perform the read operation, the write operation, or the erase operation on at least one memory cell located in the second memory stack structure 55B the second memory block 100B.

In one embodiment, a first segment of the second portion 981B of the first bit line 981 extends over the second memory block region 100B, and the circuit further comprises a third memory block region 100C over which a second segment of the second portion 981B of the first bit line 981 extends. An additional switch 807 electrically connects the second segment of the second portion 981B of the first bit line 981 to the first segment of the second portion 981B of the first bit line 981. The additional switch 807 is turned on while the second switch 802 is turned on and the first switch 801 is turned off, and electrical current is provided from the sense amplifier through the first segment and the second segment of the second portion 981B of the first bit line 981 to perform the read operation, the write operation, or the erase operation on at least one memory cell located in the third memory block 100C.

The semiconductor chip shown in FIG. 18 may be a memory chip which includes the structure corresponding to the circuit shown in FIG. 17, as well as a non-volatile memory array controller, a power supply and any other optional suitable memory chip component such as a processor, a volatile memory, and/or a communication interface. According to various embodiments, the non-volatile memory array controller manages one or more memory block regions 100 described above. The non-volatile memory array controller may comprise any suitable controller, such as storage management layer (SML), which may present a logical address space to one or more storage clients, as described in U.S. Patent Application Publication number 2015/0193299 A1, incorporated herein by reference in its entirety, or any other suitable controller. The processor may comprise one or more central processing units, one or more general-purpose processors, one or more application-specific processors, one or more virtual processors, one or more processor cores, or the like. The communication interface may comprise one or more network interfaces configured to communicatively couple the memory chip (and/or non-volatile memory array controller) to a communication network, such as an Internet Protocol network, a Storage Area Network, or the like.

Figure 19:
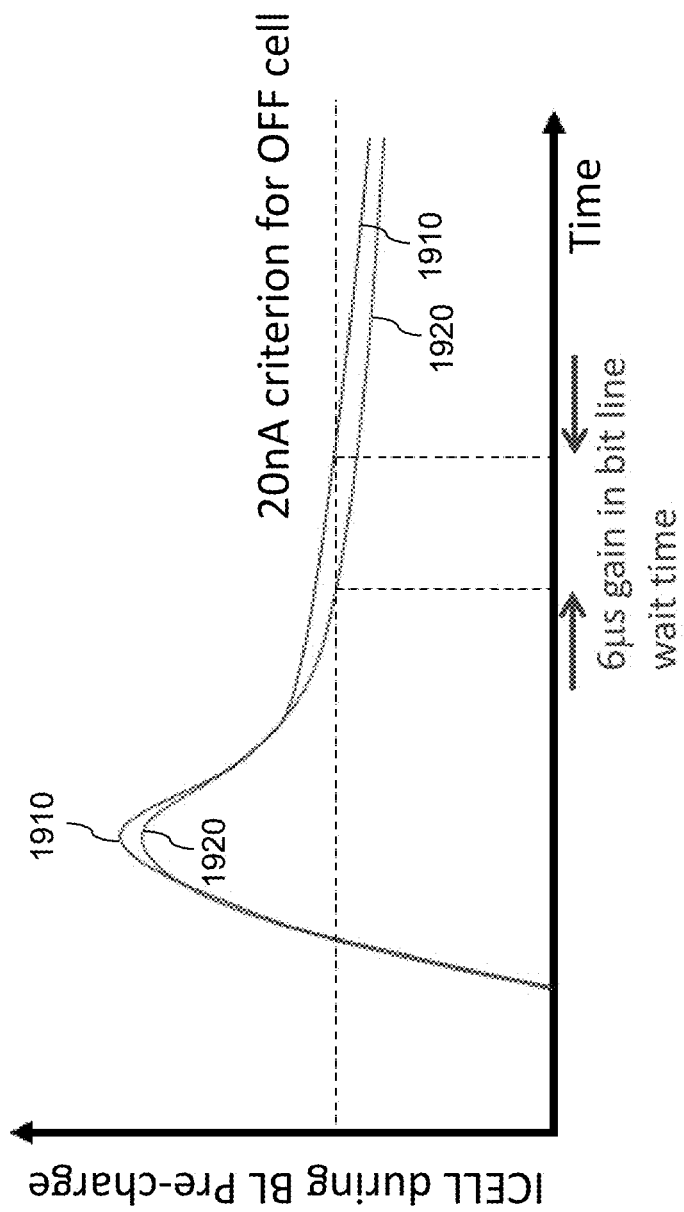
FIG. 19 is a comparison of a cell current during a pre-charge operation for a reference structure without switching transistor devices and for an exemplary structure according to an embodiment of the present disclosure.

Referring to FIG. 19, a comparison of a cell current during a pre-charge operation is shown for a reference structure without switching transistor devices (e.g., without vertical switching transistors 801 and 802), and for an exemplary structure according to an embodiment of the present disclosure containing vertical switching transistors 801 and 802. Curve 1910 corresponds to the cell current during the pre-charge operation for the reference structure that does not employ switching transistor devices of the embodiment of the present disclosure. In the reference structure, the sense amplifier is attached to an end portion of each bit line without employing any switches. Curve 1920 corresponds to the cell current during the pre-charge operation for the exemplary structure employing switches that connect to a middle portion of a respective bit line. Using a 20 nA criterion for an OFF cell, the bit line wait time can be significantly reduced (e.g., by about 6 microseconds) employing the exemplary structure of embodiments of the present disclosure.

Figure 20:
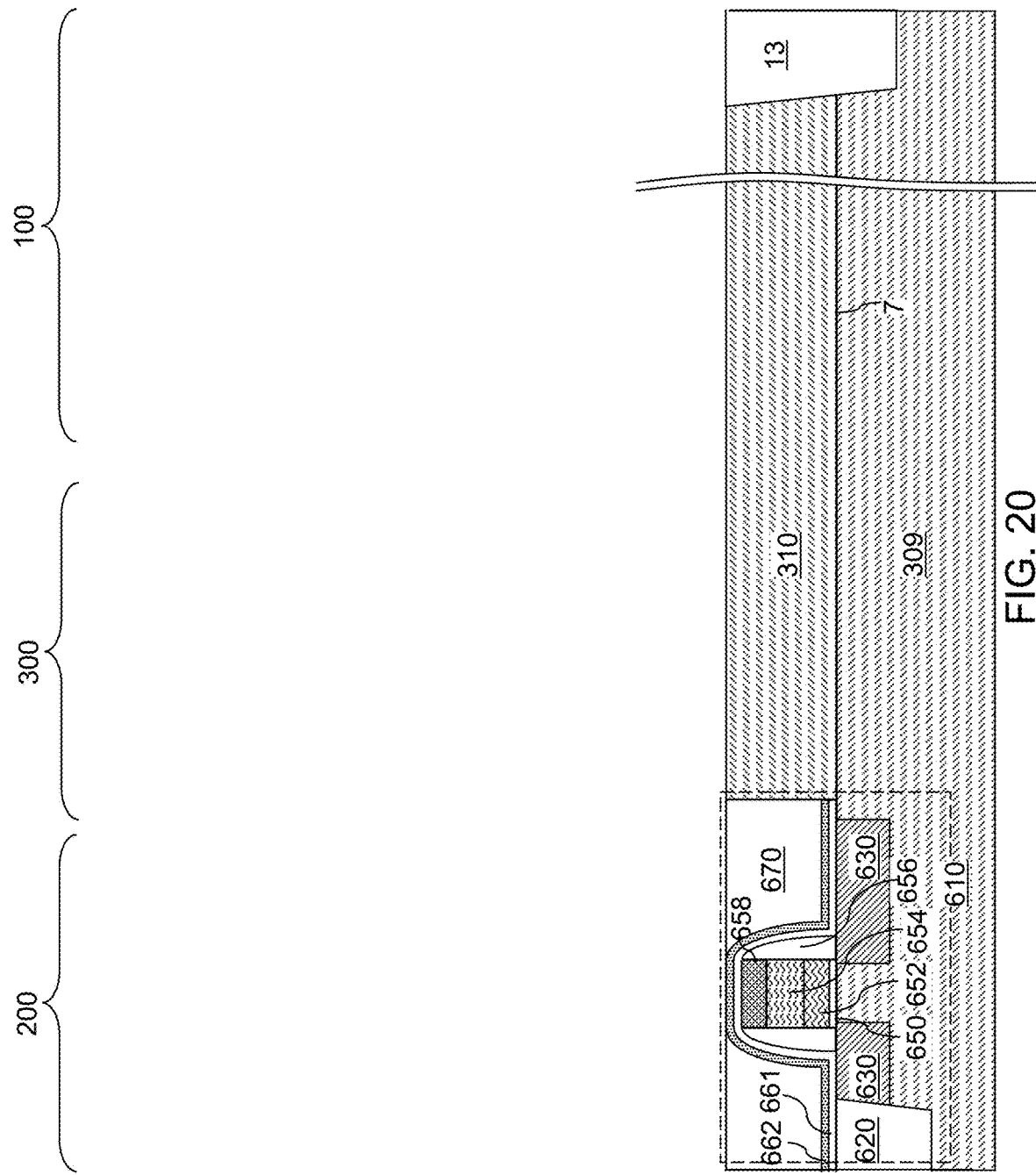
FIG. 20 is a schematic vertical cross-sectional view of a first in-process semiconductor chip after formation of at least one peripheral device, a semiconductor material layer, and array isolation dielectric structures according to an embodiment of the present disclosure.

Referring to FIG. 20, a first in-process semiconductor chip according to a second embodiment of the present disclosure is illustrated, which can be used, for example, to fabricate a device structure containing vertical NAND memory devices. The first in-process semiconductor chip includes a first substrate (309, 310), which can be a semiconductor substrate. The substrate can include a substrate semiconductor layer 309 and an optional semiconductor material layer 310. The substrate semiconductor layer 309 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 309. The major surface 7 can be a semiconductor surface. In one embodiment, the major surface 7 can be a single crystalline semiconductor surface, such as a single crystalline semiconductor surface.

Optionally, at least one semiconductor device 610 for a peripheral circuitry can be formed on a portion of the substrate semiconductor layer 309. Alternatively, the at least one semiconductor device 610 can be omitted. The at least one semiconductor device can include, for example, field effect transistors. For example, at least one shallow trench isolation structure 620 is formed by etching portions of the substrate semiconductor layer 309 and depositing a dielectric material therein. A gate dielectric layer, at least one gate conductor layer, and a gate cap dielectric layer is formed over the substrate semiconductor layer 309, and is subsequently patterned to form at least one gate structure (650, 652, 654, 658), each of which can include a gate dielectric 650, a gate electrode (652, 654), and a gate cap dielectric 658. The gate electrode (652, 654) may include a stack of a first gate electrode portion 652 and a second gate electrode portion 654. At least one gate spacer 656 is formed around the at least one gate structure (650, 652, 654, 658) by depositing and anisotropically etching a dielectric liner. Active regions 630 is formed in upper portions of the substrate semiconductor layer 309, for example, by introducing electrical dopants employing the at least one gate structure (650, 652, 654, 658) as masking structures. Additional masks may be employed as needed. The active region 630 can include source regions and drain regions of field effect transistors. A first dielectric liner 661 and a second dielectric liner 662 can be optionally formed. Each of the first and second dielectric liners (661, 662) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 661 can be a silicon oxide layer, and the second dielectric liner 662 can be a silicon nitride layer. The least one semiconductor device for the peripheral circuitry can contain a driver circuit for memory devices to be subsequently formed, which can include at least one NAND device.

A dielectric material such as silicon oxide is deposited over the at least one semiconductor device, and is subsequently planarized to form a planarization dielectric layer 670. In one embodiment the planarized top surface of the planarization dielectric layer 670 is coplanar with a top surface of the dielectric liners (661, 662). Subsequently, the planarization dielectric layer 670 and the dielectric liners (661, 662) is removed from an area to physically expose a top surface of the substrate semiconductor layer 309. As used herein, a surface is "physically exposed" if the surface is in physical contact with vacuum, or a gas phase material (such as air).

The optional semiconductor material layer 310, if present, can be formed on the top surface of the substrate semiconductor layer 309 prior to, or after, formation of the at least one semiconductor device 610. The semiconductor material layer 310 can be a doped well formed by ion implantation in the substrate semiconductor layer 309 or deposited layer formed by deposition of a single crystalline semiconductor material, for example, by selective epitaxy. The deposited semiconductor material can be the same as, or can be different from, the semiconductor material of the substrate semiconductor layer 309. The deposited semiconductor material can be any material that can be employed for the semiconductor substrate layer 309 as described above. The single crystalline semiconductor material of the semiconductor material layer 310 can be in epitaxial alignment with the single crystalline structure of the substrate semiconductor layer 309. Portions of the deposited semiconductor material located above the top surface of the planarization dielectric layer 170 can be removed, for example, by chemical mechanical planarization (CMP). In this case, the semiconductor material layer 310 can have a top surface that is coplanar with the top surface of the planarization dielectric layer 670.

An optional region (i.e., area) containing the optional at least one semiconductor device 610 is herein referred to as a peripheral device region 200. Formation of a peripheral device region 200 is optional, and may be omitted. In this case, peripheral devices for operation of a three-dimensional memory array to be subsequently formed over the first substrate (309, 310) is provided in a second semiconductor chip. The region in which a memory array is subsequently formed is herein referred to as a memory block region 100. A contact region 300 for subsequently forming stepped terraces of electrically conductive layers is provided between the memory block region 100 and the peripheral device region 200.

Array isolation dielectric structures 13 can be formed within areas in which boundaries of memory block regions are to be subsequently formed. As used herein, a "memory block region" refers to a region in which a single array of memory devices is formed. The array isolation dielectric structures 13 can provide electrical isolation between neighboring memory block regions at the level of the first substrate (309, 310), i.e., within the substrate semiconductor layer 309 and the semiconductor material layer 310. In one embodiment, shallow trenches can be formed in upper portions of the first substrate (309, 310), and can be filled with a dielectric material such as silicon oxide. Excess portions of the dielectric material can be removed from above the horizontal plane including the top surface of the semiconductor material layer 310 by a planarization process. Each remaining portion of the dielectric material constitutes an array isolation dielectric structure 13. The array isolation dielectric structures 13 can be formed at each boundary between a pair of memory block regions.

Figure 21:
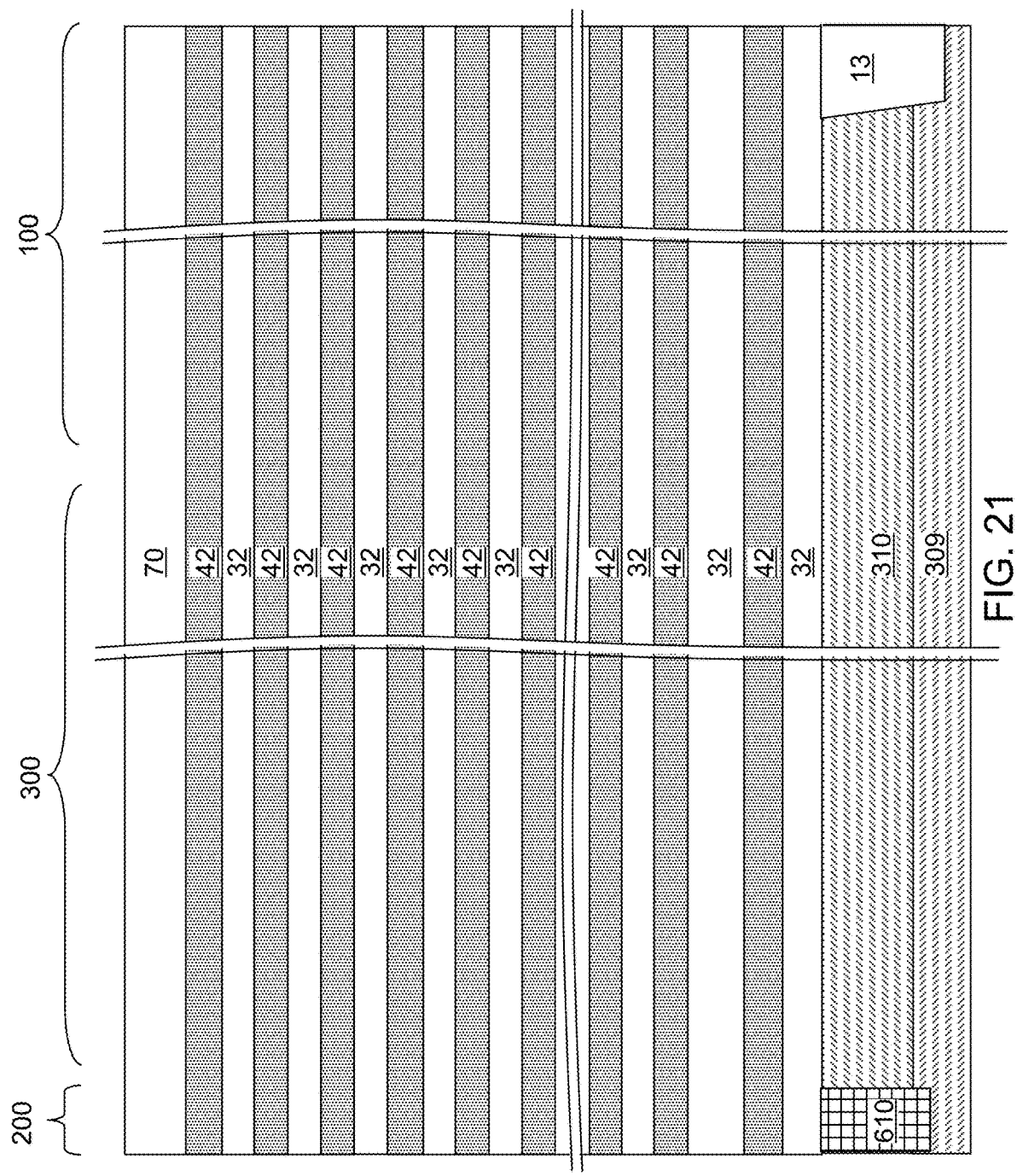
FIG. 21 is a schematic vertical cross-sectional view of the first in-process semiconductor chip after formation of an alternating stack of insulating layers and sacrificial material layers according to an embodiment of the present disclosure.

Referring to FIG. 21, a stack of an alternating plurality of first material layers (which can be insulating layers 32) and second material layers (which can be sacrificial material layer 42) is formed over the top surface of the first substrate (309, 310), as in the first embodiment. The stack of the alternating plurality is herein referred to as an alternating stack (32, 42). In one embodiment, the insulating layers 32 can include silicon oxide, and sacrificial material layers can include silicon nitride sacrificial material layers.

Figure 22:
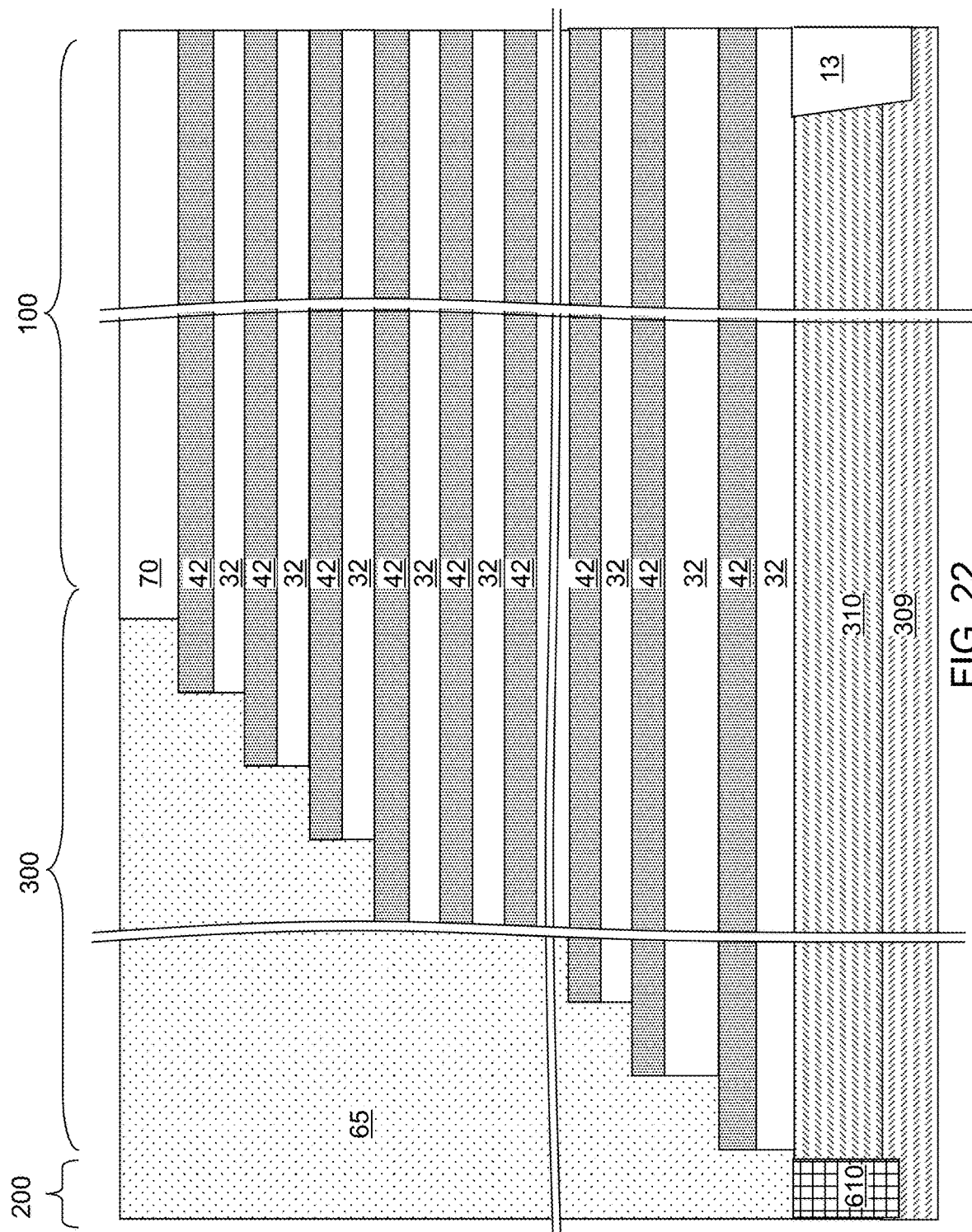
FIG. 22 is a schematic vertical cross-sectional view of the first in-process semiconductor chip after formation of stepped terraces and a retro-stepped dielectric material portion according to an embodiment of the present disclosure.

Referring to FIG. 22, stepped surfaces are formed at a peripheral region of the alternating stack (32, 42), which is herein referred to as a terrace region, as in the first embodiment. The terrace region is formed in the contact region 300, which is located between the memory block region 100 and the optional peripheral device region 200 containing the at least one semiconductor device for the peripheral circuitry. A retro-stepped dielectric material portion 65 (i.e., an insulating fill material portion) is formed in the stepped cavity by deposition of a dielectric material therein, as in the first embodiment. Optionally, drain select level isolation structures 72 can be formed through the insulating cap layer 70 and a subset of the sacrificial material layers 42 located at drain select levels, as in the first embodiment.

Figure 23A:
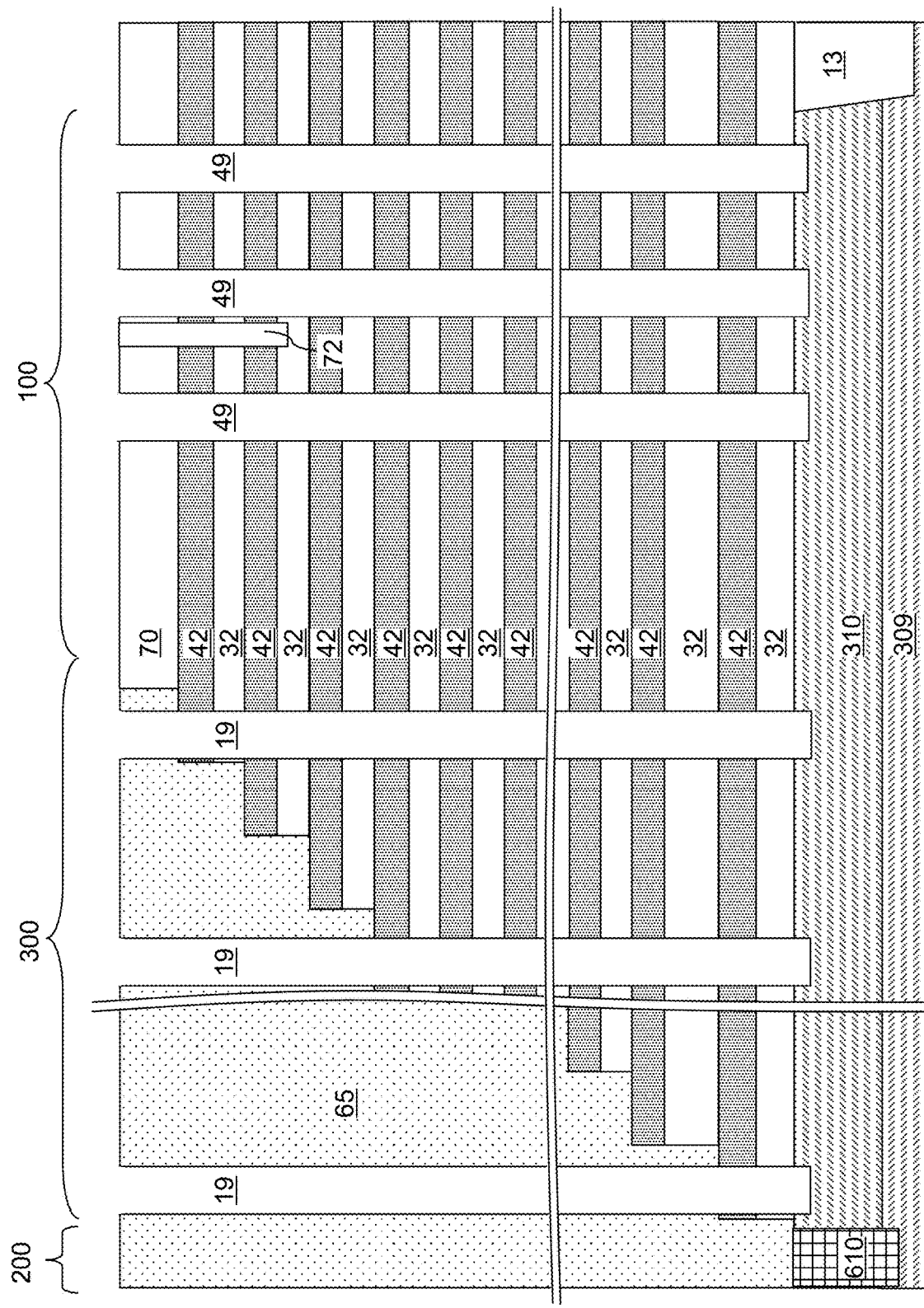
FIG. 23A is a schematic vertical cross-sectional view of the first in-process semiconductor chip after formation of memory openings and support openings according to an embodiment of the present disclosure.
Figure 23B:
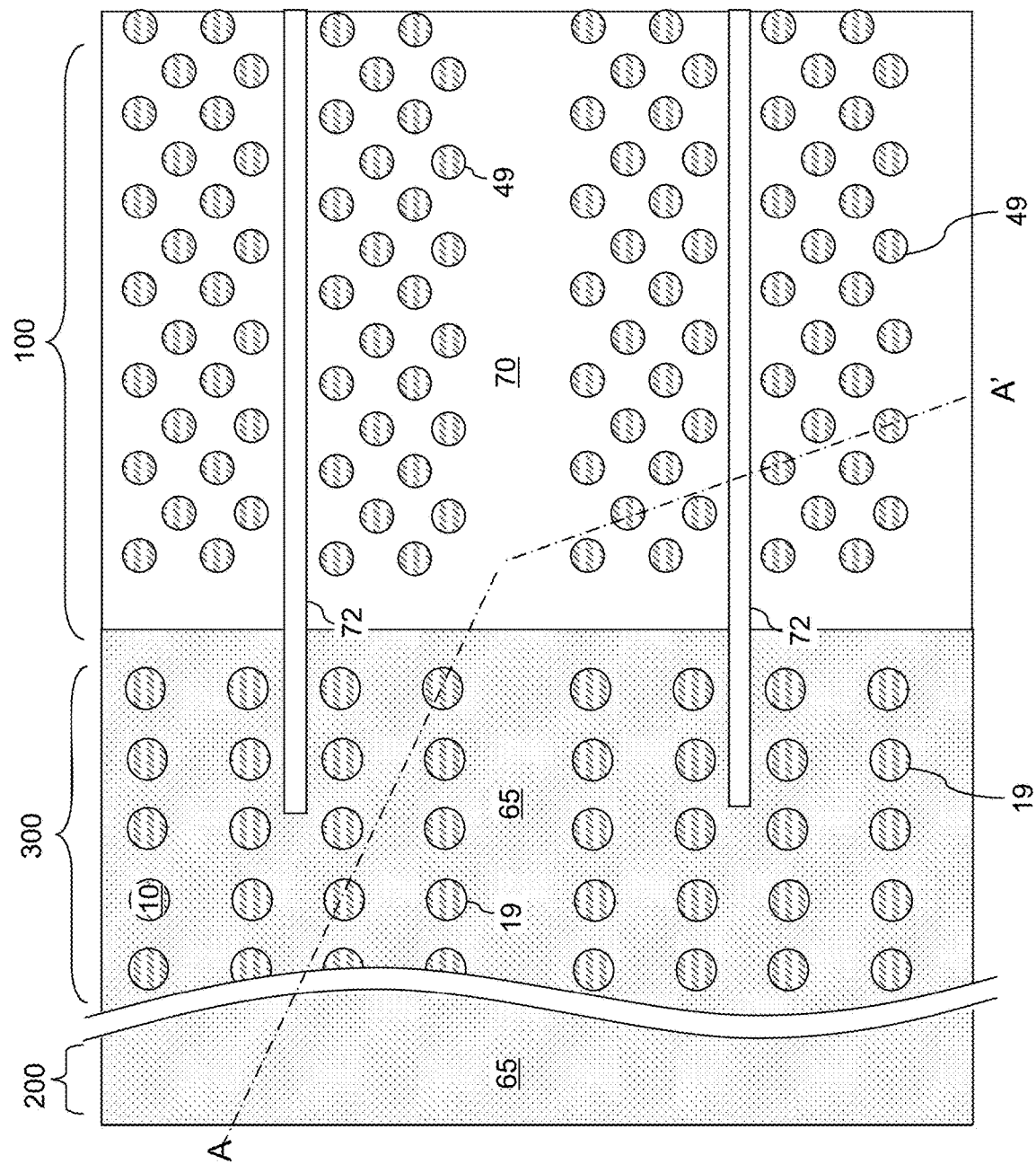
FIG. 23B is a top-down view of the first in-process semiconductor chip of FIG. 23A. The vertical plane A-A' is the plane of the cross-section for FIG. 23A.

Referring to FIGS. 23A and 23B, a lithographic material stack (not shown) including at least a photoresist layer is formed over the insulating cap layer 70 and the retro-stepped dielectric material portion 65, and is lithographically patterned to form openings therein. The openings include a first set of openings formed over the memory block region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19, as in the first embodiment.

The memory openings 49 and the support openings 19 can extend from the top surface of the alternating stack (32, 42) to at least the horizontal plane including the topmost surface of the semiconductor material layer 310. In one embodiment, an overetch into the semiconductor material layer 310 may be optionally performed after the top surface of the semiconductor material layer 310 is physically exposed at a bottom of each memory opening 49 and each support opening 19. The overetch may be performed prior to, or after, removal of the lithographic material stack. In other words, the recessed surfaces of the semiconductor material layer 310 may be vertically offset from the un-recessed top surfaces of the semiconductor material layer 310 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 310.

Each of the memory openings 49 and the support openings 19 may include a sidewall (or a plurality of sidewalls) that extends substantially perpendicular to the topmost surface of the substrate. A two-dimensional array of memory openings 49 can be formed in the memory block region 100. A two-dimensional array of support openings 19 can be formed in the contact region 300. The substrate semiconductor layer 309 and the semiconductor material layer 310 collectively constitutes a first substrate (309, 310), which can be a semiconductor substrate. Alternatively, the semiconductor material layer 310 may be omitted, and the memory openings 49 and the support openings 19 can extend to a top surface of the substrate semiconductor layer 309.

Figure 24:
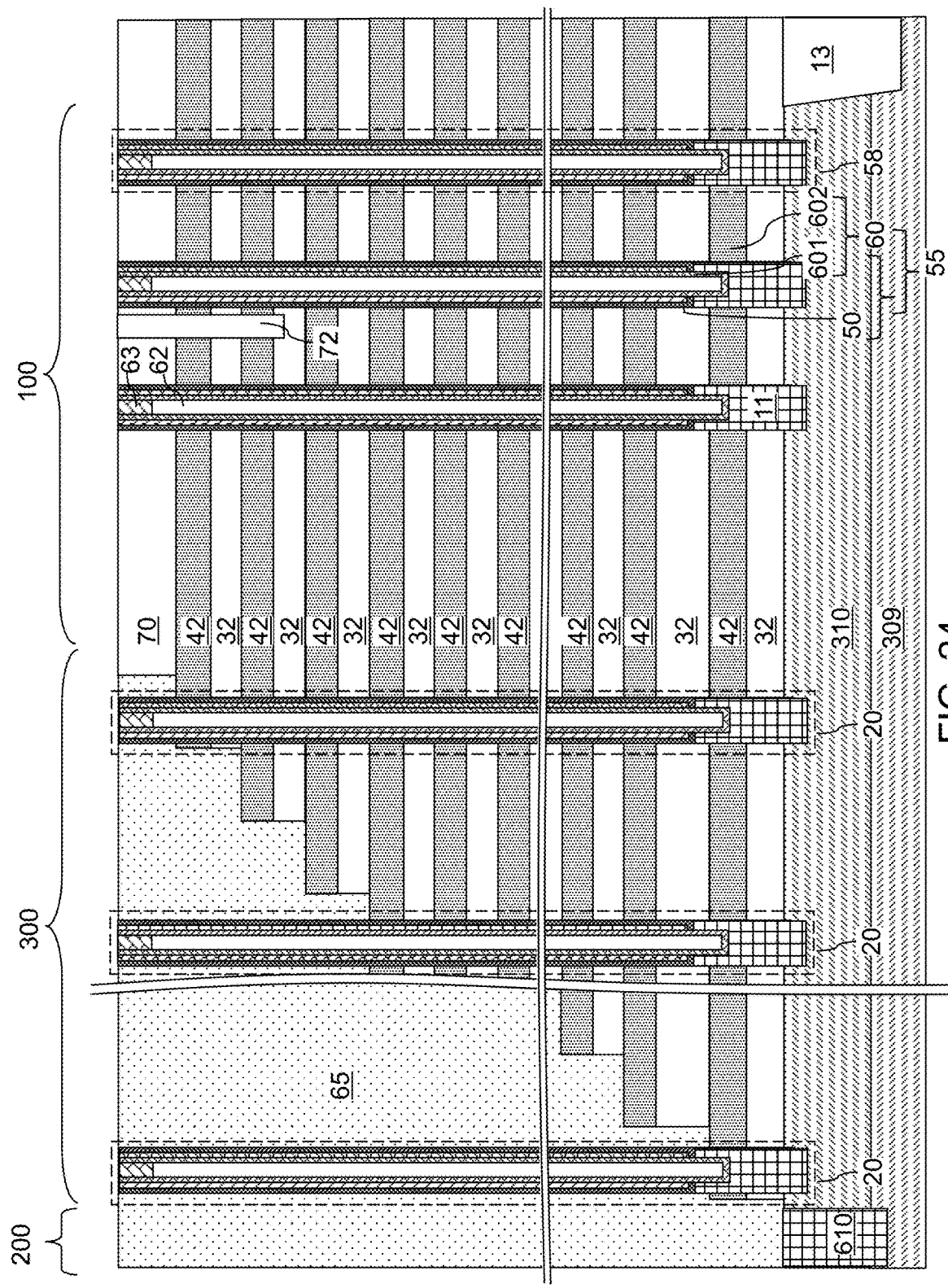
FIG. 24 is a schematic vertical cross-sectional view of the first in-process semiconductor chip after formation of memory stack structures and support pillar structures according to an embodiment of the present disclosure.

Referring to FIG. 24, the processing steps of FIGS. 5A-5H can be performed to form a memory opening fill structure 58 in each memory opening 49 and to form a support pillar structure 20 in each support opening 19. Each combination of a memory film 50 and a vertical semiconductor channel 60 within a memory opening 49 constitutes a memory stack structure 55. The memory stack structure 55 is a combination of a semiconductor channel, a tunneling dielectric layer, a plurality of memory elements comprising portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (as embodied as a charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 25A:
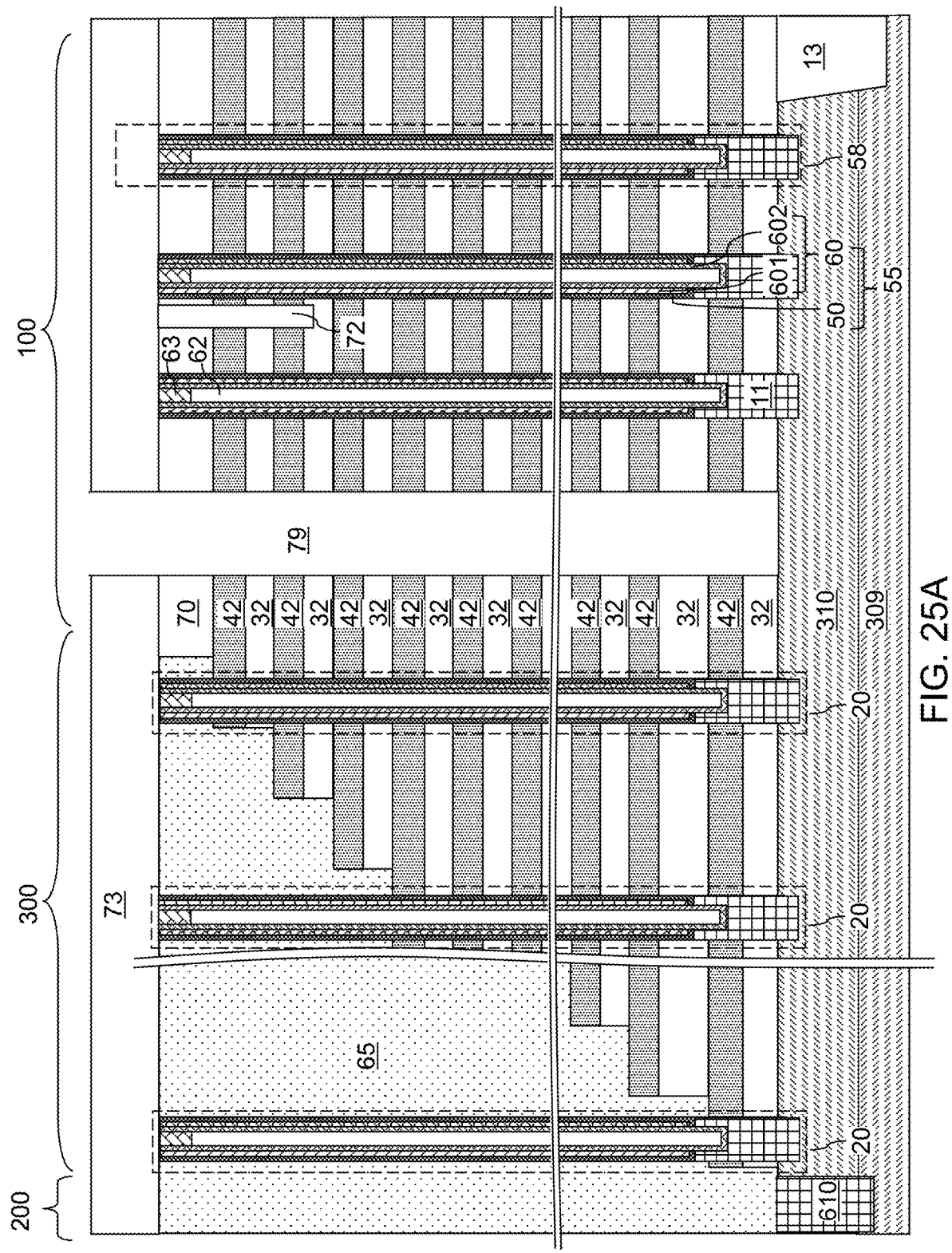
FIG. 25A is a schematic vertical cross-sectional view of the first in-process semiconductor chip after formation of backside trenches according to an embodiment of the present disclosure.

Referring to FIGS. 25A and 25B, a contact level dielectric layer 73 is formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) is applied over the contact level dielectric layer 73, and is lithographically patterned to form openings in areas between clusters of memory stack structures 55. The pattern in the photoresist layer is transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the first substrate (309, 310), and laterally extend through the memory block region 100 and the contact region 300.

Figure 32:
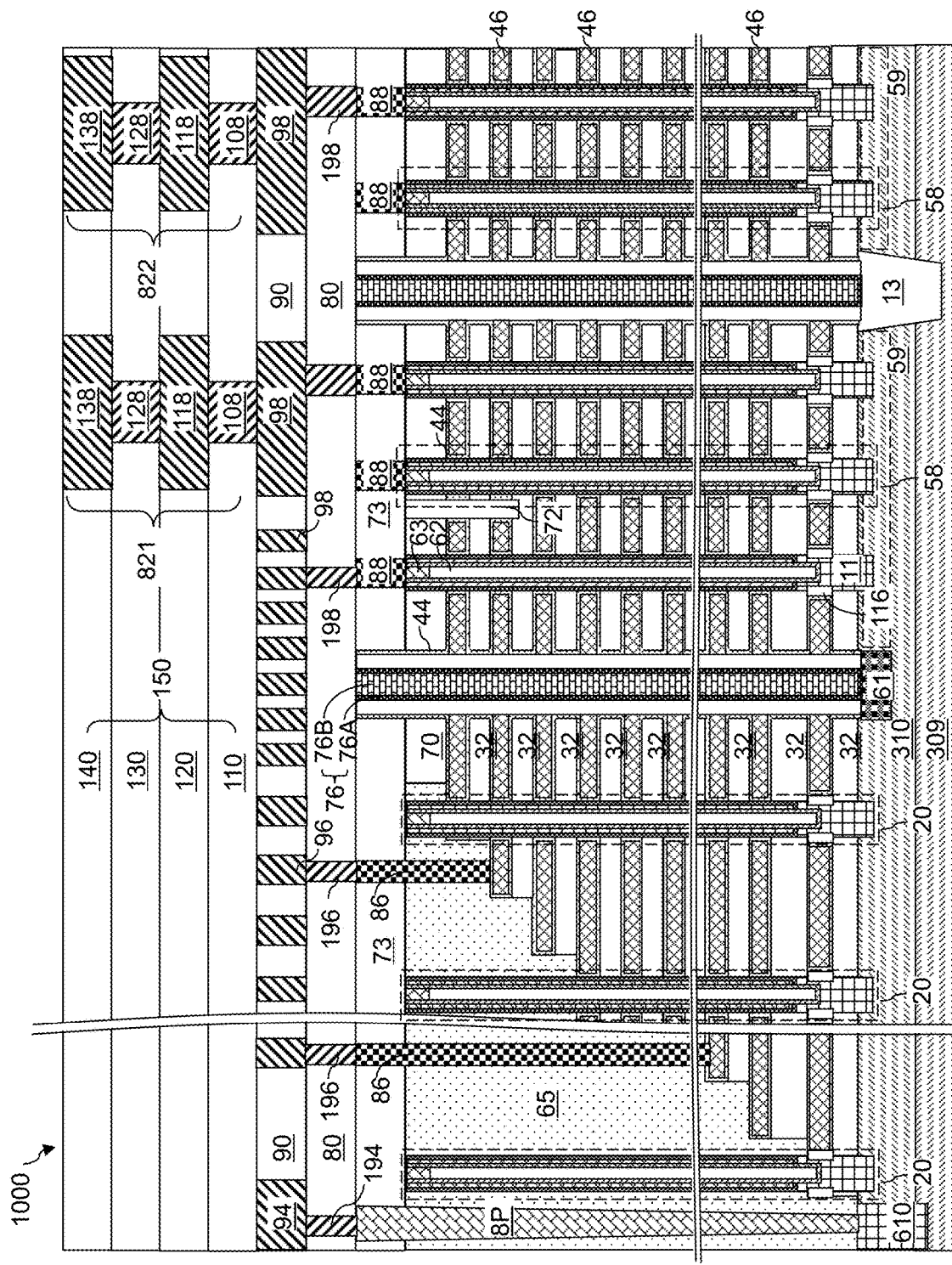
FIG. 32 is a schematic vertical cross-sectional view of a first semiconductor chip after formation of additional metal interconnect structures according to an embodiment of the present disclosure.

The backside trenches 79 can laterally extend along a first horizontal direction hd1 and is laterally spaced apart among one another along a second horizontal direction hd2 that is perpendicular to the first horizontal direction hd1, as in the first embodiment. In one embodiment, one or more of the backside trenches 79 is formed on the array isolation dielectric structures 13, as shown in FIG. 32.

Figure 26:
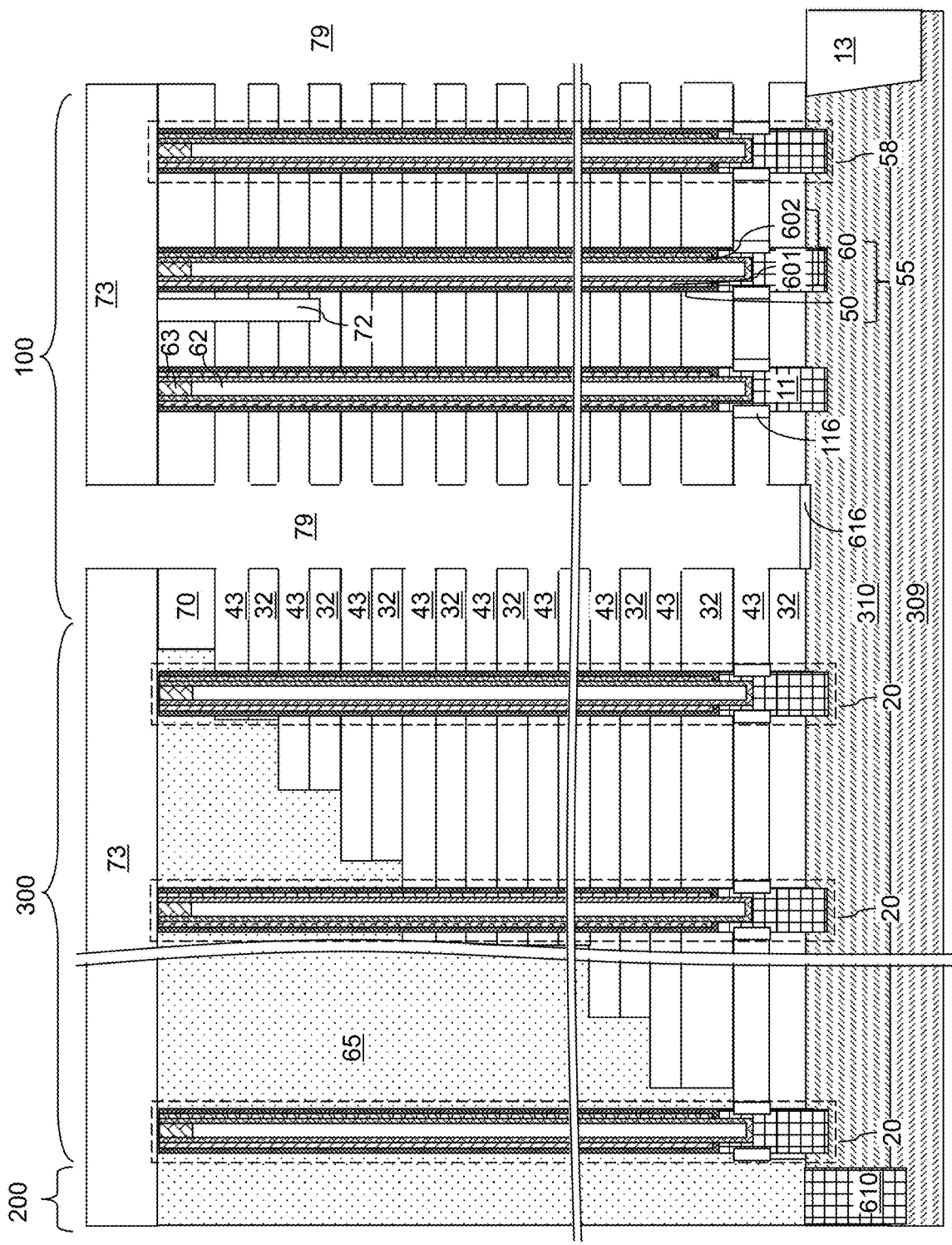
FIG. 26 is a schematic vertical cross-sectional view of the first in-process semiconductor chip after formation of backside recesses according to an embodiment of the present disclosure.

Referring to FIG. 26, an etchant that selectively etches the second material of the sacrificial material layers 42 with respect to the first material of the insulating layers 32 is introduced into the backside trenches 79, for example, employing an etch process. The processing steps of FIGS. 8 and 9A can be performed. Physically exposed surface portions of the optional pedestal channel portions 11 and the semiconductor material layer 310 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 310 into a planar dielectric portion 616.

Figure 27:
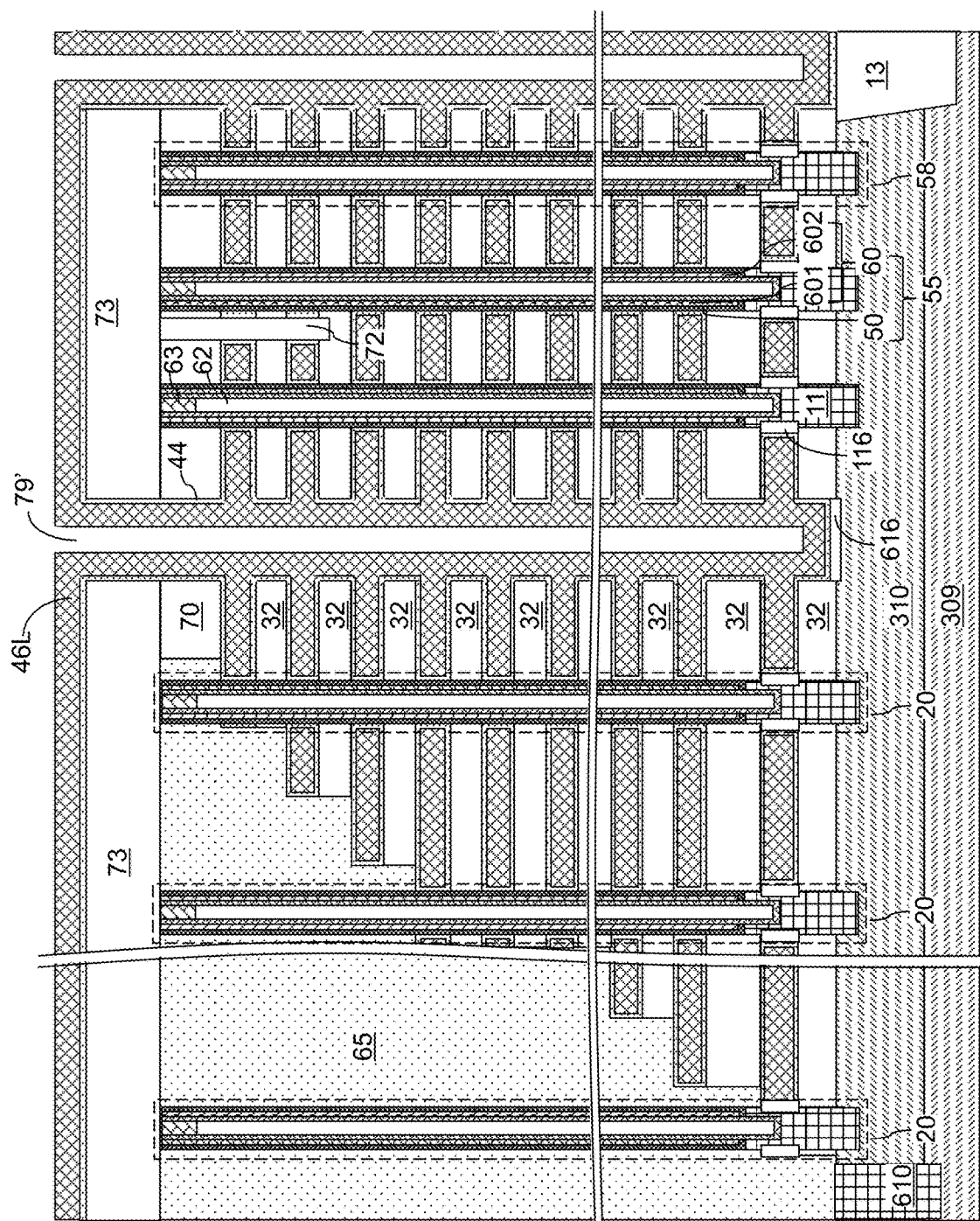
FIG. 27 is a schematic vertical cross-sectional view of the first in-process semiconductor chip after formation of electrically conductive layers according to an embodiment of the present disclosure.

Referring to FIG. 27, the processing steps of FIGS. 9B, 9C, and 9D can be performed to form an optional backside blocking dielectric layer 44 and to form electrically conductive layers 46 and a continuous electrically conductive material layer 46L.

Figure 28A:
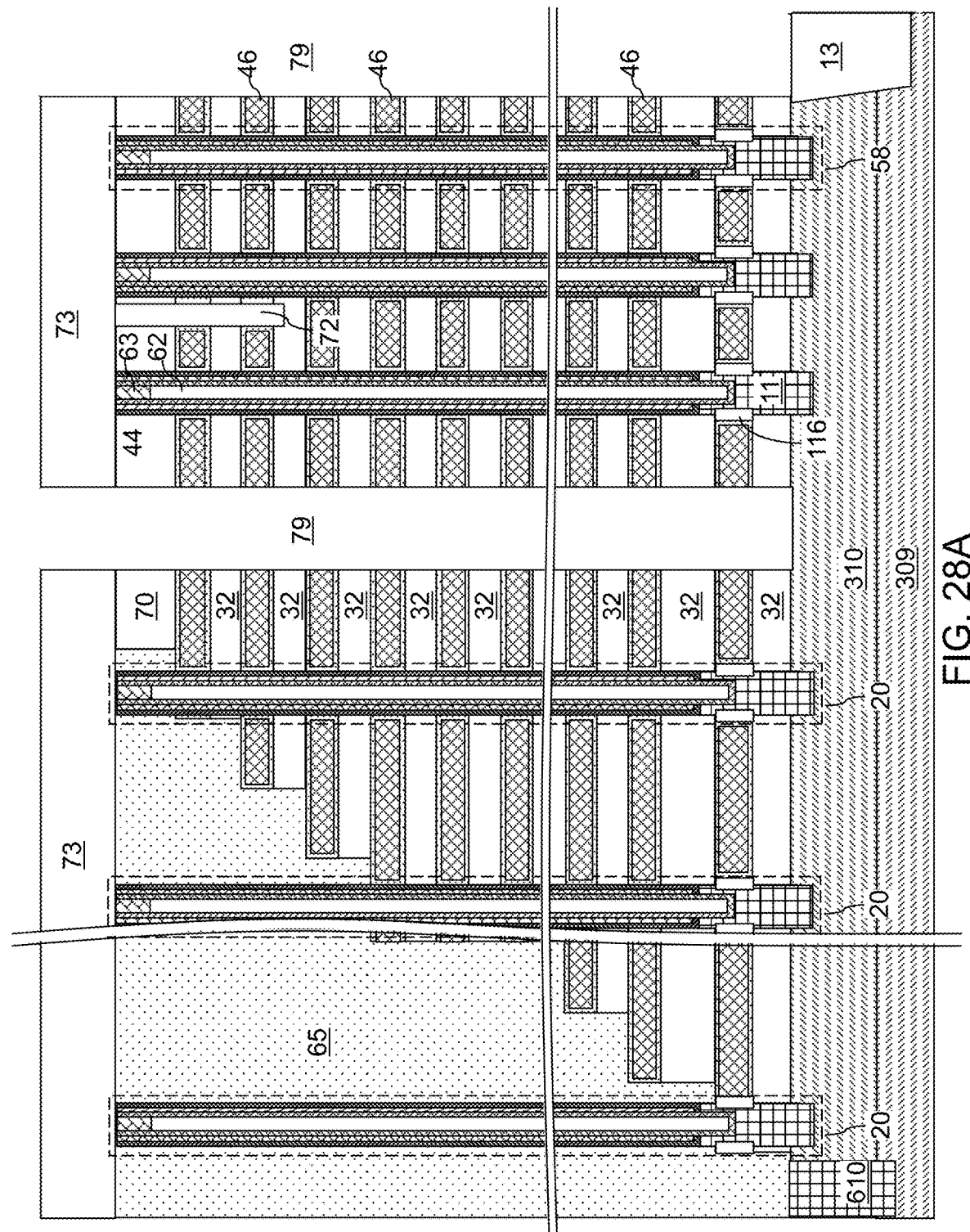
FIG. 28A is a schematic vertical cross-sectional view of the first in-process semiconductor chip after removal of a deposited conductive material from within the backside trench according to an embodiment of the present disclosure.
Figure 28B:
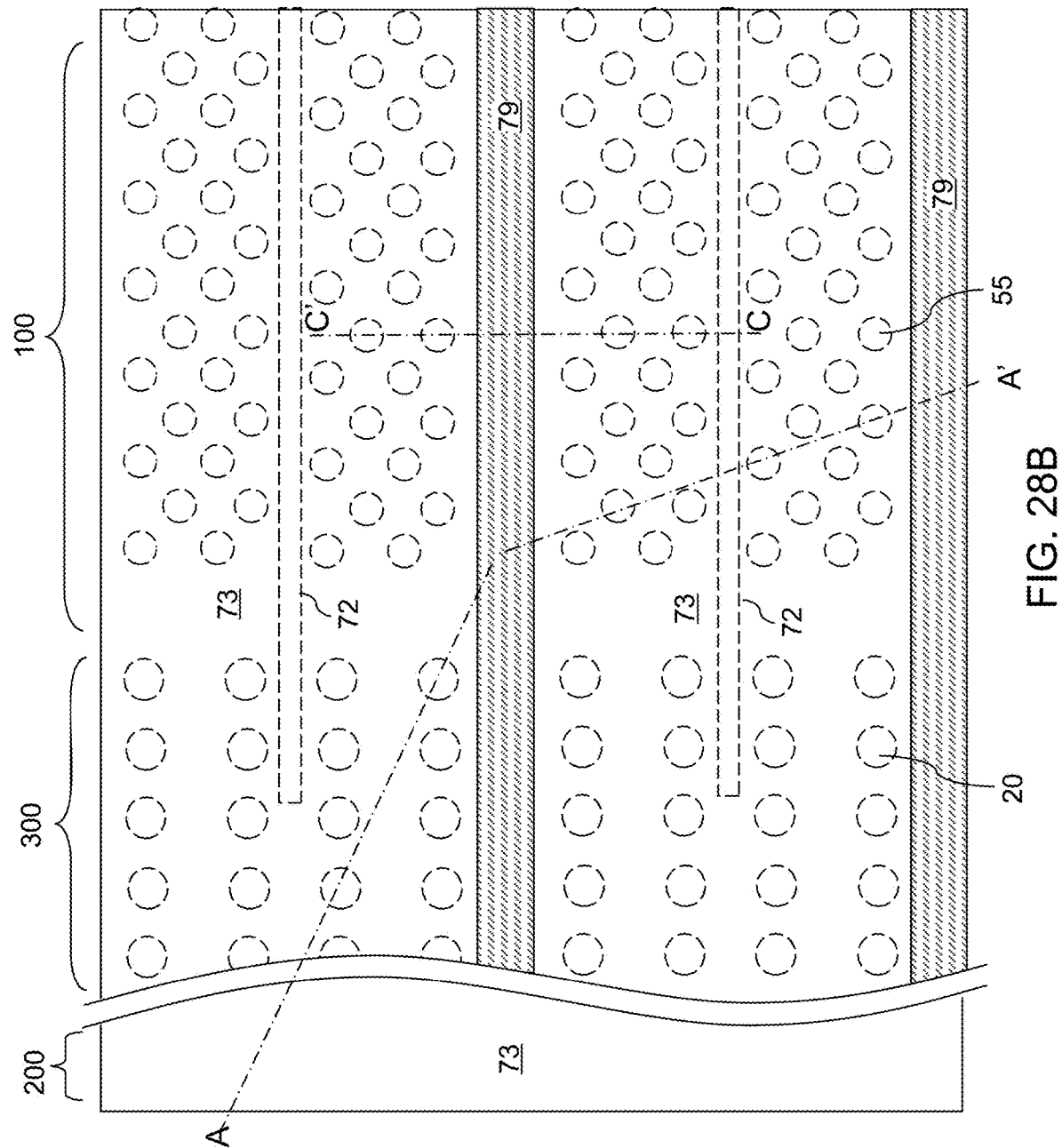
FIG. 28B is a partial see-through top-down view of the first in-process semiconductor chip of FIG. 28A. The vertical plane A-A' is the plane of the schematic vertical cross-sectional view of FIG. 28A.
Figure 28C:
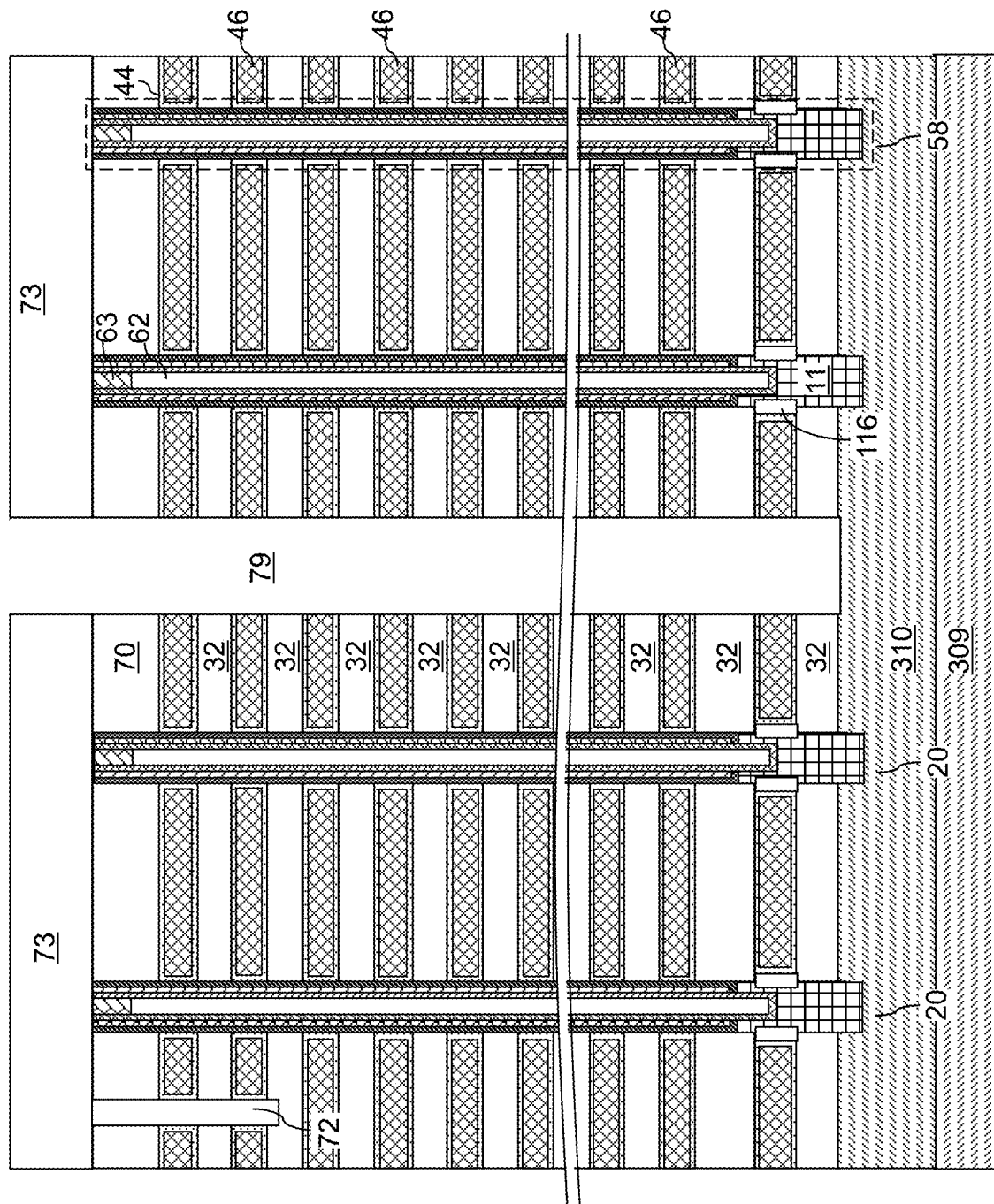
FIG. 28C is a vertical cross-sectional view of the first in-process semiconductor chip along the vertical plane C-C' of FIG. 28B.

Referring to FIGS. 28A-28C, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically connecting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Referring to FIGS. 29A and 29B, an insulating material layer is formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer is formed directly on surfaces of the backside blocking dielectric layer 44 and directly on the sidewalls of the electrically conductive layers 46. If a backside blocking dielectric layer 44 is not employed, the insulating material layer is formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 310 is physically exposed at the bottom of each backside trench 79.

A source region 61 is formed at a surface portion of the semiconductor material layer 310 under each backside cavity 79' by implantation of electrical dopants into physically exposed surface portions of the semiconductor material layer 310. Each source region 61 is formed in a surface portion of the first substrate (309, 310) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 310 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor first substrate (309, 310). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 is formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A is in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material is planarized employing the contact level dielectric layer 73 overlying the alternating stack (32, 46) as a stopping layer. If chemical mechanical planarization (CMP) process is employed, the contact level dielectric layer 73 is employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 30A:
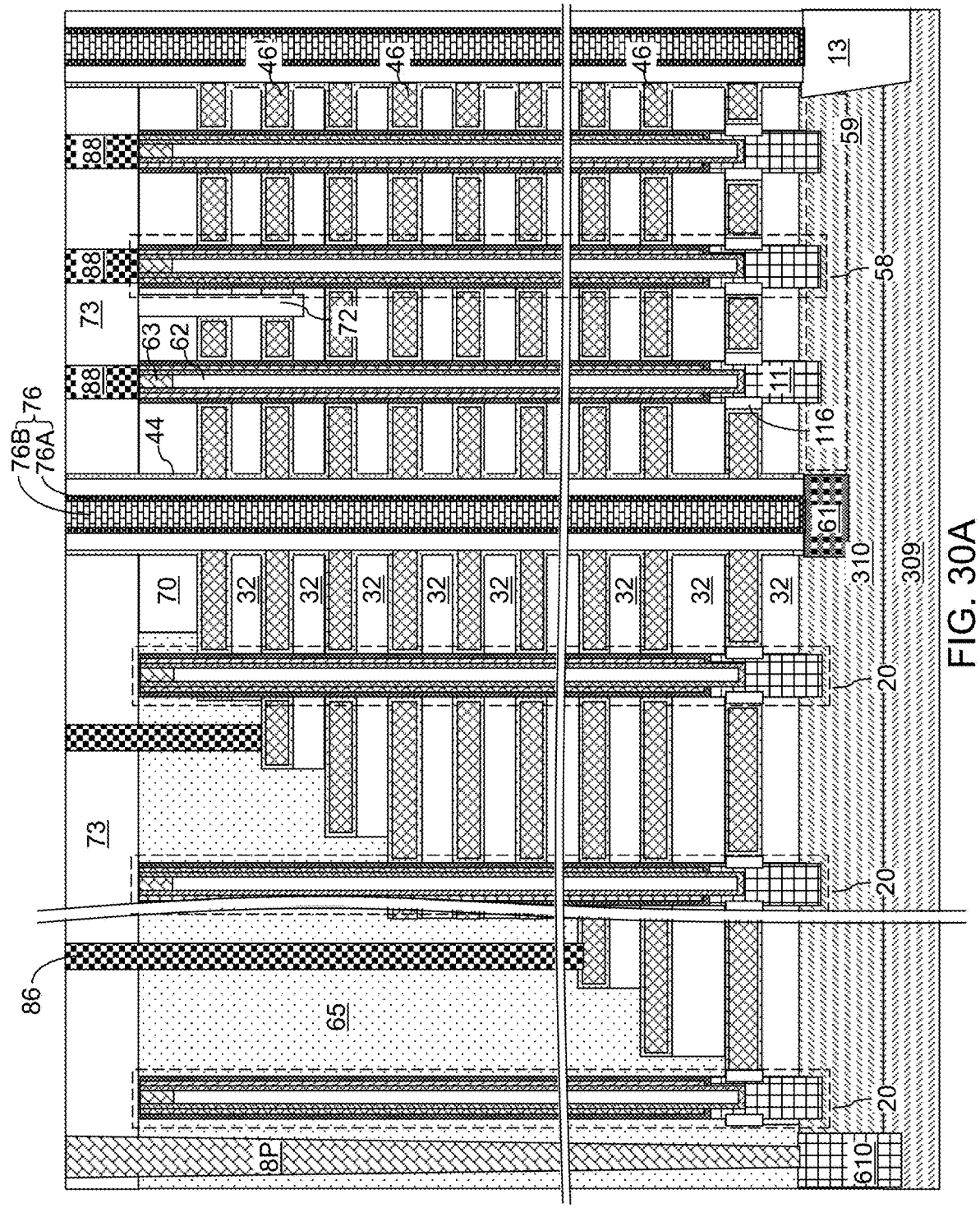
FIG. 30A is a schematic vertical cross-sectional view of the first in-process semiconductor chip after formation of additional contact via structures according to an embodiment of the present disclosure.
Figure 30B:
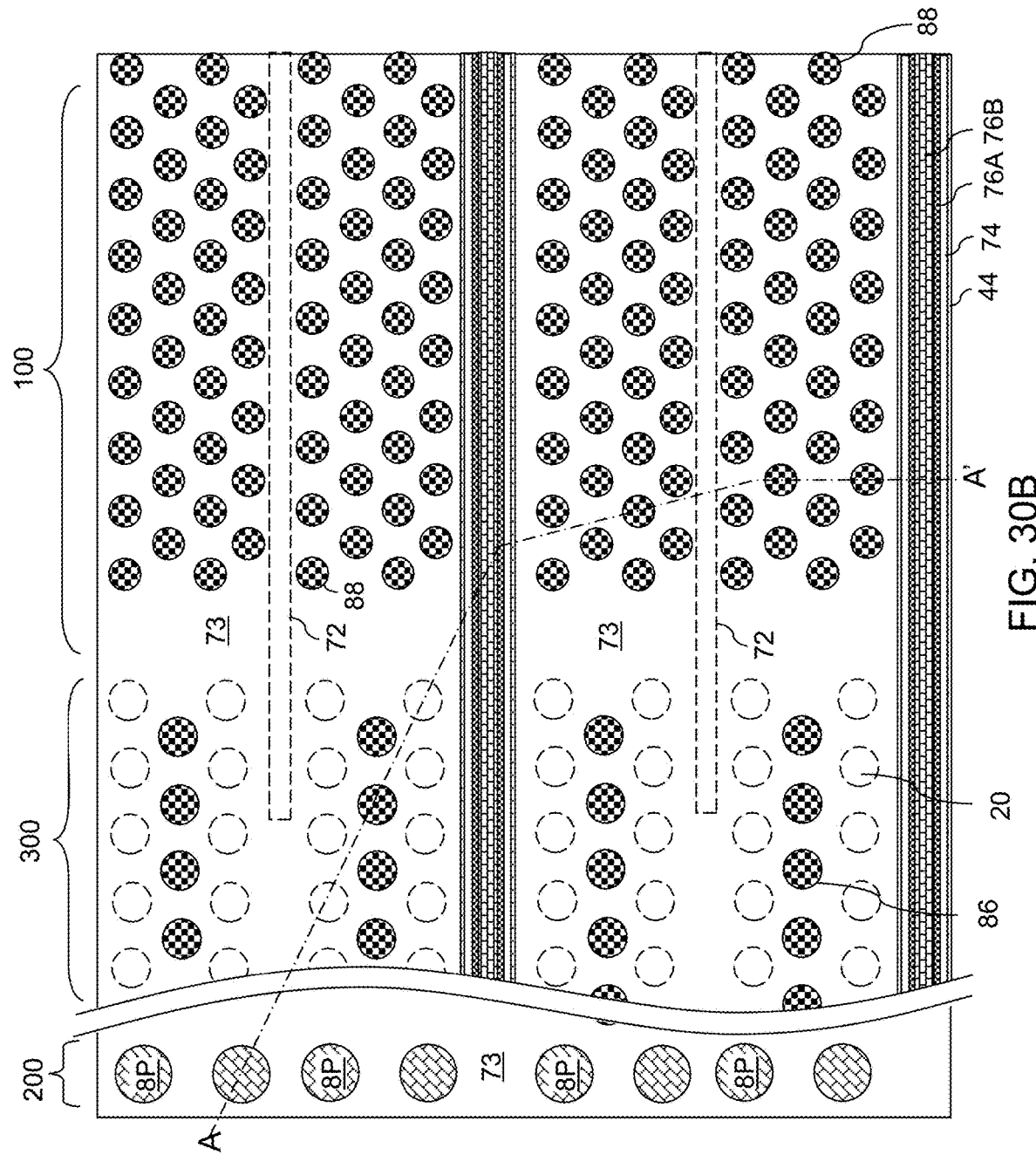
FIG. 30B is a top-down view of the first in-process semiconductor chip of FIG. 30A. The vertical plane A-A' is the plane of the schematic vertical cross-sectional view of FIG. 30A.

Referring to FIGS. 30A and 30B, additional contact via structures (88, 86, 8P) are formed through the contact level dielectric layer 73, and optionally through the retro-stepped dielectric material portion 65. For example, drain contact via structures 88 are formed through the contact level dielectric layer 73 on each drain region 63. Word line contact via structures 86 are formed on the electrically conductive layers 46 through the contact level dielectric layer 73, and through the retro-stepped dielectric material portion 65. Optional peripheral device contact via structures 8P are formed through the retro-stepped dielectric material portion 65 directly on respective nodes of the peripheral devices 610 (if present).

Figure 31A:
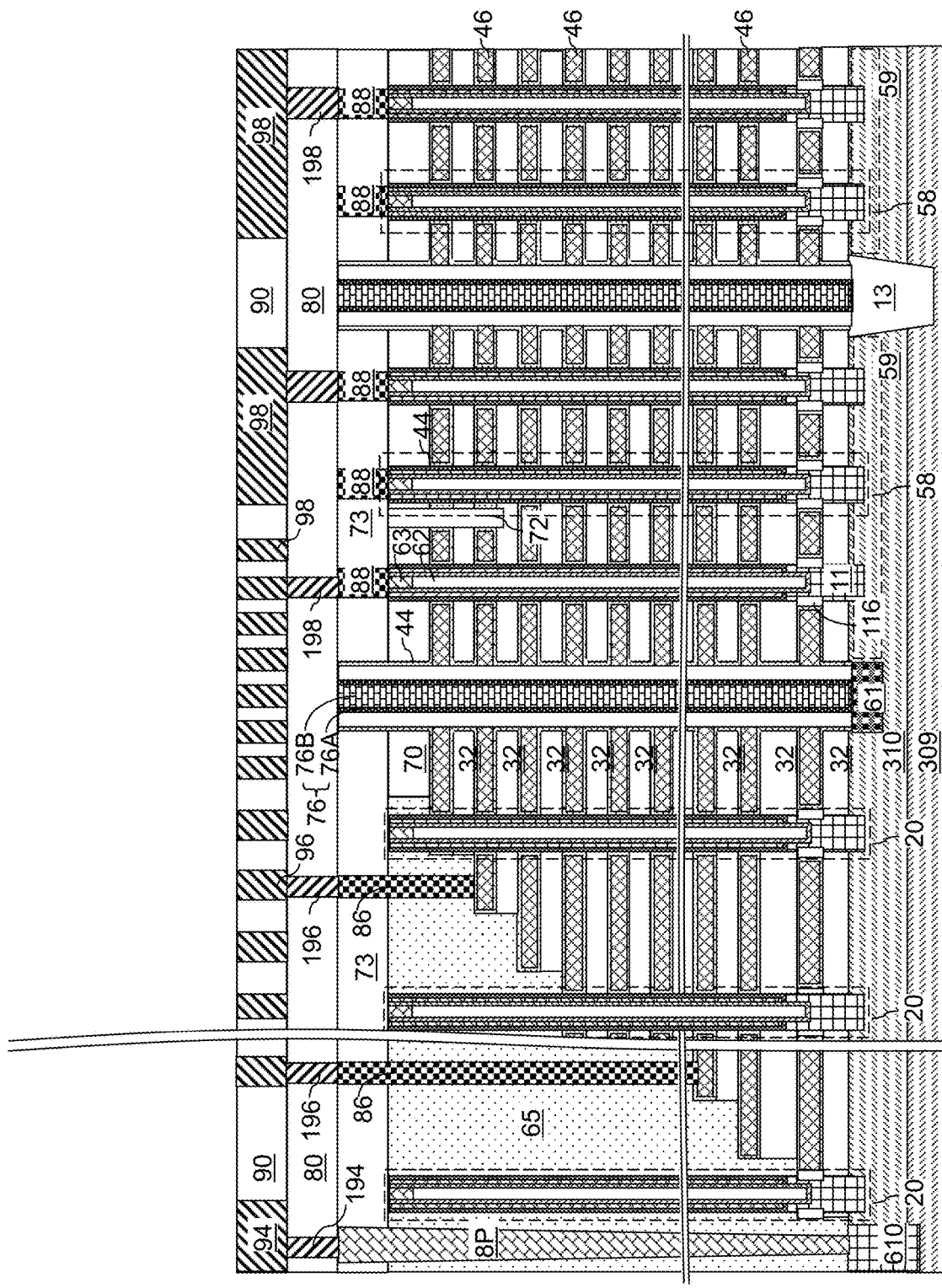
FIG. 31A is a schematic vertical cross-sectional view of the first in-process semiconductor chip after formation of first line level metal interconnect structures according to an embodiment of the present disclosure.
Figure 31B:
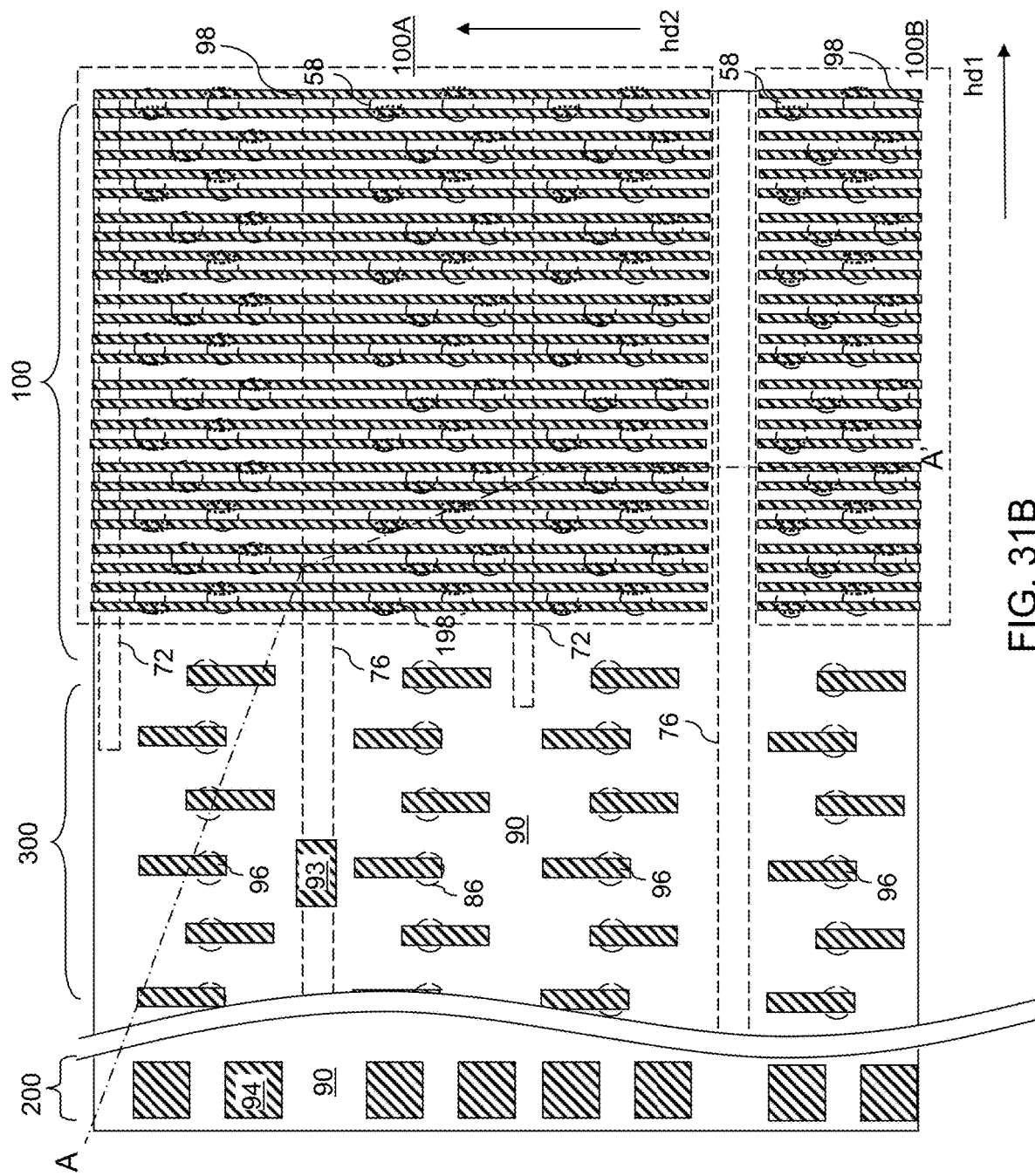
FIG. 31B is a partial see-through top-down view of the first in-process semiconductor chip of FIG. 31A. The vertical plane A-A' is the plane of the schematic vertical cross-sectional view of FIG. 31A.

Referring to FIGS. 31A and 31B, a via level dielectric layer 80 is formed over the contact level dielectric layer 73. Various contact via structures (198, 196, 194) are formed through the via level dielectric layer 75, contact level dielectric layer 73, and optionally through the retro-stepped dielectric material portion 65. For example, bit line connection via structures 198 are formed on the drain contact via structures 88, word line connection via structures 196 are formed on the word line contact via structures 86, and optional peripheral extension via structures 194 are formed on the peripheral device contact via structures 8P (if present).

A first line level dielectric layer 90 is deposited over the via level dielectric layer 80. Various metal line structures (98, 96, 94, 93) are formed in the first line level dielectric layer 90. The metal line structures (98, 96, 94, 93) are herein referred to as first line level metal interconnect structures. The various metal line structure (98, 96, 94, 93) include bit lines 98 that are electrically connected to a respective plurality of the drain contact via structures 88 (for example, through the bit line connection via structures 198), a word-line-connection metal interconnect lines 98 that are electrically connected to a respective one of the word line contact via structures 86 (for example, through a bit line connection via structure 198), and optional peripheral metal interconnect lines 94 that are electrically connected to a respective one of the peripheral device contact via structures 8P (for example, through a peripheral extension via structure 194). Source connection lines 93 shown in FIG. 31B can provide electrical connection to a respective one of the backside contact via structures 76.

The array isolation dielectric structures 13 can provide electrical isolation between neighboring pairs of horizontal semiconductor channels 59 that belong to different memory block regions. The bit lines 98 are electrically connected to drain regions 63 located over upper ends of a respective subset of the vertical semiconductor channels 60 in the memory stack structures 55 in the memory block region(s) 100. In one embodiment, the memory stack structures 55 are arranged in rows that extend along the first horizontal direction (e.g., word line direction) hd1, and the bit lines 98 laterally extend along the second horizontal direction (e.g., bit line direction) hd2. The memory block region 100 can include a first memory block region 100A including a first three-dimensional array of memory devices, a second memory block region 100B including a second three-dimensional array of memory devices, and a third memory block region (not shown) including a third three-dimensional array of memory devices.

Referring to FIG. 32, a first semiconductor chip 1000 is provided by performing additional processing steps on the in-process semiconductor chip of FIGS. 31A and 31B. Specifically, additional metal interconnect structures 820 embedded in additional interconnect level dielectric layers 150 are formed. In an illustrative example, the additional interconnect level dielectric layers 150 can include a first via level dielectric layer 110, a second line level dielectric layer 120, a second via level dielectric layer 130, and a metallic pad structure level dielectric layer 140. The metal interconnect structures 820 can include first metal via structures 108 embedded in the first via level dielectric layer 110, second metal line structures 118 embedded within the second line level dielectric layer 120, second metal via structures 128 embedded in the second via level dielectric layer 130, and metallic pad structures 138 embedded in the metallic pad structure level dielectric layer 140. While the additional interconnect level dielectric layers 150 are illustrated as including the first via level dielectric layer 110, the second line level dielectric layer 120, the second via level dielectric layer 130, and the metallic pad structure level dielectric layer 140, embodiments are expressly contemplated herein in which the additional interconnect level dielectric layers 150 include a different number and/or different combinations of dielectric material layers. The first semiconductor chip 10000 is a memory chip including three-dimensional arrays of memory elements.

In one embodiment, the metal interconnect structures 820 can include memory-chip-side connection paths (821, 822). The memory-chip-side connection paths (821, 822) can include multiple pairs of a first memory-chip-side connection path 821 and a second memory-chip-side connection path 822 that are spaced apart along the second horizontal direction hd2. Each of the first and second memory-chip-side connection paths (821, 822) can comprise a stack of metal interconnect structures (108, 118, 128, 138). The multiple pairs of a first memory-chip-side connection path 821 and a second memory-chip-side connection path 822 can be arranged as a one-dimensional array along the first horizontal direction. Each first memory-chip-side connection path 821 is electrically connected a first portion of a bit line 98 traversing (e.g., located within) the first memory block region 100A, and the second memory-chip-side connection path 822 is electrically connected to second portion of the bit line 98 traversing the second memory block region 100B. The first portion of the bit line 98 and the second portion of the bit line 98 can extend along the second horizontal direction hd2 and can be aligned along the first horizontal direction hd1. Thus, the first portion of the bit line 98 and the second portion of the bit line 98 comprise two portions of a bit line that is cut over the boundary between the first memory block region 100A and the second memory block region 100B. Additional memory-chip-side connection paths can be formed at the boundaries between neighboring pairs of memory block regions. For example, multiple pairs of additional memory-chip-side connection paths (not shown) can be provided in the first semiconductor chip 1000. Each of the additional memory-chip-side connection paths can be embodied as a respective stack of metal interconnect structures (108, 118, 128, 138), and can be connected to an end portion of a respective bit line 98.

Figure 33:
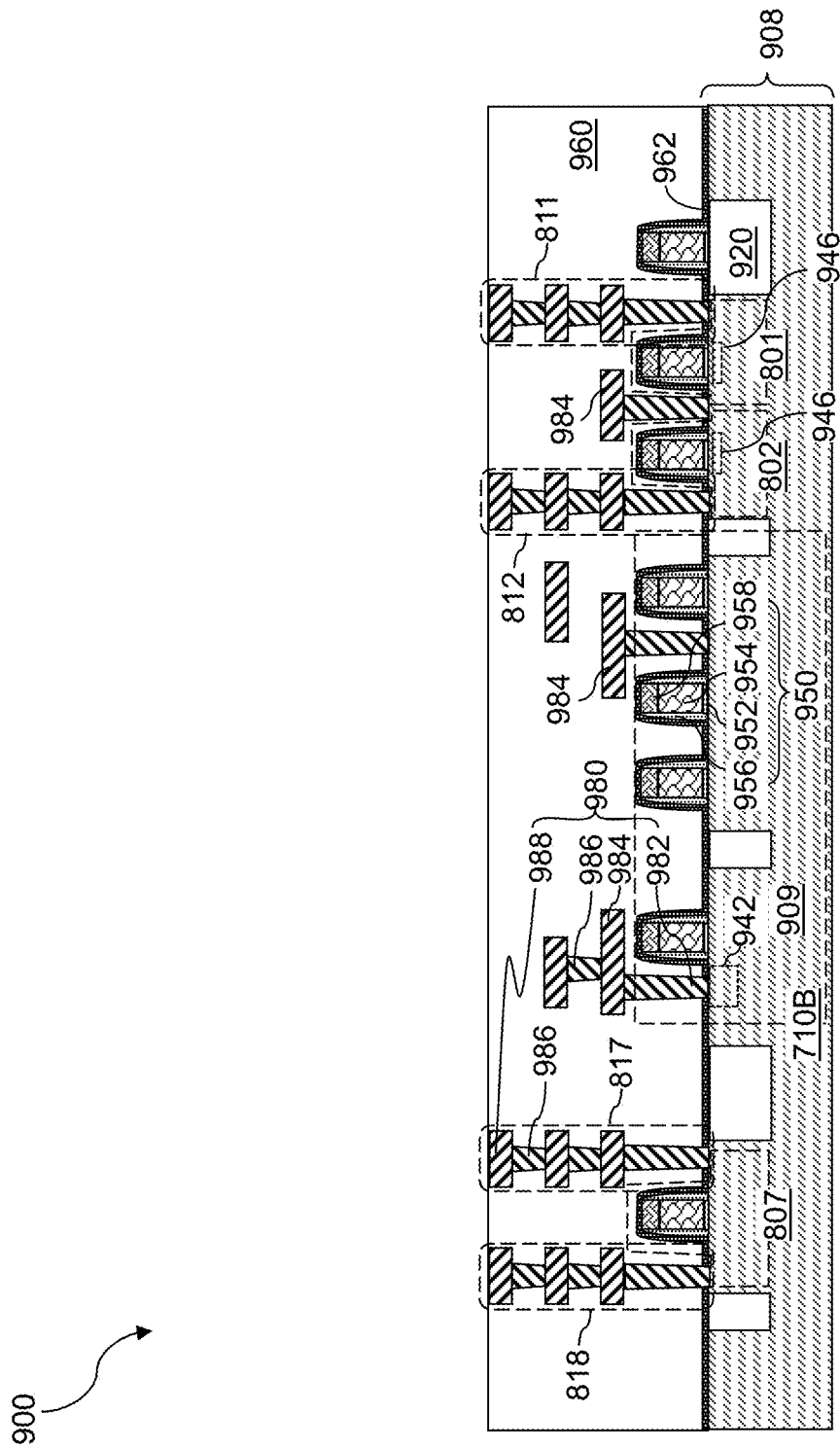
FIG. 33 is a schematic vertical cross-sectional view of a second semiconductor chip according to an embodiment of the present disclosure.

Referring to FIG. 33, a second semiconductor chip 900 is provided. The second semiconductor chip 900 includes a peripheral circuitry for operation of the three-dimensional memory arrays in the first semiconductor chip 1000. For example, the second semiconductor chip 900 includes a sense amplifier 710B. The peripheral circuitry can include a word line decoder circuitry, a word line switching circuitry, a bit line decoder circuitry, a bit line sensing and/or switching circuitry, a power supply/distribution circuitry, a data buffer and/or latch, or any other semiconductor circuitry that can be implemented outside a memory array structure for operation of a memory device.

The second semiconductor chip 900 can include a substrate 908, which can be a semiconductor substrate. The substrate 908 can include a substrate semiconductor layer 909. The substrate semiconductor layer 909 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

Shallow trench isolation structures 920 are formed in an upper portion of the substrate semiconductor layer 909 to provide electrical isolation between semiconductor devices of the sense amplifier. The sense amplifier can include, for example, field effect transistors including respective transistor active regions 942 (i.e., source regions and drain regions), a channel 946, and gate structures 950. The field effect transistors may be arranged in a CMOS configuration. Each gate structure 950 can include, for example, a gate dielectric 952, a gate electrode 954, a dielectric gate spacer 956 and a gate cap dielectric 958. The semiconductor devices can also include word line switching devices for electrically biasing word lines of three-dimensional memory structures located in the first semiconductor chip 1000.

Dielectric material layers, which are herein referred to as support-chip dielectric layers 960, are formed over the semiconductor devices. A support-chip dielectric liner 962 (such as a silicon nitride liner that blocks diffusion of mobile ions and/or apply appropriate stress to underlying structures) may be deposited before formation of the support-chip dielectric layers 960. Support-chip metal interconnect structures 980 are embedded within the support-chip dielectric layers 960. The support-chip metal interconnect structures 980 can include various device contact via structures 982 (e.g., source and drain electrodes which contact the respective source and drain nodes of the device or gate electrode contacts), interconnect-level metal line structures 984, interconnect-level metal via structures 986, and metallic pad structures 988 that are configured to function as bonding pads.

A pair of a first transistor (e.g., first switch) 801 and a second transistor (e.g., second switch) 802 are electrically connected to the sense amplifier through a respective set of sense amplifier interconnection structures 288 embedded in the support-chip dielectric layers 960. Each set of sense amplifier interconnection structures 288 is a subset of the support-chip metal interconnect structures 980, and can provide an electrical connection between an input node of a sense amplifier unit and a node of a first transistor 801 and a second transistor 802 (such as a shared source region or a shared drain region of a CMOS).

In one embodiment, the support-chip metal interconnect structures 980 can include support-chip-side connection paths (811, 812, 817, 818). The support-chip-side connection paths (811, 812, 817, 818) can include multiple pairs of a first support-chip-side connection path 811 and a second support-chip-side connection path 812. Each of the first and second support-chip-side connection paths (811, 812) comprise stack of metal interconnect structures (982, 984, 986, 988). The multiple pairs of a first support-chip-side connection path 811 and a second support-chip-side connection path 812 are arranged as a one-dimensional array having a same periodicity as a corresponding one-dimensional array of multiple pairs of a first memory-chip-side connection path 821 and a second memory-chip-side connection path 822 in the first semiconductor chip 1000. Each first support-chipside connection path 811 is electrically connected a node of a respective first switch 801, and each second support-chip-side connection path 812 is electrically connected to a node of a respective second switch 802.

In one embodiment, the support-chip-side connection paths (811, 812, 817, 818) can include multiple pairs of a third support-chip-side connection path 817 and a fourth support-chip-side connection path 818. Each of the third and fourth support-chip-side connection paths (817, 818) comprise a stack of metal interconnect structures (982, 984, 986, 988). The multiple pairs of a third support-chip-side connection path 817 and a fourth support-chip-side connection path 818 can be arranged as a one-dimensional array having a same periodicity as a corresponding one-dimensional array of multiple pairs of a third memory-chip-side connection path and a fourth memory-chip-side connection path in the first semiconductor chip 1000. Each third support-chip-side connection path 817 is electrically connected a first node of a respective third switch 807 (which can be a field effect transistor), and each fourth support-chip-side connection path 818 is electrically connected to a second node of the third switch 807.

Figure 34:
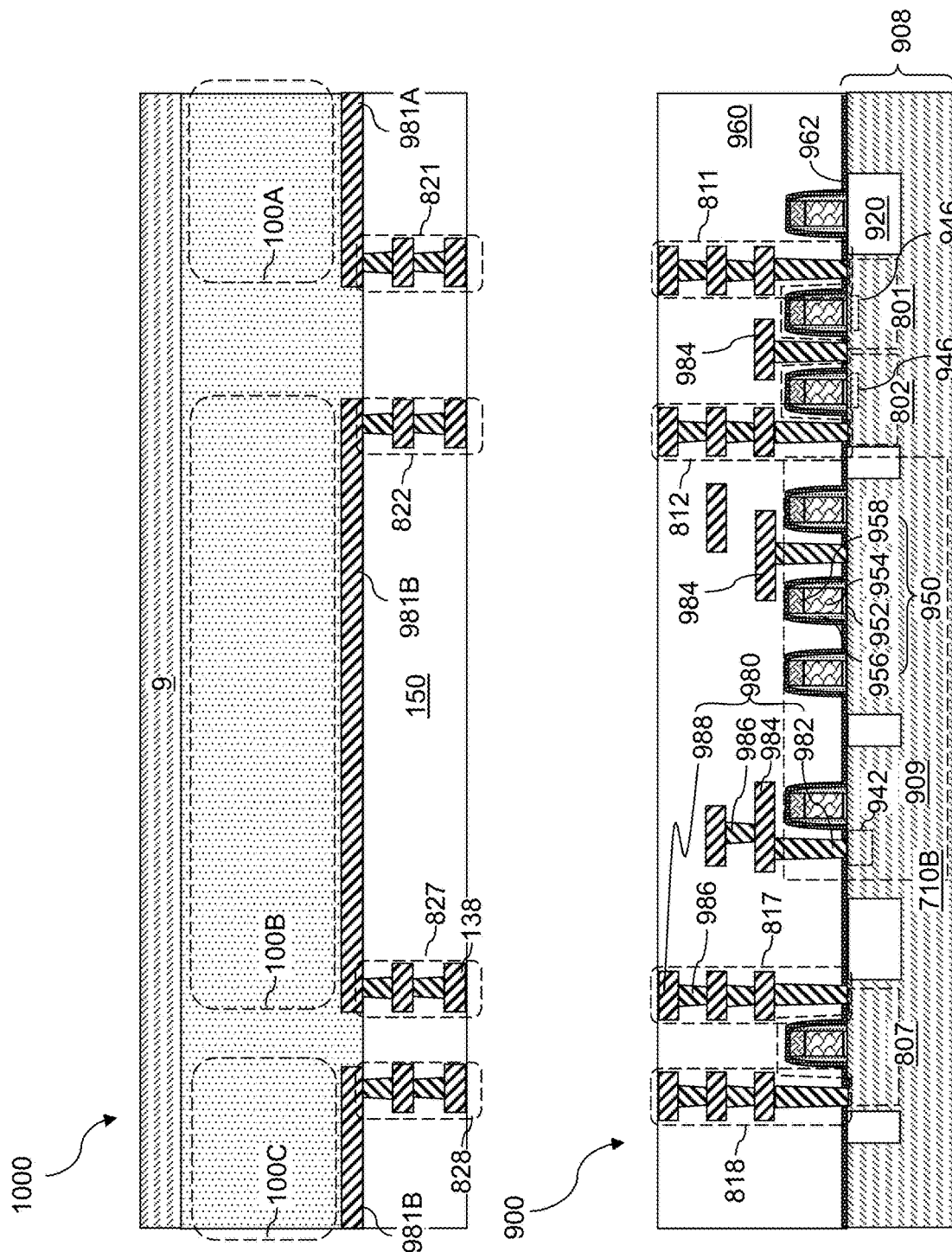
FIG. 34 is a schematic vertical cross-sectional view of the first semiconductor chip and the second semiconductor chip after alignment and before bonding according to an embodiment of the present disclosure.

Referring to FIG. 34, the first semiconductor chip 1000 and the second semiconductor chip 900 are positioned such that the metallic pad structures 988 of the support-chip-side connection paths (811, 812, 817, 818) face metallic pad structures 138 of the memory-chip-side connection paths (821, 822, 827, 828). In one embodiment, the first semiconductor chip 1000 and the second semiconductor chip 900 can be designed such that the physically exposed surfaces of the support-chip-side connection paths (811, 812, 817, 818) in the second semiconductor chip 900 has a mirror image pattern of the pattern of the physically exposed surfaces of the memory-chip-side connection paths (821, 822, 827, 828) in the first semiconductor chip 1000. In this case, the first semiconductor chip 1000 and the second semiconductor chip 900 can be aligned such that each first support-chip-side connection path 811 faces a first memory-chip-side connection path 821, each second support-chip-side connection path 812 faces a second memory-chip-side connection path 822, each third support-chip-side connection path 817 faces a third memory-chip-side connection path 827, and each fourth support-chip-side connection path 818 faces a fourth memory-chip-side connection path 828.

Figure 35A:
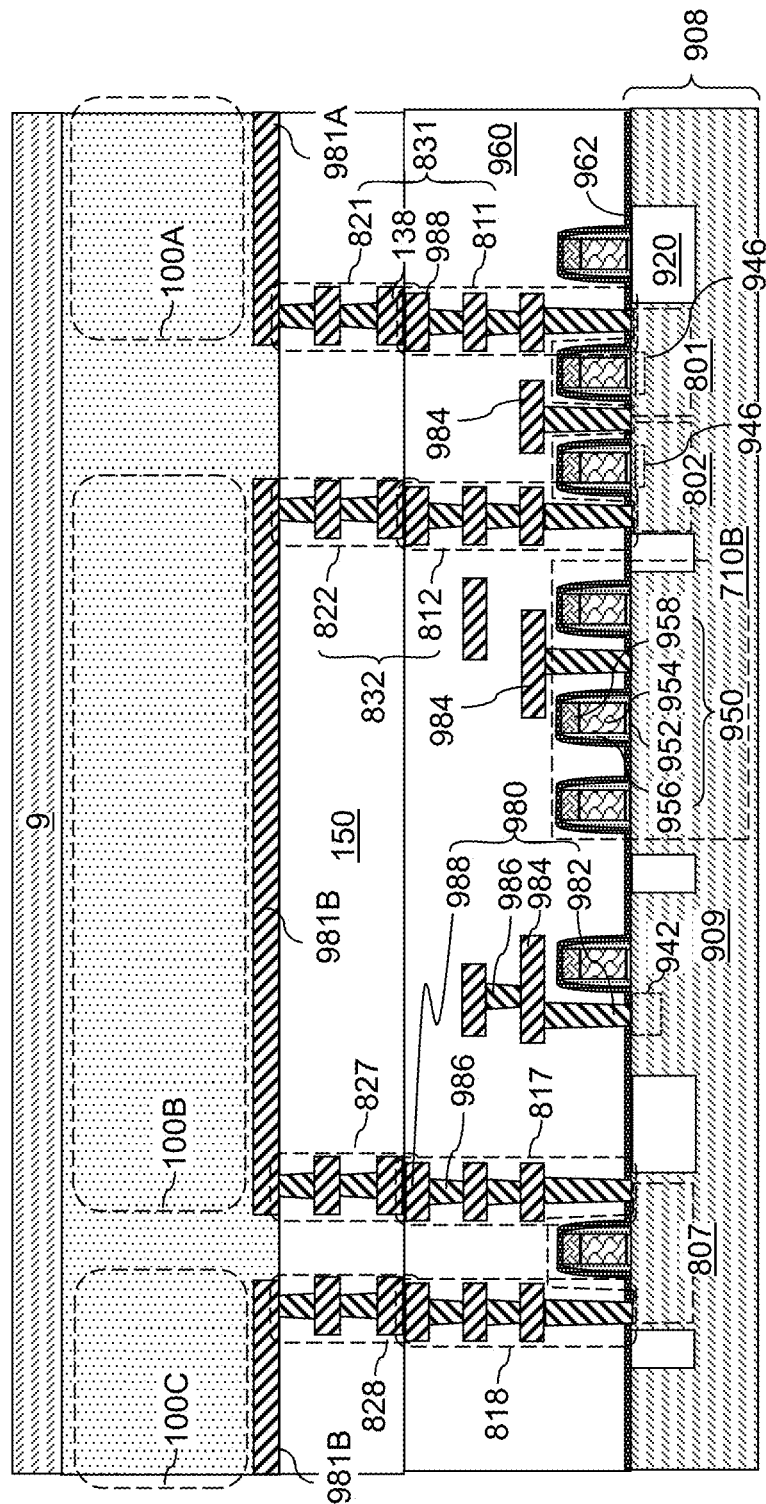
FIG. 35A is a schematic vertical cross-sectional view of a bonded assembly of the first semiconductor chip and the second semiconductor chip according to an embodiment of the present disclosure.
Figure 35B:
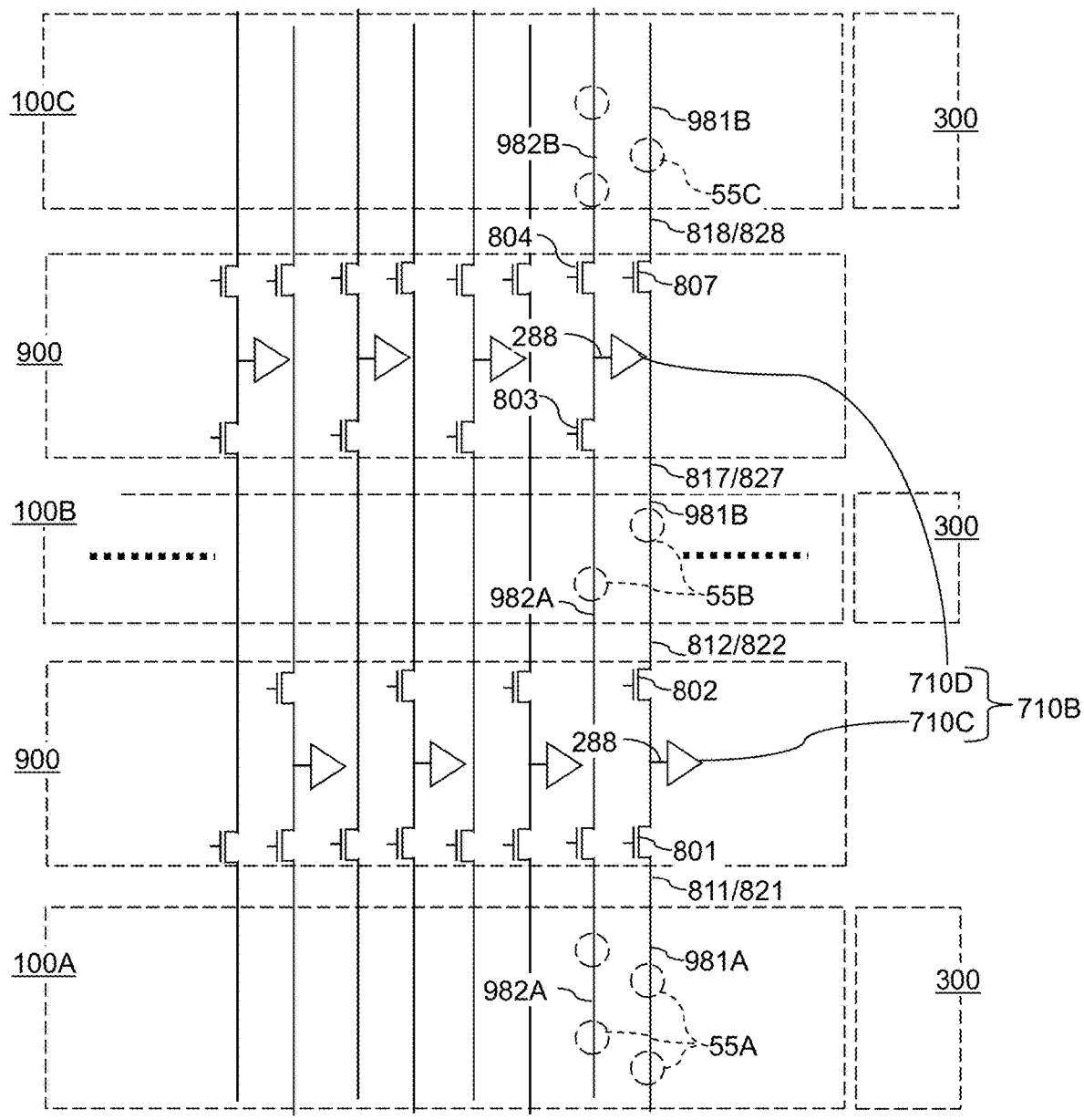
FIG. 35B is a schematic configuration of a circuit of the bonded assembly of FIG. 35A.
Figure 35C:
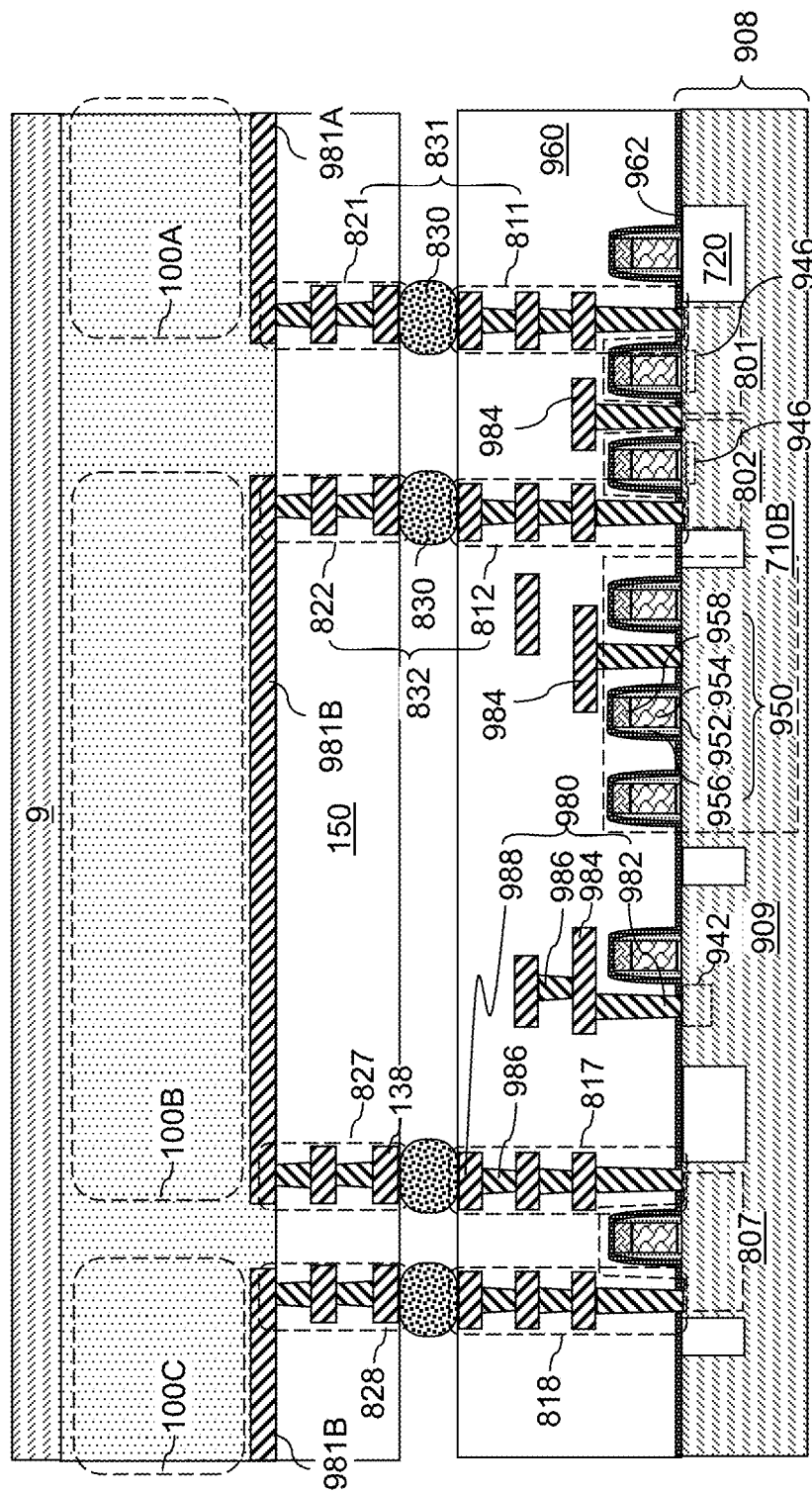
FIG. 35C is a schematic vertical cross-sectional view of an alternative configuration of the bonded assembly of the first semiconductor chip and the second semiconductor chip according to an embodiment of the present disclosure.

Referring to FIGS. 35A-35C, the first semiconductor chip 1000 and the second semiconductor chip 900 are bonded to each other by metal-to-metal bonding as illustrated in FIG. 35A, or through an array of solder material portions 830 as illustrated in FIG. 35C.

In the case of metal-to-metal bonding, facing pairs of a metallic pad structure 138 of a memory-chip-side connection path (821, 822, 827, 828) and a metallic pad structure 988 of a support-chip-side connection path (811, 812, 817, 818) can brought to direct contact with each other and can be subjected to an elevated temperature to induce material diffusion across the interfaces between adjoined pairs of metallic pad structures (138, 988). The interdiffusion of the metallic material can induce bonding between each adjoined pairs of metallic pad structures (138, 988). In addition, the support-chip dielectric layers 960 and the interconnect level dielectric layers 150 can include a dielectric material (such as a silicate glass material) that can be bonded to each other. In this case, physically exposed surfaces of the support-chip dielectric layers 960 and the interconnect level dielectric layers 150 can be brought to direct contact with each other and can be subjected to thermal annealing to provide additional bonding.

In case an array of solder material portions 830 is used to bond the first semiconductor chip 1000 to the second semiconductor chip 900, then a solder material portion 830 (such as a solder ball) is applied to each of the metallic pad structures 138 of the first semiconductor chip 1000, and/or to each of the metallic pad structures 988 of the second semiconductor chip 900. The first semiconductor chip 1000 and the second semiconductor chip 900 are bonded to each other through an array of solder material portions 830 by reflowing the solder material portions 830 while each solder material portion 830 is contacted by a respective pair of a metallic pad structure 138 of the first semiconductor chip 1000 and a metallic pad structure 988 of the second semiconductor chip 900.

The bonded structure of the first semiconductor chip 1000 and the second semiconductor chip 900 can include a circuit, as shown in FIG. 35B. The circuit includes a first memory block region 100A and a second memory block region 100B located in a first semiconductor chip 1000, a first switch 801 located in a second semiconductor chip 900 that is bonded to the first semiconductor chip 1000, a second switch 802 located in the second semiconductor chip 900, a first portion 981A of a first bit line 981 traversing the first memory block region 100A and electrically connected to the first switch 801, and a second portion 981B of the first bit line 981 traversing the second memory block region 100B and electrically connected to the second switch 802. A sense amplifier (i.e., a sense amplifier circuit) 710B is electrically connected to the first portion 981A of the first bit line 981 through the first switch 801, and is electrically connected to the second portion 981B of the first bit line 981 through the second switch 802. The individual sense amps 710C and 710D of the sense amplifier circuit 710B are also shown using the amplifier symbols in FIG. 35B.

In one embodiment, the sense amplifier 710B is located in the second semiconductor chip 900. The circuit can further comprise a first electrically conductive path 831 electrically connecting the first switch 801 and the first portion 981A of the first bit line 981 through the first semiconductor chip 1000 and the second semiconductor chip 900, and a second electrically conductive path 832 electrically connecting the second switch 802 and the second portion 981B of the first bit line 981 through the first semiconductor chip 1000 and the second semiconductor chip 900. The first electrically conductive path (811, 821) can include a first support-chip-side connection path 811 located in the second semiconductor chip 900 and a first memory-chip-side connection path 821 located in the first semiconductor chip 1000. The second electrically conductive path (812, 822) can include a second support-chip-side connection path 812 located in the second semiconductor chip 900 and a second memory-chip-side connection path 822 located in the first semiconductor chip 1000.

In one embodiment, the first electrically conductive path (811, 821) comprises a first bonding structure (such as a combination of a metallic pad structure 138 of the first semiconductor chip 1000 and a metallic pad structure 988 of the second semiconductor chip 900 and an optional solder material portion 830) located at an interface between the first semiconductor chip 1000 and the second semiconductor chip 900. The second electrically conductive path (812, 822) comprises a second bonding structure (such as a combination of a metallic pad structure 138 of the first semiconductor chip 1000 and a metallic pad structure 988 of the second semiconductor chip 900 and an optional solder material portion 830) located at the interface between the first semiconductor chip 1000 and the second semiconductor chip 900.

In one embodiment, the sense amplifier 710B is electrically connected to the first portion 981A of the first bit line 981 through both the first electrically conductive path (811, 821) and the first switch 801, and the sense amplifier 710B is electrically connected to the second portion 981B of the first bit line 981 through both the second electrically conductive path (812, 822) and the second switch 802.

In one embodiment, the first switch 801 comprises a first transistor having a first channel 946 in a semiconductor substrate 908 of the second semiconductor chip 900 and a first gate electrode 954 located between the first channel 946 and the first bonding structure {(138, 988, 130) or (138, 988)} in the first conductive path. The second switch 802 comprises a second transistor having a second channel 946 in the semiconductor substrate 908 of the second semiconductor chip 900 and a second gate electrode 954 located between the second channel 846 and the second bonding structure{(138, 988, 830) or (138, 988)} in the second conductive path.

The circuit can comprise a third memory block region 100C, a third switch 803, a fourth switch 804, a first portion 982A of a second bit line 982 traversing the first and second memory block regions (100A, 100B) and electrically connected to the sense amplifier 710B through the third switch 803, and a second portion 982B of the second bit line 892 traversing the third memory block region 100C and electrically connected to the sense amplifier 710B through the fourth switch 804.

In one embodiment, the second portion 981B of the first bit line 981 also traverses the third memory block region 100C, and an additional switch 807 is electrically connected to the second portion 981B of the first bit line 981 between the second and the third memory block regions (100B, 100C), i.e., between a first segment of the second portion 981B of the first bit line 981 located in the second memory block region 100B and a second segment of the second portion 981B of the first bit line 981 located in the third memory block region 100C. The additional switch 807 can be located in the second semiconductor chip 900, and can be connected to the two segments of the second portion 981B of the first bit line 981 via a third electrically conductive path (817, 827) and a fourth electrically conductive path (818, 828). The third electrically conductive path (817, 827) can connect the additional switch 807 to the first segment of the second portion 981B of the first bit line 981 located in the second memory block region 100B. The fourth electrically conductive path (818, 828) can connect the additional switch 807 to the second segment of the second portion 981B of the first bit line 981 located in the third memory block region 100C. The third electrically conductive path (817, 827) can include a third support-chip-side connection path 817 located in the second semiconductor chip 900 and a third memory-chip-side connection path 827 located in the first semiconductor chip 1000. The fourth electrically conductive path (818, 828) can include a fourth support-chip-side connection path 818 located in the second semiconductor chip 900 and a fourth memory-chip-side connection path 828 located in the first semiconductor chip 1000.

The bonded structure of the first semiconductor chip 1000 and the second semiconductor chip 900 can include a device. The device can include first memory stack structures 55 extending through a first alternating stack of first insulating layers 32 and first electrically conductive layers 46 in a first memory block region 100A of a first semiconductor chip 1000, and second memory stack structures 55 extending through a second alternating stack of second insulating layers 32 and second electrically conductive layers 46 in a second memory block region 100B of the first semiconductor chip 1000. Each of the first and second memory stack structures 55 comprises a respective vertical semiconductor channel 60 and a respective memory film 50. A first switch 801 is located in a second semiconductor chip 900 that is bonded to the first semiconductor chip 1000 and electrically connected to the first memory stack structures 55 via a first portion 981A of a first bit line 981 in the first semiconductor chip 1000, while a second switch 802 is located in the second semiconductor chip 900 and electrically connected to the second memory stack structures 55 via a second portion 981B of the first bit line 981 in the first semiconductor chip 1000. The sense amplifier 710B is located in the second semiconductor chip 900 and is electrically connected to the first switch 801 and to the second switch 802.

In one embodiment, the first switch 801 comprises a first field effect transistor electrically connected to the sense amplifier 710B through first metal interconnect structures (such as a set of sense amplifier interconnection structures 288) in the second semiconductor chip 900. The second switch 802 comprises a second field effect transistor connected to the sense amplifier 710B through second metal interconnect structures (such as another set of sense amplifier interconnection structures 288) in the second semiconductor chip 900.

In one embodiment, the device can include a first bonding structure (such as a pair of metallic pad structures (138, 988) and an optional solder material portion 830) located at an interface between the first semiconductor chip 1000 and the second semiconductor chip 900. The first bonding structure {(138, 988, 130) or (138, 988)} electrically connects the first portion 981A of the first bit line 981 and the first switch 801. A second bonding structure (such as a pair of metallic pad structures (138, 988) and an optional solder material portion 830) is located at an interface between the first semiconductor chip 1000 and the second semiconductor chip 900. The second bonding structure {(138, 988, 130) or (138, 988)} electrically connects the second portion 981B of the first bit line 981 and the second switch 802.

In one embodiment, the device can include: third memory stack structures 55 extending through a third alternating stack of third insulating layers 32 and third electrically conductive layers 42 in a third memory block region 100C of the first semiconductor chip 1000; a third switch 803 comprising a third transistor located in the second semiconductor chip 900; a fourth switch 804 comprising a fourth transistor located in the second semiconductor chip 900; a first portion 982A of a second bit line 982 traversing the first and second memory block regions (100A, 100B) and electrically connected to the third transistor 803; and a second portion 982B of the second bit line 982 traversing the third memory block region 100C and electrically connected to the fourth transistor 804.

In one embodiment, the second portion 981B of the first bit line 981 also traverses the third memory block region 100C. The sense amplifier 710B is electrically connected to the first portion 982A of the second bit line 982 through the third transistor 803. The sense amplifier 710B is electrically connected to the second portion 982B of the second bit line 982 through the fourth transistor 804.

In one embodiment, the device comprises an additional switch 807 electrically connected to the sense amplifier 710B through the second portion 981B of the first bit line 981.

In one embodiment, the first semiconductor chip 1000 comprises a first semiconductor substrate (309, 301). The first portion 981A of the first bit line 981 and the second portion 981B of the first bit line 981 are located between the first semiconductor substrate (309, 310) and an interface between the first semiconductor chip 1000 and the second semiconductor chip 900 (i.e., within the first semiconductor chip 1000). The first memory stack structures 55 and the second memory stack structures 55 are located between the first bit line 981 and the first semiconductor substrate (309, 310). The first switch 801 comprises a first transistor having a first channel 946 in a second semiconductor substrate 908 in the second semiconductor chip 900 and a first gate electrode 954 located between the first channel 946 and the first bit line 981. The second switch 802 comprises a second transistor having a second channel 946 in the second semiconductor substrate 908 and a second gate electrode 954 located between the second channel 946 and the first bit line 981.

In one embodiment, the device comprises a three-dimensional NAND memory device. In one embodiment, the above described device is located in a bonded chip assembly.

According to an aspect of the present disclosure, the device of the present disclosure is operated by turning on the first switch 801 while the second switch 802 is turned off, and providing a first current from the sense amplifier 710B to the first portion 981A of the first bit line 981 without providing the first current from the sense amplifier 710B to the second portion 981B of the first bit line 981 to perform a read operation, a write operation, or an erase operation on at least one memory cell located in the first memory block 100A. Subsequently, the first switch 801 is turned off and the second switch 802 is turned on. A second current is flowed from the sense amplifier 710B to the second portion 981B of the first bit line 981 (such as a first segment of the second portion 981B of the first bit line 981 that traverses the second memory block 100B) without providing the second current from the sense amplifier 710B to the first portion 981A of the first bit line 981 to perform the read operation, the write operation, or the erase operation on at least one memory cell located in the second memory block 100B. The additional switch 807 is turned off while the read operation, the write operation, or the erase operation on at least one memory cell located in the second memory block 100B in order to disconnect the second segment of the second portion 981B of the first bit line 981 that traverses the third memory block 100C. When memory elements in the third memory block 100C are to be accessed, the first switch 801 is turned off, the second switch 802 is turned on, and the additional switch 807 is turned on. A second current is flowed from the sense amplifier 710B to the first segment of the second portion 981B of the first bit line 981 and to the second segment of the second portion 981B of the first bit line 981 through the additional switch 807 and through the third electrically conductive path (817, 827) and the fourth electrically conductive path (818, 828). The RC delay for accessing the third memory block 100C can be greater than the RC delay for accessing the second memory block 100B. However, the RC delay for accessing the third memory block 100C can be smaller than the RC delay that would be caused if the sense amplifier were to be placed at an end of the first bit line 981. Thus, dividing the first bit line 981 into multiple portions reduces the overall RC delay.

The mechanism for reduction in RC delay in the first bit line 981 applies to each bit line 98 in the device. Multiple instances of a combination of the first bit line 981 and the second bit line 982 can be repeated along the horizontal direction that is perpendicular to the lengthwise direction of the first and second bit lines (981, 982). In one embodiment, each odd numbered bit line can have the same configuration as the first bit line 981, and each even numbered bit line can have the same configuration as the second bit line 982. The laterally alternating configuration for the bit line connection can minimize inter-bit line signal coupling during sensing by reducing the capacitive coupling among adjacent bit lines 98.

According to an aspect of the present disclosure, a circuit is provided, which comprises: a first memory block region 100A located in a first semiconductor chip 1000; a second memory block region 100B located in the first semiconductor chip 1000; a first switch 801 located in a second semiconductor chip 900 that is bonded to the first semiconductor chip 1000; a second switch 802 located in the second semiconductor chip 900; a first portion 981A of a first bit line 981 traversing the first memory block region 100A, located in the first semiconductor chip 1000, and electrically connected to the first switch 801; a second portion 981B of the first bit line 981 traversing the second memory block region 100B, located in the first semiconductor chip 1000, and electrically connected to the second switch 802; and a sense amplifier 710B located in the second semiconductor chip 900 and electrically connected to the first portion 981A of the first bit line 981 through the first switch 801, and is electrically connected to the second portion 981B of the first bit line 981 through the second switch 802.

In one embodiment, the device includes a first bonding structure (such as a pair of metallic pad structures (138, 988) and an optional solder material portion 830) located at an interface between the first semiconductor chip 1000 and the second semiconductor chip 900. The first bonding structure electrically connects the first portion 981A of the first bit line 981 and the first switch 801. A second bonding structure (such as a pair of metallic pad structures (138, 988) and an optional solder material portion 830) is located at an interface between the first semiconductor chip 1000 and the second semiconductor chip 900. The second bonding structure electrically connects the second portion 981B of the first bit line 981 and the second switch 802.

Figure 36:
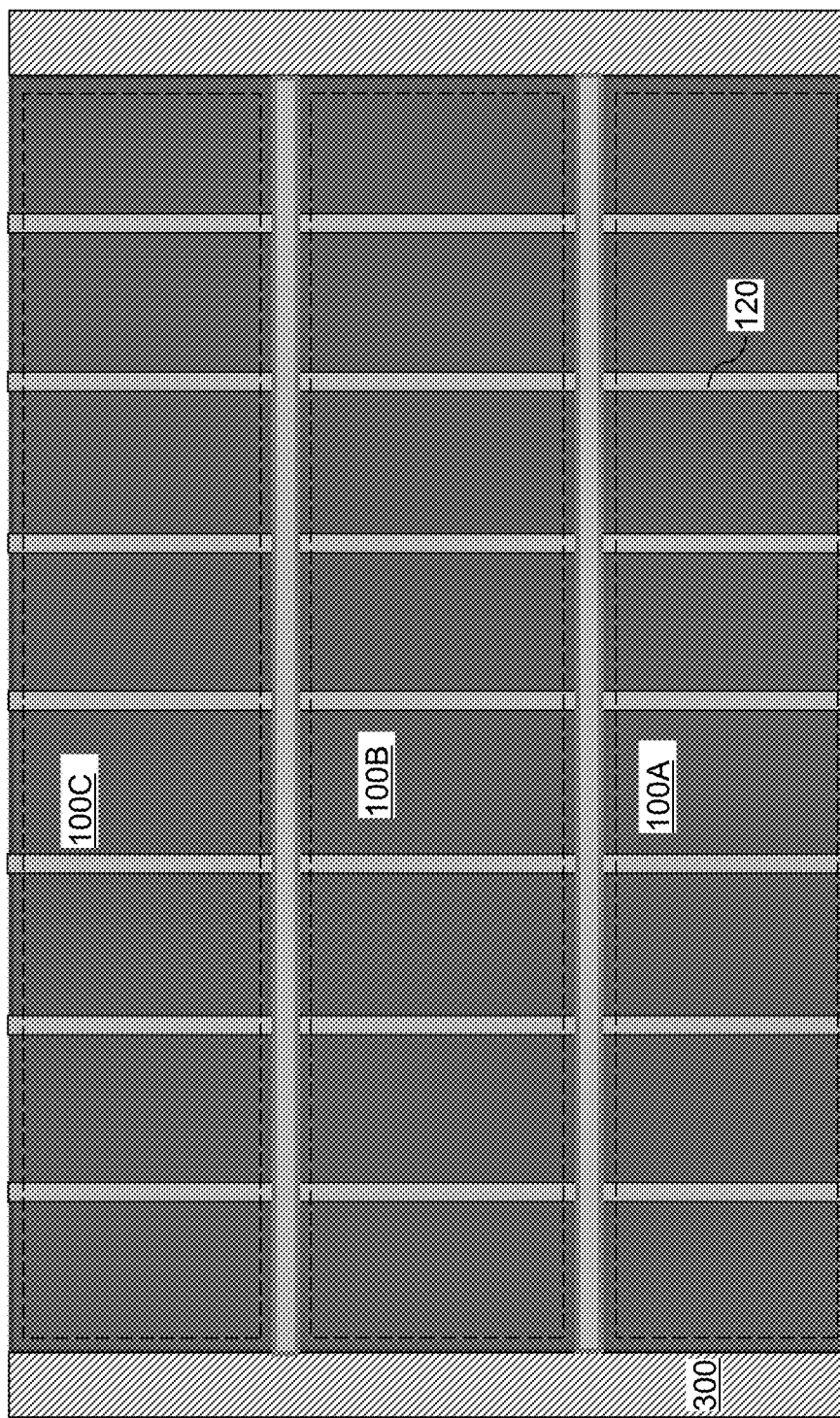
FIG. 36 is a plan view of a configuration of the bonded assembly according to an embodiment of the present disclosure.

FIG. 36 is a plan view of an exemplary configuration of the first semiconductor chip according to an embodiment of the present disclosure. Interconnection regions 120 extending in the bit line direction (hd2) provide additional electrical connections between the semiconductor devices in the second semiconductor chip 900 and various nodes of the three-dimensional memory device in the first semiconductor chip 1000.

The effective shortening of the bit lines 98 by division of the bit lines 98 into multiple portions reduces the RC delay in both the first and second embodiments, as described above with respect to FIG. 19.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A circuit, comprising:
a first memory block region and a second memory block region located in a first semiconductor chip;
a first switch located in a second semiconductor chip configured to bond to the first semiconductor chip;
a second switch located in the second semiconductor chip;
a first portion of a first bit line traversing the first memory block region and electrically connected to the first switch;
a second portion of the first bit line traversing the second memory block region and electrically connected to the second switch; and
a sense amplifier electrically connected to the first portion of the first bit line through the first switch, wherein the sense amplifier is electrically connected to the second portion of the first bit line through the second switch.

2. The circuit of claim 1, wherein the sense amplifier is located in the second semiconductor chip, and the first semiconductor chip comprises a first semiconductor substrate that is vertically spaced from the second semiconductor chip by the first memory block region, the second memory block region, the first portion of the first bit line, and the second portion of the first bit line.

3. The circuit of claim 2, further comprising:
a first electrically conductive path electrically connecting the first switch and the first portion of the first bit line through the first semiconductor chip and the second semiconductor chip; and
a second electrically conductive path electrically connecting the second switch and the second portion of the first bit line through the first semiconductor chip and the second semiconductor chip.

4. The circuit of claim 3, wherein:
the first electrically conductive path comprises a first bonding structure located at an interface between the first semiconductor chip and the second semiconductor chip; and
the second electrically conductive path comprises a second bonding structure located at the interface between the first semiconductor chip and the second semiconductor chip.

5. The circuit of claim 4, wherein:
the sense amplifier is electrically connected to the first portion of the first bit line through both the first electrically conductive path and the first switch; and
the sense amplifier is electrically connected to the second portion of the first bit line through both the second electrically conductive path and the second switch.

6. The circuit of claim 4, wherein:
the first switch comprises a first transistor having a first channel in a semiconductor substrate of the second semiconductor chip and a first gate electrode located between the first channel and the first bonding structure; and
the second switch comprises a second transistor having a second channel in the semiconductor substrate of the second semiconductor chip and a second gate electrode located between the second channel and the second bonding structure.

7. A method of operating the circuit of claim 1, comprising:
turning on the first switch while the second switch is turned off; and
providing a first current from the sense amplifier to the first portion of the first bit line without providing the first current from the sense amplifier to the second portion of the first bit line to perform a read operation, a write operation, or an erase operation on at least one memory cell located in the first memory block.

8. The method of claim 7, further comprising:
turning off the first switch;
turning on second switch; and
providing a second current from the sense amplifier to the second portion of the first bit line without providing the second current from the sense amplifier to the first portion of the first bit line to perform the read operation, the write operation, or the erase operation on at least one memory cell located in the second memory block.

9. The circuit of claim 1, wherein:
the first memory block region comprises a first alternating stack of first insulating layers and first electrically conductive layers;
the second memory block region comprise a second alternating stack of second insulating layers and second electrically conductive layers;
the first portion of the first bit line laterally traverses the first memory block region within the first semiconductor chip between the first alternating stack and the second semiconductor chip; and
the second portion of the first bit line laterally traverses the second memory block region within the first semiconductor chip between the second alternating stack and the second semiconductor chip.

10. The circuit of claim 1, wherein:
the first semiconductor chip comprises a first semiconductor substrate on which the first memory block region and the second memory block region are located;
the second semiconductor chip comprises a second semiconductor substrate on which the first switch and the second switch are located; and
the first semiconductor substrate is vertically spaced from the second semiconductor substrate by the first memory block region and the second memory block region.

11. A circuit, comprising:
a first memory block region and a second memory block region located in a first semiconductor chip;
a first switch located in a second semiconductor chip configured to bond to the first semiconductor chip;
a second switch located in the second semiconductor chip;
a first portion of a first bit line traversing the first memory block region and electrically connected to the first switch;
a second portion of the first bit line traversing the second memory block region and electrically connected to the second switch;
a sense amplifier electrically connected to the first portion of the first bit line through the first switch, wherein the sense amplifier is electrically connected to the second portion of the first bit line through the second switch;
a third memory block region;
a third switch;
a fourth switch;

a first portion of a second bit line traversing the first and second memory block regions and electrically connected to the sense amplifier through the third switch; and a second portion of the second bit line traversing the third memory block region and electrically connected to the sense amplifier through the fourth switch.

12. The circuit of claim 11, wherein:

the second portion of the first bit line also traverses the third memory block region; and an additional switch electrically connected to the second portion of the first bit line between the second and the third memory block regions.

13. A device, comprising:

first memory stack structures extending through a first alternating stack of first insulating layers and first electrically conductive layers in a first memory block region of a first semiconductor chip;

second memory stack structures extending through a second alternating stack of second insulating layers and second electrically conductive layers in a second memory block region of the first semiconductor chip, wherein each of the first and second memory stack structures comprises a respective vertical semiconductor channel and a respective memory film;

a first switch located in a second semiconductor chip that is bonded to the first semiconductor chip and electrically connected to the first memory stack structures via a first portion of a first bit line in the first semiconductor chip;

a second switch located in the second semiconductor chip and electrically connected to the second memory stack structures via a second portion of the first bit line in the first semiconductor chip; and a sense amplifier located in the second semiconductor chip and electrically connected to the first switch and to the second switch.

14. The device of claim 13, wherein:

the first switch comprises a first field effect transistor electrically connected to the sense amplifier through first metal interconnect structures in the second semiconductor chip; and the second switch comprises a second field effect transistor connected to the sense amplifier through second metal interconnect structures in the second semiconductor chip.

15. The device of claim 14, further comprising:

a first bonding structure located at an interface between the first semiconductor chip and the second semiconductor chip, wherein the first bonding structure electrically connects the first portion of the first bit line and the first switch; and a second bonding structure located at an interface between the first semiconductor chip and the second semiconductor chip, wherein the second bonding structure electrically connects the second portion of the first bit line and the second switch.

16. The device of claim 13, wherein:

the first semiconductor chip comprises a first semiconductor substrate;

the first portion of the first bit line and the second portion of the first bit line are located between the first semiconductor substrate and an interface between the first semiconductor chip and the second semiconductor chip;

the first memory stack structures and the second memory stack structures are located between the first bit line and the first semiconductor substrate;

the first switch comprises a first transistor having a first channel in a second semiconductor substrate of the second semiconductor chip and a first gate electrode located between the first channel and the first bit line; and the second switch comprises a second transistor having a second channel in the second semiconductor substrate and a second gate electrode located between the second channel and the first bit line.

17. The device of claim 13, wherein the device comprises a three-dimensional NAND memory device.

18. A bonded chip assembly comprising the device of claim 13.

19. The circuit of claim 13, wherein:

the first portion of the first bit line laterally extends between the first alternating stack and the second semiconductor chip; and the second portion of the first bit line laterally extends between the second alternating stack and the second semiconductor chip.

20. The circuit of claim 13, wherein:

the first semiconductor chip comprises a first semiconductor substrate on which the first alternating stack and the second alternating stack are located;

the second semiconductor chip comprises a second semiconductor substrate on which the first switch and the second switch are located; and the first semiconductor substrate is vertically spaced from the second semiconductor substrate by the first alternating stack and the second alternating stack.

21. A device, comprising:

first memory stack structures extending through a first alternating stack of first insulating layers and first electrically conductive layers in a first memory block region of a first semiconductor chip;

second memory stack structures extending through a second alternating stack of second insulating layers and second electrically conductive layers in a second memory block region of the first semiconductor chip, wherein each of the first and second memory stack structures comprises a respective vertical semiconductor channel and a respective memory film;

a first switch located in a second semiconductor chip that is bonded to the first semiconductor chip and electrically connected to the first memory stack structures via a first portion of a first bit line in the first semiconductor chip;

a second switch located in the second semiconductor chip and electrically connected to the second memory stack structures via a second portion of the first bit line in the first semiconductor chip;

a sense amplifier located in the second semiconductor chip and electrically connected to the first switch and to the second switch, wherein the first switch comprises a first field effect transistor electrically connected to the sense amplifier through first metal interconnect structures in the second semiconductor chip, and the second switch comprises a second field effect transistor connected to the sense amplifier through second metal interconnect structures in the second semiconductor chip;

a first bonding structure located at an interface between the first semiconductor chip and the second semiconductor chip, wherein the first bonding structure electrically connects the first portion of the first bit line and the first switch;

a second bonding structure located at an interface between the first semiconductor chip and the second semiconductor chip, wherein the second bonding structure electrically connects the second portion of the first bit line and the second switch;

third memory stack structures extending through a third alternating stack of third insulating layers and third electrically conductive layers in a third memory block region of the first semiconductor chip;

a third switch comprising a third transistor located in the second semiconductor chip;

a fourth switch comprising a fourth transistor located in the second semiconductor chip;

a first portion of a second bit line traversing the first and second memory block regions and electrically connected to the third transistor; and a second portion of the second bit line traversing the third memory block region and electrically connected to the fourth transistor.

22. The device of claim 21, wherein:

the second portion of the first bit line also traverses the third memory block region;

the sense amplifier is electrically connected to the first portion of the second bit line through the third transistor; the sense amplifier is electrically connected to the second portion of the second bit line through the fourth transistor; and the device further comprises an additional switch electrically connected to the sense amplifier through the second portion of the first bit line.

23. A circuit, comprising:

a first memory block region located in a first semiconductor chip;

a second memory block region located in the first semiconductor chip;

a first switch located in a second semiconductor chip that is bonded to the first semiconductor chip;

a second switch located in the second semiconductor chip;

a first portion of a first bit line traversing the first memory block region, located in the first semiconductor chip, and electrically connected to the first switch;

a second portion of the first bit line traversing the second memory block region, located in the first semiconductor chip, and electrically connected to the second switch; and a sense amplifier located in the second semiconductor chip and electrically connected to the first portion of the first bit line through the first switch, wherein the sense amplifier is electrically connected to the second portion of the first bit line through the second switch.

24. The device of claim 23, further comprising:

a first bonding structure located at an interface between the first semiconductor chip and the second semiconductor chip, wherein the first bonding structure electrically connects the first portion of the first bit line and the first switch; and a second bonding structure located at an interface between the first semiconductor chip and the second semiconductor chip, wherein the second bonding structure electrically connects the second portion of the first bit line and the second switch.

25. The circuit of claim 23, wherein:

the first memory block region comprises a first alternating stack of first insulating layers and first electrically conductive layers;

the second memory block region comprise a second alternating stack of second insulating layers and second electrically conductive layers;

the first portion of the first bit line laterally traverses the first memory block region within the first semiconductor chip between the first alternating stack and the second semiconductor chip; and the second portion of the first bit line laterally traverses the second memory block region within the first semiconductor chip between the second alternating stack and the second semiconductor chip.

26. The circuit of claim 23, wherein:

the first semiconductor chip comprises a first semiconductor substrate on which the first memory block region and the second memory block region are located;

the second semiconductor chip comprises a second semiconductor substrate on which the first switch and the second switch are located; and the first semiconductor substrate is vertically spaced from the second semiconductor substrate by the first memory block region and the second memory block region.

* * * * *